US012755802B2

(12) United States Patent
Watanabe

(10) Patent No.: US 12,755,802 B2
(45) Date of Patent: Oct. 6, 2026

(54) SILICON BRAIN

(71) Applicant: Hiroshi Watanabe, Kanagawa (JP)

(72) Inventor: Hiroshi Watanabe, Kanagawa (JP)

( * ) Notice: Subject to any disclaimer, the term of this patent is extended or adjusted under 35 U.S.C. 154(b) by 329 days.

(21) Appl. No.: 18/725,654

(22) PCT Filed: Feb. 27, 2023

(86) PCT No.: PCT/JP2023/006892
§ 371 (c)(1),
(2) Date: Feb. 3, 2025

(87) PCT Pub. No.: WO2023/167115
PCT Pub. Date: Sep. 7, 2023

(65) Prior Publication Data
US 2025/0336459 A1 Oct. 30, 2025

(30) Foreign Application Priority Data
Mar. 2, 2022 (JP) ................................ 2022-032187
Jul. 23, 2022 (JP) ................................ 2022-117619

(51) Int. Cl.
*G11C 27/00* (2006.01)
*G06N 3/006* (2023.01)

(52) U.S. Cl.
CPC ........... *G11C 27/005* (2013.01); *G06N 3/006* (2013.01)

(58) Field of Classification Search
CPC ....... G11C 27/005; G11C 11/54; G11C 16/04; G06N 3/006; G06N 3/063; G06N 3/065; G06G 7/60; H10B 43/27
USPC ....................................... 365/185.03, 185.24
See application file for complete search history.

(56) References Cited

U.S. PATENT DOCUMENTS 10,283,190 B1 * 5/2019 Li ....................... G11C 11/2257
2009/0109758 A1 * 4/2009 Nazarian ............ G11C 16/0416 365/185.18
2019/0325967 A1 * 10/2019 Yako .................. G11C 16/3445
2023/0122160 A1 * 4/2023 Hu .......................... G11C 11/54 365/185.18
2024/0347126 A1 * 10/2024 Goda ............... G11C 29/50004
2024/0379160 A1 * 11/2024 Harari ................ G11C 16/0483

* cited by examiner

*Primary Examiner* — Michael T Tran
(74) *Attorney, Agent, or Firm* — WPAT, PC

(57) ABSTRACT

The basis of calculating memory capacity of modern computing is bit. Thus, the number of bits is the unit of information quantity of modern communication. The number of neurons (node number) in the neural networks in human brain is not the unit of the memory capacity of the human being. The complexity of neural network is much greater than the bit capacity. Hence, the current AI, which tries to imitate the human brain using computing with the basis on bits, performs inherently different processing of information from the human brain. In addition, computing based on bit number is always facing the limitation of integration. The present disclosure provides a system of information memory without relying on bits using three-dimensional neural networks. By replacing the electrical connection of non-volatile memory cells, which are distributed in a three-dimensional array, the mechanism of the information processing of the human brain can be imitated.

21 Claims, 45 Drawing Sheets

BLX$(j,k)$: floating

BSGX$(j,k)$: Voff

WUY$(i',k)$: Voff $(i' \in \{i' | i' \neq i \,\&\&\, i' \neq i+1\})$

WDY$(all\ i, k+1)$: Voff

WUY$(i,k)$: Voff →Vpass WUY$(i+1,k)$: Voff →Vpass

WCX$(j,k)$: Vread

WDX$(j,k)$: Voff / Vpass

WUX$(j,k-1)$: Voff

Align, resist patterning, N+poly depo, CMP, remove resist
Oxide depo, CMP, metal depo, CMP metal patterning, depo oxide, CMP Replace x and y

SILICON BRAIN

CROSS REFERENCE TO RELATED APPLICATION

The application is a National Phase Entry of PCT application PCT/JP2023/006892, filed on Feb. 27, 2023, which claims the benefit of Japan Patent application serial No. 2022-032187, filed on Mar. 2, 2022, and No. 2022-117619, filed on Jul. 23, 2022, and the entire contents of which are incorporated herein by reference.

FIELD OF THE INVENTION

This invention relates to technology to prepare three-dimensional neural network by silicon chip.

DESCRIPTION OF THE RELATED ART

In the calculation method using the conventional semiconductor, storage (or memory) and processing unit (CPU etc.) operate in cooperation. Storage (semiconductor memory) is made of ensemble of memory cells (called memory cell, bit cell or, simply, cell), which ensemble is called array, cell array, memory cell array or memory element array. Each cell is made of at least source, drain, gate (or control gate). Sources and drains can be connected to source lines and bit lines, respectively. Gates can be connected to word lines, respectively. In general, such connections can be performed through contacts (terminals). For example, they can be a word line contact (terminal) or bit line contact (terminal). If the ensemble of such cells is distributed in a two-dimensional plane, then the access to each cell can be performed using word lines (WL) and bit lines (BL), which are respectively arranged to the X-axis and Y-axis. For example, the address located at which the A-th word line and the B-th bit line are crossed turns out to be (A, B), named, the address of a memory cell. However, A is specially called the address along the x-axis (X-address). B is specially called the address along the Y-axis (Y-address).

It has been the long mainstream in the development of the semiconductor memory technology to integrate as many memory cells on the surface of silicon wafer using the semiconductor manufacturing processes as possible following Moore's law (see non-patent document 1.). However, recently (after 2015), it has become difficult to increase the integration of memory cells on the two-dimensional plane. The mainstream has been changed to array memory cells in the three-dimensional space even in the mass-product level. Hence, the address can be represented by (A, B, C). However, C is the address along the Z-axis that is perpendicular to the XY-plane (Z-address).

However, whether two-dimensional or three-dimensional, the current storage method that a semiconductor memory device stores information is based on the unit of memory cell. In the case that each memory cell (cell) has two values of "0" or "1", the storage device can have 1 bit memory capacity per cell. If there are two memory cells like this, then the memory capacity turns out to be 2 bits. Hence, the combinations of "0" and "1" are four such as (00), (01), (10), and (11). The number of cases for this can be calculated by 2 to the power of 2. If the cell array is made of N memory cells, then the memory capacity of the cell array is N bits. In this case, the number of cases can be calculated by two to the power of N.

Accordingly, the information quantity of the conventional semiconductor devices (bit number) is the number of cases that is represented using the logarithm with the base being 2.

In contrast, the human brain is not composed of memory cells. If we dare to claim there is what corresponds to memory cells in the human brain, then we might suppose soma body composes a part of neurons. However, in the human brain, this soma body does not store information of "0" or "1".

Simply illustrated in FIG. 1, in general, a neuron is composed of three parts such as a soma body and plural (e.g., several ten) dendrites and an axon. Soma body can receive external input from these plural dendrites. The axon is generally longer than dendrites, and its tip point has several ten to several hundred branches. Those branched tips of axon are called axon terminal.

Simply illustrated in FIG. 2, an axon terminal can approach a dendrite from another soma body to form a junction there. This junction is called synapsis.

Suppose there are the soma body A and the soma body B. Soma body A can receive plural input x(n) through plural dendrites (n) from the external. However, n is an integer ranging from 1 to N. In soma body A, weight W(n) is respectively allocated to input x(n). We can obtain SUM appending the input signals with respect to those weights. The SUM is transferred to an axon terminal through axon. If SUM is higher than a certain threshold (threshold of excitation), then this neuron (with soma body A) generates action potential to ignite synapsis with soma body B; and then neurotransmitters can be transferred from soma body A to soma body B.

This threshold is changeable by the repetition of signal transfers. That is, the learning by repeating experiences can enforce a synopsis, terminate it, or replace it with another synapsis. The lowering of threshold can explain the enforced synapsis. The increase of threshold can explain the termination of synapsis. And if threshold of another synapsis is lowered then we can explain the generation of the replacement of synapsis.

FIG. 3 illustrates the model of this. When neurotransmitters can be transferred, output y is one (y=1). Otherwise, y=0. This model is called perceptron. It has been extensively used in deep learning or machine learning.

There are mainly two methods to realize a perceptron in computers.

The conventional method is to represent input x(n), weight w(n), SUM, threshold, output y by bit information.

This method places a big load on the computers and then causes a problem. The improvement of computational speed and power consumption reduction is demanded more than ever. Deep learning and machine learning require computers to treat enormous data in the blink of an eye. As computation causing a great load is widespread globally, the power consumption of data center drastically increases. Hence, it becomes difficult to operate data center realistically. The risk that this increase of power consumption accelerates global warming has been concerned. (See non-patent document 2.)

The main reason for the limit of computational speed is an overload of data transmission between arithmetic unit and main memory. Though it may be still possible to increase the speed of arithmetic unit, the speed of data bus between arithmetic unit and main memory has hit the ceiling. This is called the Neumann bottleneck (or memory bus problem).

The main reason for the increase of power consumption is that the current mainstream of main memory is a volatile memory, which is the dynamic random-access memory (DRAM). Hence, the power consumption for the refresh of recorded data has got unignorable.

Recent new trend is to skip the Neumann bottleneck and, at the same time, to imitate this perceptron directly in the semiconductor chip for suppressing the power consumption. However, the neural network of the human brain is, in general, made to form synapsis between undetermined two neurons. That is, though it may be possible to distribute perceptron at strictly determined addresses in the two-dimensional plane or three-dimensional space using the current semiconductor technology, it is not easy to reproduce a synapsis between arbitral neurons and freely replace it with another neuron according to the result of learning.

Moreover, as mentioned above, information is recorded by bit in the prior memory architecture. In contrast, information is represented by the connections of neurons (neural network), that is, synapsis, in the human brain. In other words, to reproduce the deep learning or the machine learning on the program written by bit information is identical to having coded one program to model one unit of neural network (perceptron). In this point, a big loss in the information processing occurs.

For example, suppose that we can code a program of perceptron by 1,000 lines. If the information quantity of one line is 80 bytes (1 byte is 8 bits), then the information quantity to reproduce a perceptron by the computer program is 80K Bytes. Even if the compilation of the program can compress it 1-to-10, then it is 8K bytes. If we can reproduce a perceptron with 100 bits in a semiconductor chip, then the computer program wastes 640-times of information quantity per perceptron.

The number of neurons is known to be about 86 billion in the human brain (composed of cerebrum and cerebellum). If we assume that the number of neurons and the number of perceptron are almost the same, then it must be necessary to force computers to treat enormous wastes of information quantity to realize the artificial intelligence which has the ability in the level of human being.

Deep learning and machine learning are not yet artificial intelligence which can be comparative with the human brain. As artificial intelligence is to be developed, it may be regarded that the waste of information quantity that computers are forced to treat is further increased.

Next, let us compare the information quantity of network and that by bit.

The science of networking is called graph theory in mathematics. The network is, generally, what is formed connecting points by lines. In contrast, information processing by bit is to process information only by points without lines.

The above-mentioned points are called vertexes or nodes. The above-mentioned lines are called edges or links. Nodes and links are likely used in physics, which indicate what are the same as vertexes and edges, respectively.

Inherently, the network is complicated. Rather restrictive conditions are assumed to correctly evaluate information quantity of network.

Let us connect arbitral two points. If the links from 1 to 2 and from 2 to 1 are regarded as different links, then this link is called the oriented link. Otherwise, such links are called non-oriented links. In the oriented link, as illustrated in FIG. 4, the link can be depicted by the arrow. The initial and end points are depicted by open dots. See the case of $r=2$ in FIG. 4. There are two combinations composed of two open dots and one arrow. However, r is the number of nodes to be linked.

In the case of $r=3$, two arrows are continuously linked and then the initial and end points are connected. The number of those cases is 6. In the case of $r=4$, three arrows are continuously linked and then the initial and end points are connected. The number of those cases is 8. Depict the number of all nodes by N. The number of cases where the number of nodes to be linked is r can be represented by the product of the permutation (N, 2) and r. The number of cases of the network under this constraint can be obtained by adding this product for each r ranging from 3 to N and furthermore appending the permutation P(N,2) to it. It is self-evident that it is greater than the factorial of N (N!).

Thought this cannot cover all possibilities of networking, we can show that the information quantity of such a constrained network is greater than the information quantity by bits.

Let us consider the case that N nodes are distributed on a memory cell array. The information quantity by bit is simply N bits. In contrast, the information quantity shown in FIG. 4 is greater than log (2, N!). However, log (2, x) is the logarithm of x with the base being 2.

Using the Stirling's formula, in the case that N is large enough (practically, N is at least greater than 20), log (2, N!) is (N log (e, N)−N)/log (e, 2). However, log (e, x) is the logarithm of x with the base being e. Dividing this value by N, we can obtain (log (e, N)−1)/log (e, 2). This value is greater than 1 while N is large enough.

The number of nodes (N) of 128G bits DRAM can be converted to be roughly 10 to the power of 11. Since log (2, e) is about 1.9, from FIG. 5, it is self-evident that the information quantity of network is much greater than the information quantity by bits.

Subsequently, in the network, we can record different information of different paths even though the initial and end points are the same.

In FIG. 6, plural examples of paths from the initial point (1) to the end point (2) are shown. From the left, there are the cases of two links, three links, four links, five links, etc.

If there are two links, then there is a middle node between the initial point (1) and the end point (2). The signal input to the end point (2) may be dependent on which address this middle node is located at.

If there are three links, then there are two middle nodes between the initial point (1) and the end point (2). The signal input to the end point (2) is dependent on the permutation of addresses which these two middle nodes are located at.

If there are four links, then there are three nodes between the initial point (1) and the end point (2). The signal input to the end point (2) is dependent on the permutation of addresses which these three nodes are located at.

If there are five links, then there are four nodes between the initial point (1) and the end point (2). The signal input to the end point (2) is dependent on the permutation of addresses which these four nodes are located at.

By this way, it can be found that the information quantity that networks can store is much greater than the information quantity by bits if the node numbers are the same.

Let us compare information quantities of two-dimensional network and three-dimensional network.

The spread of two-dimensional networks on XY-plane is determined by the component numbers of the X-addresses and the Y-addresses. If we assume that both component numbers are L for the simplicity of description, then the node number is L to the power of 2. Accordingly, using Stirling's formula, the information quantity of two-dimensional network is the product of (2 log (e, L)−1) and L to the power of 2.

The spread of three-dimensional network in the XYZ-space is determined by the numbers of X-address, Y-address, and Z-address. To simply explain, let us all L. The node number, N, becomes L to the power of 3. Accordingly, using the Stirling formula, the information quantity of three-dimensional network is the product of L to the power of 3 and 3 log (e, L)−1.

In FIG. 7, we plot the ratio of the information quantities of three-dimensional and two-dimensional networks. As shown here, as L increases, the information quantity of three-dimensional networks dominates that of two-dimensional networks.

As mentioned above, only the information quantity of 2 to the power of N, that is, N bits, can be stored in the conventional memory system with bit cell number (node number) being N. Compared with the same node number, it is inherently inferior to the information quantity of the network. If the memory mechanism of the human brains is composed of three-dimensional network of neurons, then an explosion of power consumption may occur before the artificial intelligence based on the conventional computing will achieve the same level of ability as the human brains. Indeed, the Neumann bottleneck may disturb the growth of artificial intelligence.

Without a considerable technical innovation of memory architecture, it may be impractical that artificial intelligence can achieve the same level of ability as the human brains.

SUMMARY OF THE INVENTION

The present invention was made considering the above-mentioned conditions, and then aims to propose the method to generate a three-dimensional network in silicon chip and to memorize information.

The present invention adopts the following means to solve the above-mentioned problems.

The method to solve, which the present invention proposes, is a semiconductor device, which includes a module comprising, first and second units, which are connected in serial along first axis; second, third, fourth and fifth word lines, which are expanded along second axis; first and sixth word lines, which are expanded along third axis; and, second bit lines, which are expanded along the third axis. Wherein said second bit line connects both said first and second units; said first unit comprises first, second and third cells; said first, second and third cells are connected in series along said first axis; said first, second and third cells have a control gate, respectively; said first cell has a source; said third cell has a drain. Wherein the control gate of said first cell is connected to said first word line; the control gate of said second cell is connected to said second word line; the control gate of said third cell is connected to said third word line; the source of said first cell is connected to said first bit line; the drain of said third cell is connected to said second bit line. Wherein said second unit comprises fourth, fifth, and sixth cells; said fourth, fifth and sixth cells are connected in series along said first axis; said fourth, fifth and sixth cells have a control gate, respectively; said fourth cell has a source; said sixth cell has a drain. Wherein the control gate of said fourth cell is connected to said fourth word line; the control gate of said fifth cell is connected to said fifth word line; the control gate of said sixth cell is connected to said sixth word line, the source of said fourth cell is connected to said second bit line; the drain of said sixth cell is connected to said third bit line.

In addition, it further includes seventh, eighth, and nineth cells; seventh and eighth word-lines, which are expanded along said second axis; ninth word line, which is expanded along said third axis; fourth bit line, which is expanded along said third axis. Wherein said seventh, eighth, and nineth cells are connected in series along said first axis; said seventh, eighth, and nineth cells respectively have a control gate; said seventh cell has a source; said eighth cell has a drain. The control gate of said seventh cell is connected to said seventh word line; the control gate of said eighth cell is connected to said eighth word line; the control gate of said nineth cell is connected to said nineth word line; the source of said seventh cell is connected to said fourth bit line; the drain of said nineth cell is connected to said first bit line.

In addition, it further includes tenth, eleventh, and twelfth cells; eleventh and twelfth word-lines, which are expanded along said second axis; tenth word line, which is expanded along said third direction; fifth bit line, which is expanded along said third axis. Wherein said tenth, eleventh, and twelfth cells are connected in series along said first axis; said tenth, eleventh, and twelfth cells respectively have a control gate; said tenth cell has a source; said twelfth cell has a drain. The control gate of said tenth cell is connected to said tenth word line; the control gate of said eleventh cell is connected to said eleventh word line; the control gate of said twelfth cell is connected to said twelfth word line; the source of said tenth cell is connected to said third bit line; the drain of said twelfth cell is connected to said fifth bit line.

The method to solve, which the present invention produces, further includes first and second wiring metal layers. Wherein said first bit line is connected to said first wiring metal layer; said second word line is connected to said second wiring metal layer; said third word line is connected to said first wiring metal layer; said fourth word line is connected to said second wiring metal layer; said fifth word line is connected to said first wiring metal layer; said third bit line is connected to said second wiring metal layer. Furthermore, said first and sixth word lines are connected one of said first and second wiring metal layer, said second bit line is connected to the other of said first and second wiring metal layer.

The method to solve, which the present invention produces, wherein a first voltage is applied on said first, third, seventh, and nineth word lines, said first voltage is lower than a threshold voltage. Said threshold voltage is a threshold of voltage to be applied to gates of said first, second, third, seventh, eighth, and nineth cells, which is necessary to make electric current flow between source and drain of said first, second, third, seventh, eighth, and nineth cells. A voltage applied on said first and nineth word line is changed from said first voltage to pass voltage, said pass voltage is higher than any of thresholds of said first, second, third, seventh, eighth, and nineth cells. A read voltage is applied on said second and eighth word lines, said read voltage is higher than said first voltage and lower than said pass voltage. Furthermore, in the present invention, first voltage is applied to said first, third, fourth, and sixth word-lines, said first voltage is lower than a threshold voltage, said threshold voltage is a threshold of voltage to be applied to gates of said first to sixth cells, which is necessary to make electric current flow between source and drain of said first to sixth cells. A voltage of said third and fourth word-line is changed from said first voltage to a pass voltage, said pass voltage is higher than any of thresholds of said first to sixth cells. Read voltage is applied to said second and fifth word lines, said read voltage is higher than said first voltage and lower than said pass voltage. Furthermore, in the present invention, first voltage is applied to said first, third and twenty-first word-lines, said first voltage is lower than threshold voltage, said threshold voltage is threshold of voltage to be applied to gates of said first, third and twenty-first cells, which is necessary to make electric currents between source and drain of said first, third, and twenty-first cells. Voltage applied to said first and twenty-first word lines is changed from said first voltage to pass voltage, said pass voltage is higher than any of thresholds of said first, third and twenty-first cells. Read voltage is applied to said second word line, said read voltage is higher than said first voltage and lower than said pass voltage. Furthermore, in the present invention, first voltage is applied to said first, third, and thirty-third word-lines, said first voltage is higher than threshold voltage, said threshold voltage is threshold of voltage to be applied to gates of said first, third, and thirty-third cells, which is necessary to make electric current flow between source and drain of said first, third, and thirty-third cells. Voltage applied to said third and thirty-third word-lines is changed from said first voltage to pass voltage, said pass voltage is higher than any of thresholds of said first, third, and thirty-third cells. Read voltage is applied to said second and thirty-second word lines, said read voltage is higher than said first voltage and lower than said pass voltage.

By using the present invention, it becomes possible to reproduce the information processing method of the human brains in silicon chip without the conversion of information to bit data.

The best embodiments of realizing the present invention will be explained below.

DETAILED DESCRIPTION OF THE INVENTION

As mentioned above, the present invention is to produce a method to realize information processing method of the human brain in a semiconductor chip (silicon chip) without the conversion of information to bit data (free from the computer program).

Figure 8:
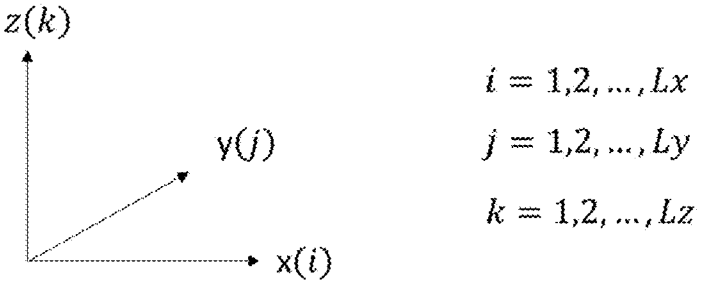
FIG. 8: a drawing to illustrate the definition of the x-address, y-address, and z-address.

(The first embodiment) FIG. 8 is to illustrate the coordinate to define an address in three-dimensional space. The address along the X-axis (X-address) can be represented using an integer i ranging from 1 to Lx. The address along the Y-axis (Y-address) can be represented using an integer j ranging from 1 to Ly. The address along the Z-axis (Z-address) can be represented using an integer k ranging from 1 to Lz.

Figure 9:
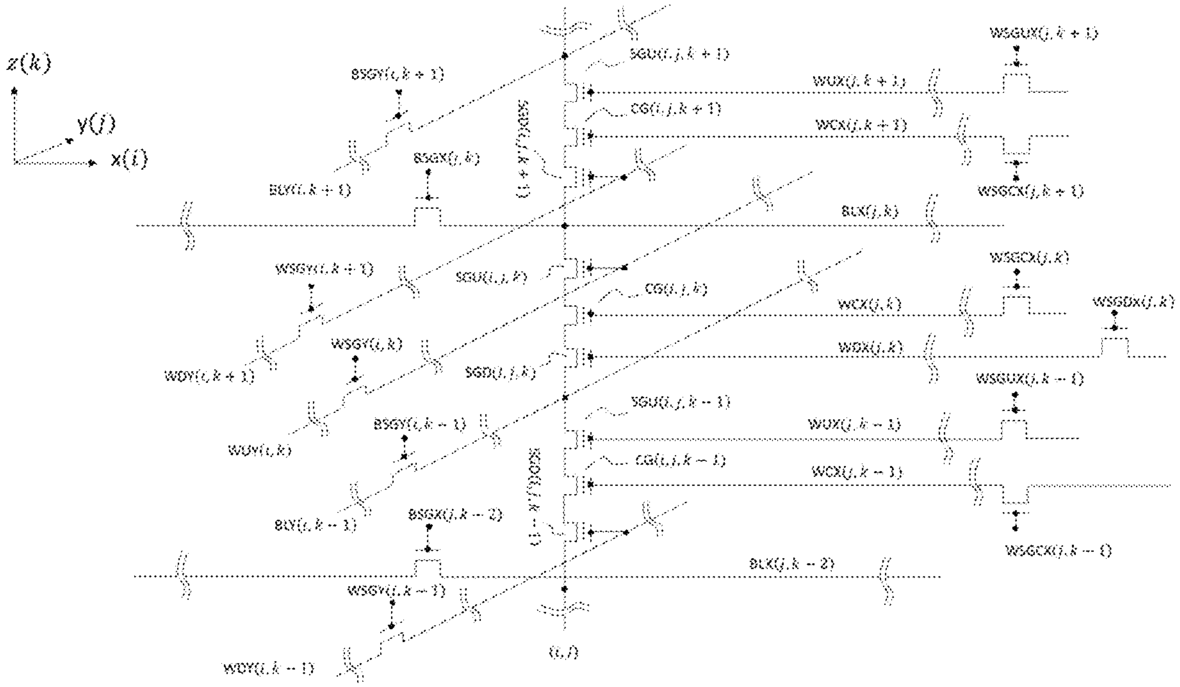
FIG. 9: a drawing to illustrate an example of one module along the z-axis.

FIG. 9 is a circuit model to illustrate a part of the present embodiment, which is expanded along the Z-axis direction (the Z-direction or z-axis). The XY address is (i, j). From the top, there are a cell gate CG (i, j, k+1), CG (i, j, k), and CG (i, j, k−1). Each cell gate is connected to an upper select gate SGU and a lower select gate SGD in series between them. That is, a structure composed of 1 cell and 2 select gates (SG) can compose an unit {SGU (i, j, k), CG (i, j, k),SGD (i, j, k)} has.

That is, from the top, 3 units are connected in series along the z-axis. It can be regarded as one module and represented by {SGU (i, j, k+1),CG (i, j, k+1),SGD (i, j, k+1)/SGU (i, j, k),CG (i, j, k),SGD (i, j, k)/SGU (i, j, k−1),CG (i, j, k−1),SGD (i, j, k−1)}.

In this case, by changing k from 2 to L−1, we can explain the whole structure along the z-direction. However, if we replace k+1 with k−1 in the above unit, then it turns out to be the same as a lower unit. This tells us that this structure has two-floor periodicity for the z-address (k). That is, the present embodiment has the two-floor periodicity based on 2 units along the z-direction.

In the present embodiment, the word lines WCX (j, k+1), WCX (j, k) and WCX (j, k−1) of the cell gate CG are all expanded (wired) along the X-axis direction (X-direction or X-axis).

Some word lines of upper select gates SGU is expanded along the x-direction, and other word lines of upper select gates SGU is expanded along the y-axis direction (y-direction or y-axis). For example, the word line WUX (j, k+1) of SGU (i, j, k+1) is expanded along the x-direction. The word line WUY (i, k) of SGU (i, j, k) is expanded along the y-direction. The word line WUX (j, k−1) of SGU (i, j, k−1) is expanded along the x-direction. Like this, in the present embodiment, the word lines of SGU alternate the x-direction and the y-direction for each layer (along the z-direction).

Some word lines of lower select gates SGD is expanded along the x-direction, and other word lines of lower select gates SGD is expanded along the y-axis direction (y-direction). For example, the word line WDY (i, k+1) of SGD (i, j, k+1) is expanded along the y-direction. The word line WDX (j, k) of SGD (i, j, k) is expanded along the x-direction. The word line WDY (i, k−1) of SGD (i, j, k−1) is expanded along the y-direction. Like this, in the present embodiment, the word lines of SGD alternate the y-direction and the x-direction for each layer (along the z-direction). (This is vice-versa with the word lines of SGU).

That is, the set of {WUX(j, k+1), WDY(i, k+1)}, {WUY (i, k),WDX(j, k)}, {WUX(j, k−1), WDY(i, k−1)} is repeated for each layer. To analyze, in the present embodiment, the word lines of select gates (SG) alternate the x-direction and the y-direction. It is a contrast that the word lines of the cell gates are expanded along only the x-direction.

Those word lines are attached with word line select gates, respectively. Each word line select gate is under the control of decoder. The decoder is composed of the x-decoder to control select gates with a word line wired along the x-direction and the y-decoder to control select gates with a word line wired arrayed along the y-direction.

For example, there is the x-direction word line select gate WSGUX (j, k+1) on WUX (j, k+1). There is the x-direction word line select gate WSGCX (j, k+1) on WCX (j, k+1). There is the x-direction word line select gate WSGCX (j, k) on WCX (j, k).

There is the x-direction word line select gate WSGDX (j, k) on WDX (j, k). There is the x-direction word line select gate WSGUX (j, k−1) on WUX (j, k−1). There is the x-direction word line select gate WSGCX (j, k−1) on WCX (j, k−1).

For example, there is the y-direction word line select gate WSGY (i, k+1) on WDY (i, k+1). There is the y-direction word line select gate WSGY (i, k) on WUY (i, k). There is the y-direction word line select gate WSGY (i, k−1) on WDY (i, k−1).

Like this, in the present embodiment, the word lines associated to a select gate alternate the x-direction and the y-direction for each layer (for each k). However, the word lines associated with a cell gate are arrayed along the x-direction.

The control of word lines and bit lines that are expanded along the x-direction is performed by the x-decoder. The control of word lines and bit lines that are expanded along the y-direction is performed by the y-decoder.

That is, in the present embodiment, the select gates associated with the word lines linked to the upper and lower select gates are alternatively controlled by the x-decoder and the y-decoder for each layer (for each k). However, the select gates of word lines linked to cell gates is controlled by the x-decoder.

In the present embodiment, there are the bit lines expanded along the x-direction, BLX, or the bit lines expanded along the y-direction, BLY, for each interval between units.

Hence, there is the bit line BLX (j, k) along the x-direction between SGD (i, j, k+1) and SGU (i, j, k). The bit line BLX (j, k−2) is expanded (wired) along the x-direction below SGD (i, j, k−1).

In a similar way, the bit line BLY (i, k+1) is wired along the y-direction above SGU (i, j, k+1). The bit line BLY (i, k−1) is wired along the y-direction between SGD (i, j, k) and SGU (i, j, k−1).

Like this, in the present embodiment, the bit lines are alternatively wired (expanded) along the x-direction and the y-direction for each layer (for each k).

Those bit lines are attached with bit line select gates, respectively. Each bit line select gate is under the control of decoder. The decoder is composed of the x-decoder to control select gates of bit lines wired along the x-direction and the y-decoder to control select gates of bit lines wired along the y-direction.

For example, there is the y-direction bit line select gate BSGY (i, k+1) on BLY (i, k+1). There is the x-direction bit line select gate BSGX (j, k) on BLX (j, k). There is the y-direction bit line select gate BSGY (i, k−1) on BLY (i, k−1). There is the x-direction bit line select gate BSGX (j, k−2) on BLX (j, k−2).

That is, in the present embodiment, the bit line select gates are alternatively controlled by the x-decoder and the y-decoder for each layer (for each k).

Figure 10:
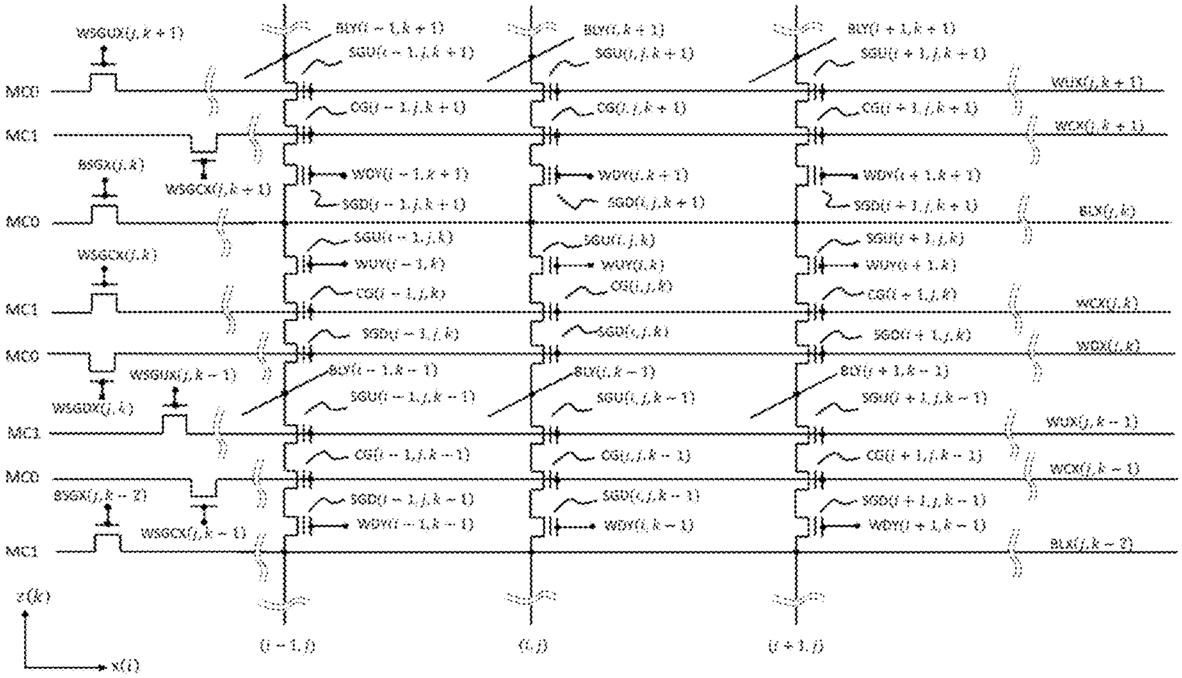
FIG. 10: a drawing to illustrate an example wherein one z-direction module is expanded along the x-direction.

FIG. 10 is an illustration that expands this circuit along the x-direction. As an example, the three above-mentioned modules are arrayed along the x-direction.

That is, the three modules of {SGU (i−1, j, k+1), CG (i−1, j, k+1), SGD (i−1, j, k+1)/SGU (i−1, j, k), CG (i−1, j, k), SGD (i−1, j, k)/SGU (i−1, j, k−1), CG (i−1, j, k−1), SGD (i−1, j, k−1)}; {SGU (i, j, k+1), CG (i, j, k+1), SGD (i, j, k+1)/SGU (i, j, k), CG (i, j, k), SGD (i, j, k)/SGU (i, j, k−1), CG (i, j, k−1), SGD (i, j, k−1)}; and {SGU (i+1, j, k+1), CG (i+1, j, k+1), SGD (i+1, j, k+1)/SGU (i+1, j, k), CG (i+1, j, k), SGD (i+1, j, k)/SGU (i+1, j, k−1), CG (i+1, j, k−1), SGD (i+1, j, k−1)} are arrayed along the x-axis.

Figure 11:
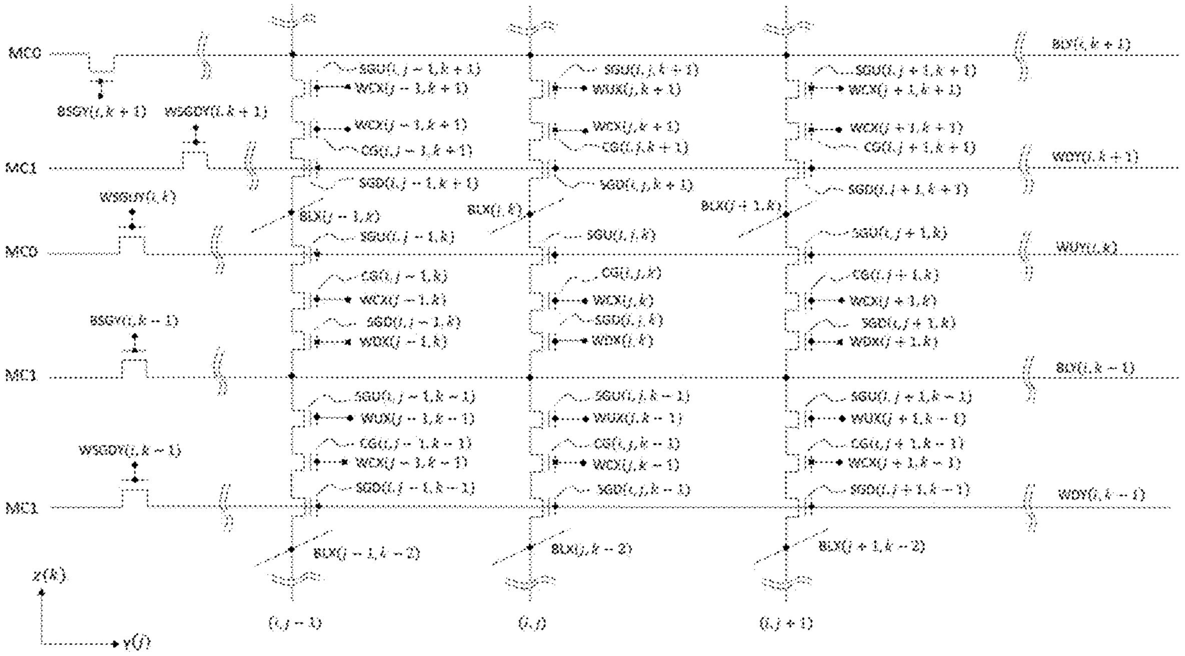
FIG. 11: a drawing to illustrate an example wherein one z-direction mole is expanded along the y-axis.

FIG. 11 is an illustration that expands this circuit along the y-direction. As an example, the three above-mentioned modules are arrayed along the y-direction.

That is, the three modules of {SGU (i, j−1, k+1), CG (i, j−1, k+1), SGD (i, j−1, k+1)/SGU (i, j−1, k), CG (i, j−1, k), SGD (i, j−1, k)/SGU (i, j−1, k−1), CG (i, j−1, k−1), SGD (i, j−1, k−1)}; {SGU (i, j, k+1), CG (i, j, k+1), SGD (i, j, k+1)/SGU (i, j, k), CG (i, j, k), SGD (i, j, k)/SGU (i, j, k−1), CG (i, j, k−1), SGD (i, j, k−1)}; {SGU (i, j+1, k+1), CG (i, j+1, k+1), SGD (i, j+1, k+1)/SGU (i, j+1, k), CG (i, j+1, k), SGD (i, j+1, k)/SGU (i, j+1, k−1), CG (i, j+1, k−1), SGD (i, j+1, k−1)} are arrayed along the y-direction.

Select and cell gates are arbitral cells with three-terminals. The cell with three-terminals is an electron device, which may have three terminals including at least gate terminal. The gate terminal is connected to a word line. A control voltage can be input to a cell therethrough from a word line. Connecting the remaining two terminals to one of bit lines, output current can flow into the bit line. However, said select and cell gates may have a terminal other than these three terminals.

For example, select gate and cell gate, which can be adopted in the present invention, may be one of transistor, non-volatile memory cell, volatile memory cell, phase change memory cell, magnetic resistance memory cell, resistance change memory cell, ferroelectric memory cell, etc. In any case, it does not deviate from the concept and technological essence of the present invention.

Or select gate and cell gate, which can be adopted in the present invention, may comprise at least one of transistor, non-volatile memory cell, volatile memory cell, phase change memory cell, magnetic resistance memory cell, resistance change memory cell, ferroelectric memory cell, etc. In any case, it does not deviate from the concept and technical essence of the present invention.

As an example, in the circuits of FIGS. 9-11, we have adopted a non-volatile memory cell with charge storage region as select gate and cell gate (SGU, CG, SGD), which compose a unit. As an example, we have adopted a transistor as word line and bit line select gates (BSGX,BSGY,WSGC, WSGUX,WSGDX,WSGUY,WSGDY). However, we can adopt a transistor as a select gate (SGU, SGD), which composes a unit, in a similar way to word line and bit line select gates.

There are mainly two types of charge storage region in the market. One is a floating gate, which has been extensively adopted in NOR flash and two-dimensional NAND flash. Another is the charge trapping layer, which has been extensively adopted in three-dimensional NAND flash, etc. In any case, it does not deviate from the concept and technical essence of the present invention.

Figure 12:
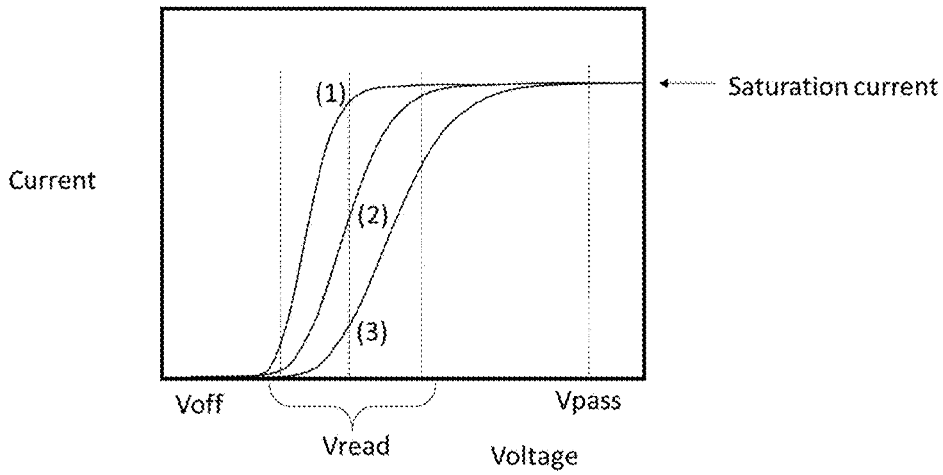
FIG. 12: a drawing to schematically illustrate transistor characteristics (electrical characteristics) of cell gate transistor.

FIG. 12 is to illustrate an example of concept of transistor characteristics (electrical characteristics) of cell gate (CG) regarding the present invention.

The horizontal axis is for control voltage applied by a word line terminal. The vertical axis is for output current flowing between the remaining two terminals other than the word line terminal. The control voltage is to control this output current in response to the state of charge storage region. In general, it may be possible to flow this output current to one of bit lines. If a sense amplifier is connected to the bit line, then it may be possible to read the state of this charge storage region. In general, a sense amplifier like this may be included in said decoder.

When control voltage is high enough, that is, a pass voltage (Vpass) is applied on a word line terminal, a cell gate (CG) can output a certain output current flow, irrespective of state of charge storage region (layer). Hence, the cell gate transistor can be regarded as in a state of switch on. However, the state of charge storage layer is the amount of charge having been stored in the charge storage layer. What "irrespective of state of charge storage layer" means is that it is independent of the amount of charge stored in the charge storage layer while the amount of the stored charge is in a certain fixed rage. In addition, the amount of charge stored in the charge storage layer can be changed a-purposely by the program and erase of the cell. It is preferable that pass voltage is higher than threshold voltages of any cells with stored charge amount being in a certain fixed range.

When control voltage is low enough, that is, a fixed voltage (Voff) is applied on a word line terminal, a cell gate (CG) can hardly output current flow, irrespective of state of charge storage region. Hence, the cell gate transistor can be regarded as in a state of switch off. That is, Voff is a voltage lower than threshold voltage (Vt). If a high enough voltage is applied on the gate of a cell gate transistor, then the electric current can flow between source and drain of the cell gate transistor. The threshold voltage of cell gate transistor is threshold of voltage, which is necessary to let this electric current flow.

In general, this threshold voltage does not correspond to threshold of SUM (threshold of excitation), which is for transferring neurotransmitters from soma body A to soma body B by operating a synopsis.

In FIG. 12, three dotted lines are drawn vertically other than Vpass. For example, Vread can be tuned between both end lines. The electric current (1), (2), and (3), for example, corresponds to that flowing when Vread is located at the central line.

When control voltage is read voltage (Vread), output current is changeable in response to states of charge storage region, for example, like (1), (2), and (3) in FIG. 12. In other words, we can say that voltage at which output current starts to flow (threshold voltage, Vt) is changeable. However, Vread is a voltage between Voff and Vpass. Vread is also tunable if necessary.

By injecting electrons into the charge storage region (programing), we can reduce output current when Vread is applied. For example, it is illustrated in (3) of FIG. 13. This corresponds to the increase of Vt, called programing. In contrast, by emitting electrons from charge storage region (layer) (erasing), we can increase the output current when Vread is applied. For example, it is illustrated in (1) of FIG. 12. This corresponds to the reduction of Vt and called erasing.

Since programming and erasing are performed in a predetermined range, for convenience, Vt has upper and lower bounds. That is, Vpass is at least higher than this Vt for convenience. Accordingly, Vpass is a voltage higher than read voltage (Vread). Voff is a voltage lower than the lower bound for this Vt for convenience.

When Vt is applied as control voltage, output current is still starting to flow. As control voltage increases from Vt, output current increases. Further increasing control voltage sufficiently, output current saturates. This current is called saturation current. That is, Vpass is high enough to make output current at the upper bound Vt for convenience be comparative with that at the lower bound Vt for convenience.

The difference between Vpass and the upper bound Vt for convenience can be reduced as S-factor (voltage necessary to increase current by one digit near at Vt) becomes lower. For the transistor characteristics in FIG. 12, a lower S-factor can make the transistor characteristics better.

Figure 13:
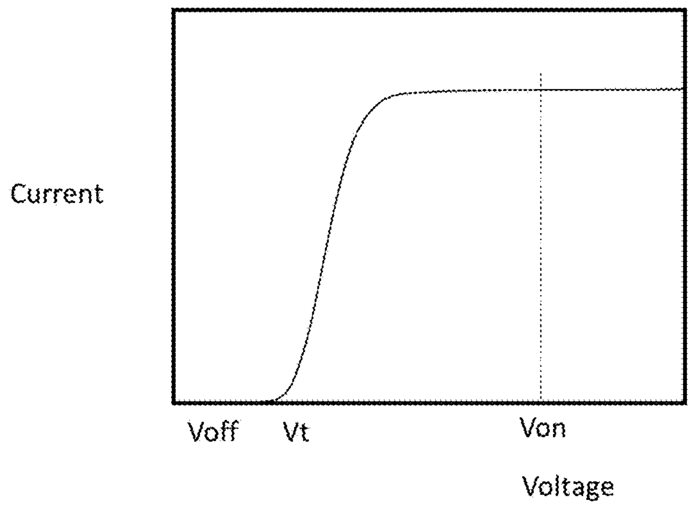
FIG. 13: a drawing to schematically illustrate transistor characteristics (electrical characteristics) of word line and bit line select gate transistors.

FIG. 13 is to illustrate an example of the concept of transistor characteristics (electrical characteristics) of word line and bit line select gate (BSGX,BSGY,WSGC,WSGUX, WSGDX,WSGUY,WSGDY) regarding the present invention. These word line and bit line select gate transistors do not need charge storage region. Accordingly, different from FIG. 12, it is not always that threshold voltage (Vt) is viable.

In general, this threshold voltage does not correspond to threshold of SUM (threshold of excitation), which is for transferring neurotransmitters from soma body A to soma body B by operating a synopsis.

Decoder inputs control voltage to the word line and bit line select gates. The horizontal axis in FIG. 13 is its control voltage. The vertical axis in FIG. 13 is output current flowing through bit line in response to control voltage. In the case that control voltage is higher than Vt, for example, a high voltage corresponding to the location of dotted line in the figure (Von) is applied as control voltage, output current flows so that transistor is in switch on. That is, Von is a voltage higher than Vt.

When control voltage is lower than Vt, for example, Voff is applied as control voltage, output current hardly flows so that transistor is in switch off. That is, Voff is a voltage lower than Vt. In the case that Vt in FIG. 13 is higher than the lower bound Vt for convenience in FIG. 12, Voff in FIG. 13 and Voff in FIG. 12 can be usually regarded as identical.

Both FIGS. 12 and 13 can illustrate the transistor characteristics of SGD and SGU. That is, SGD and SGU may or may not have charge storage region. However, if SGD and SGU have a similar cell structure with cell gate CG, then the semiconductor manufacturing cost can be reduced. Accordingly, in the present embodiment, as an example, SGD and SGU also are assumed to be a non-volatile memory cell having charge storage region. Hence, the cell structure is the same as cell gate CG. And they can be fabricated using the same fabrication method as that to fabricate CG. Accordingly, in this case, the transistor characteristics (electrical characteristics) of SGD and SGU may be like as illustrated in FIG. 12. However, it is unnecessary to tune the states of charge storage regions of SGD and SGU in cooperation to that of cell gate CG in the same unit.

However, even if SGD and SGU are assumed to be a transistor having the electrical characteristics as illustrated in FIG. 13, then it will not deviate from the rage of the present invention. Moreover, even if one of the word line and bit line select gates (BSGX,BSGY,WSGC,WSGUX, WSGDX,WSGUY,WSGDY) is assumed to be a transistor having the electrical characteristics as illustrated in FIG. 12, then it will not deviate from the range of the present invention.

(The second embodiment) To build a free three-dimensional network which is like the human brain inside a semiconductor chip, a method to link arbitral two cell gates CGs that are distributed on three-dimensional cell array is at least necessary.

Figure 14:
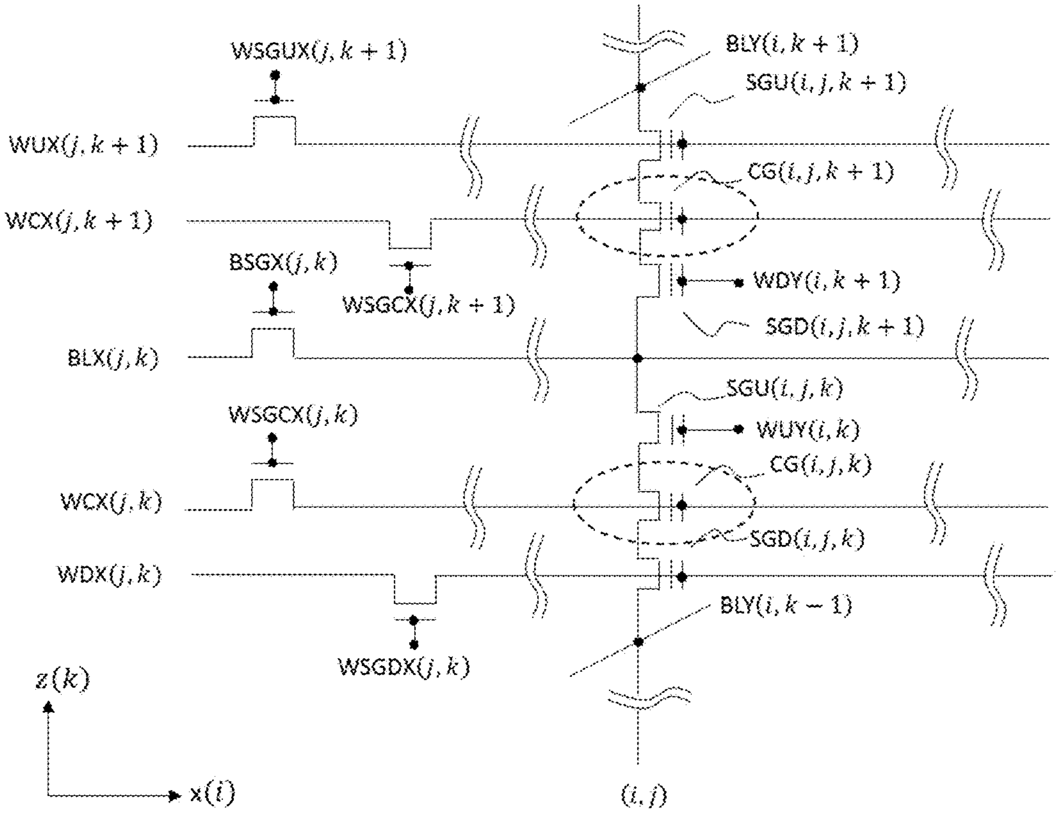
FIG. 14: a drawing to illustrate an example of the method to link two cell gates which are adjoining along the z-direction.
Figure 15:
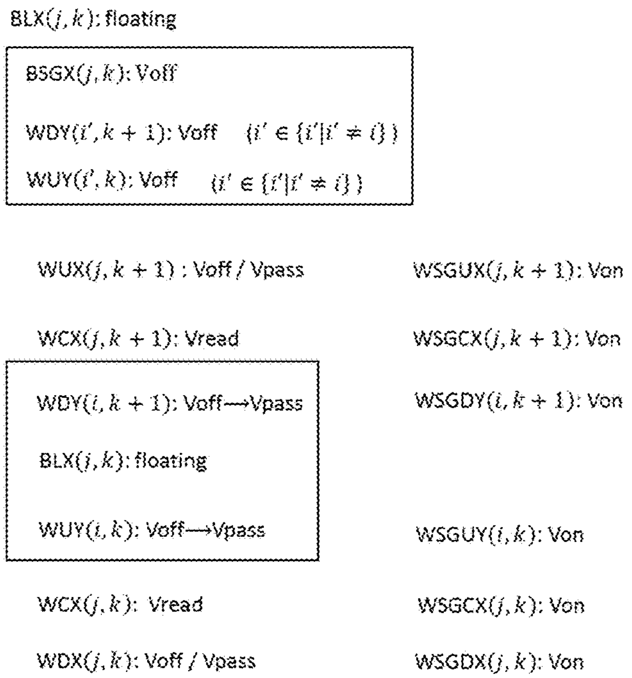
FIG. 15: a drawing to illustrate an example of the method to apply voltages to link two cell gates which are adjoining along the z-direction.

FIG. 14 are to illustrate an example of the link of two cells, CG (i, j, k+1) and CG (i, j, k), which are enclosed by dotted line. In FIG. 15, an example of the set of voltages to connect (link) these two cells enveloped by the dotted line is illustrated.

There is a bit line BLX (j, k) between the two cells, CG (i, j, k+1) and CG (i, j, k), which are enclosed by dotted line. First, to make it independent from the cells other than these two cells enclosed by the dotted line, Voff is applied on BSGX (j, k), Voff is applied on WDY (i', k+1), and Voff is applied on WUY (i', k). However, i' is an integer ranging from 1 to Lx, which is different from i.

Moreover, Voff is applied on WUX (j, k+1), Vread is applied on WCX (j, k+1), Voff is applied on WDY (i, k+1), Voff is applied on WUY (i, k), Vread is applied on WCX (j, k), and Voff is applied on WDX (j, k). By this way, BLX (j, k) can be in a floating state.

Von is kept being applied on WSGUX (j, k+1), WSGCX (j, k+1), WSGDY (i, k+1), WSGUY (i, k), WSGCX (j, k), WSGDX (j, k).

Subsequently, increasing a voltage applied on WDY (i, k+1) and WUY (i, k) from Voff to Vpass, the two cells, CG (i, j, k+1) and CG (i, j, k), which are enclosed by the dotted line, are connected (linked).

Furthermore, to connect (link) CG (i, j, k) to CG (i, j, k−1), the voltage applied on WDX (j, k) is to be increased from Voff to Vpass. Moreover, to connect (link) CG (i, j, k+1) to CG (i, j, k+2), the voltage applied on WUX (j, k+1) is to be increased from Voff to Vpass.

Figure 16:
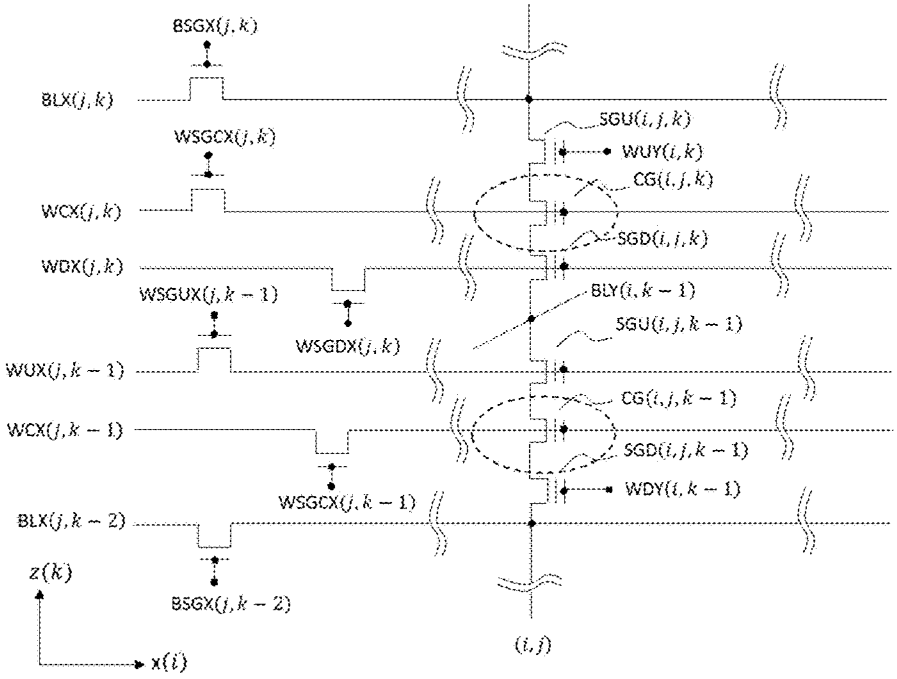
FIG. 16: a drawing to illustrate an example of the method to link two cell gates which are adjoining along the z-direction.
Figure 17:
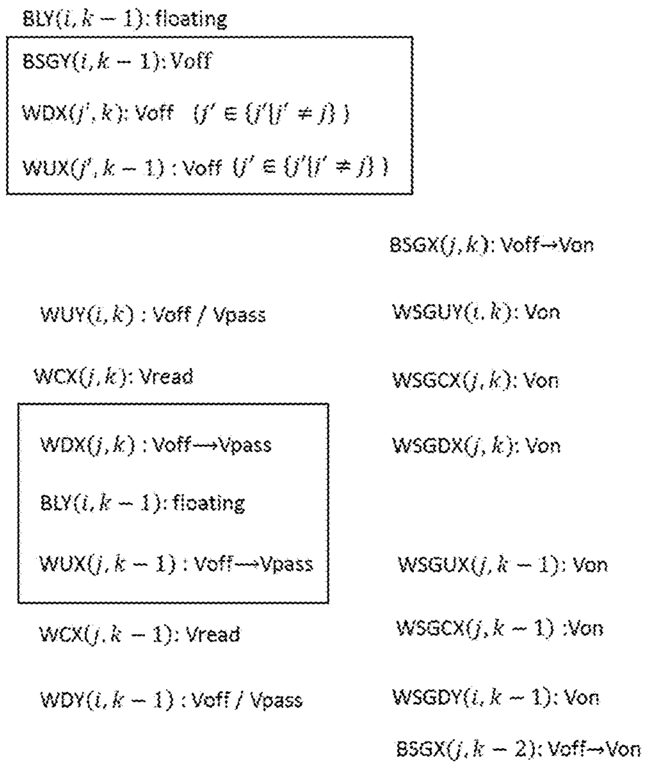
FIG. 17: a drawing to illustrate an example of the method to apply voltages to link two cell gates which are adjoining along the z-direction.

Since there is the two-floor periodicity along the z-axis, CG (i, j, k) and CG (i, j, k−1) should be linked by another method. An example of it is to be illustrated using FIGS. 16 and 17. In FIG. 16, CG (i, j, k) and CG (i, j, k−1) are enclosed by the dotted line.

There is a bit line BLY (j, k−1) between the two cells, CG (i, j, k) and CG (i, j, k−1), which are enclosed by dotted line. First, to make it independent from the cells other than CG (i, j, k) and CG (i, j, k−1), Voff is applied on BSGY (j, k−1), Voff is applied on WDX (j', k−1), and Voff is applied on WUX (j', k−1). However, j' is an integer ranging from 1 to Ly, which is different from j.

Moreover, Voff is applied on WUY (j, k), Vread is applied on WCX (j, k), Voff is applied on WDX (j, k), Voff is applied on WUX (j, k−1), Vread is applied on WCX (j, k−1), and Voff is applied on WDY (j, k−1). By this way, BLY (j, k−1) can be in a floating state.

Von is kept to be applied on WSGUY (i, k), WSGCX (j, k), WSGDX (j, k), WSGUX (j, k−1), WSGCX (j, k−1), WSGDY (i, k−1).

Subsequently, increasing a voltage applied on WDX (j, k) and WUX (j, k−1) from Voff to Vpass, the two cells, CG (i, j, k) and CG (i, j, k−1), which are enclosed by the dotted line, are connected (linked).

To connect (link) CG (i, j, k) to CG (i, j, k+1), the voltage applied on WUY (i, k) is to be increased from Voff to Vpass.

Moreover, to connect (link) CG (i, j, k−1) to CG (i, j, k−2), the voltage applied on WDY (i, k−1) is to be increased from Voff to Vpass.

Figure 18:
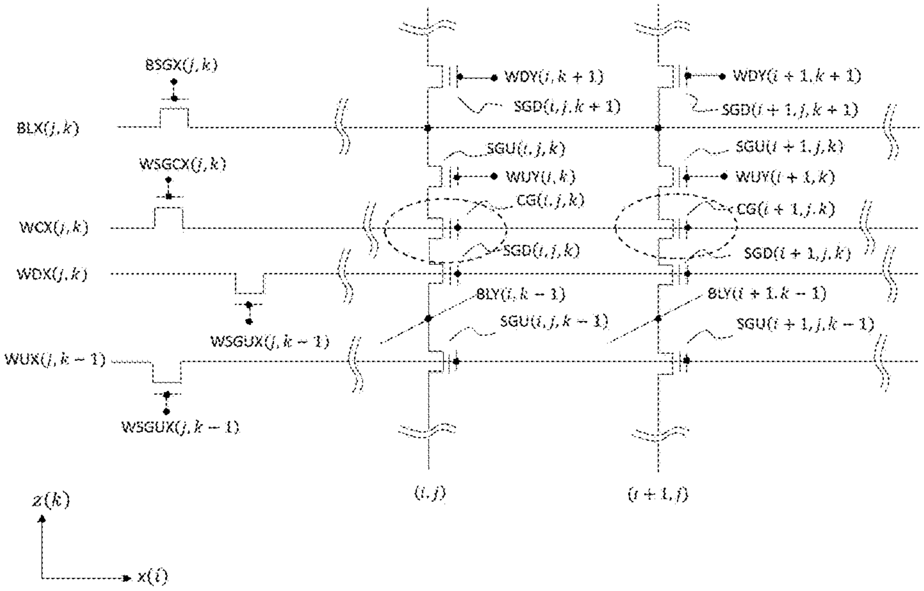
FIG. 18: a drawing to illustrate an example of the method to link two cell gates which are adjoining along the x-direction.

In FIG. 18, the x-direction linkage can be realized using the bit line BLX (j, k). First, to make it independent from the cells other than the two cells, CG (i, j, k) and CG (i+1, j, k), which are enclosed by the dotted line, Voff is applied on BSGX (j, k), Voff is applied on WUY (i', k), and Voff is applied on WDY (*, k+1). However, i' is an integer ranging from 1 to Lx, which is different from i, and * is an arbitral integer ranging from 1 to Lx. Furthermore, Voff is applied on WUY (i, k) and WUY (i+1, k) so that BLX (j, k) can be in a floating state. Applying Voff on WDX (j, k), it can be disconnected from the y-direction bit line BLY (*, k−1). However, * is an arbitral integer ranging from 1 to Lx. Increasing a voltage applied on WUY (i, k) and WUY (i+1, k) from Voff to Vpass, the two cells, CG (i, j, k) and CG (i+1, j, k), which are enclosed by the dotted line, can be linked (connected).

Moreover, to connect CG (i, j, k) and CG (i+1, j, k), which are enclosed by the dotted line, to another cell existing along the y-direction, it is necessary to increase the voltage applied on WDX (j, k) from Voff to Vpass.

Figures 19, 20:
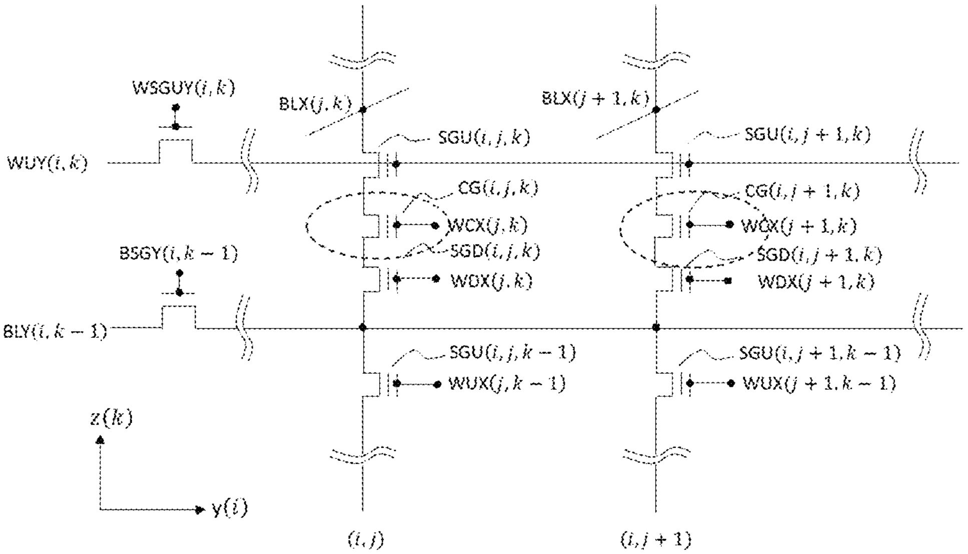
FIG. 19: a drawing to illustrate an example of the method to apply voltages to link two cell gates which are adjoining along the x-direction.
FIG. 20: a drawing to illustrate an example of the method to link two cell gates which are adjoining along the y-direction.
Figure 21:
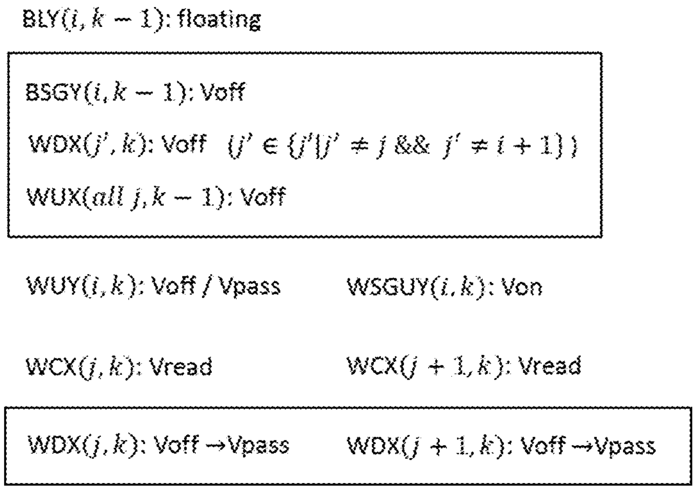
FIG. 21: a drawing to illustrate an example of the method to apply voltages to link two cell gates which are adjoining along the y-direction.

Next, an example of a method to link along the y-direction is to be illustrated using FIGS. 20 and 21.

In FIG. 20, the y-direction link can be realized using the bit line BLY (i, k−1). First, to make it independent from the cells other than the two cells, CG (i, j, k) and CG (i, j+1, k), which are enclosed by the dotted line, Voff is applied on BSGY (i, k−1), Voff is applied on WDX (j', k), and Voff is applied on WUX (*, k−1). However, j' is an integer ranging from 1 to Ly, which is different from j, and * is an arbitral integer ranging from 1 to Ly. Furthermore, Voff is applied on WDX (j, k) and WDX (j+1, k) so that BLY (i, k−1) can be in a floating state. Applying Voff on WUY (i, k), it can be disconnected from the x-direction bit line BLX (*, k). However, * is an arbitral integer ranging from 1 to Ly. Increasing a voltage applied on WDX (j, k) and WDX (j+1, k) from Voff to Vpass, the two cells, CG (i, j, k) and CG (i, j+1, k), which are enclosed by the dotted line, can be linked (connected).

Moreover, to connect CG (i, j, k) and CG (i, j+1, k), which are enclosed by the dotted line, to another cell existing along the x-direction, it is necessary to increase the voltage applied on WUY (i, k) from Voff to Vpass.

(Third embodiment) In the second embodiment, a method to connect two arbitral cell gates, which are arrayed on three-dimensional space was illustrated. In FIGS. 22 to 28, which illustrates the present embodiment, the two cell gates (or simply called cells, corresponding to memory cell) which are connected in the second embodiment are simply enclosed using a bold line.

Figure 3:
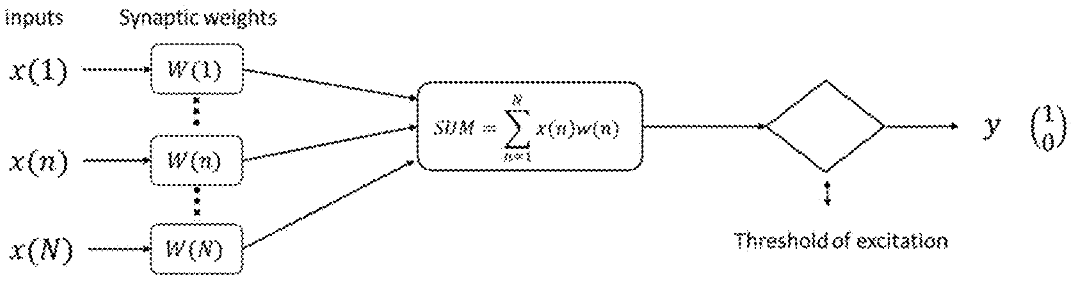
FIG. 3: a drawing to illustrate an example of the concept of perceptron.
Figure 4:
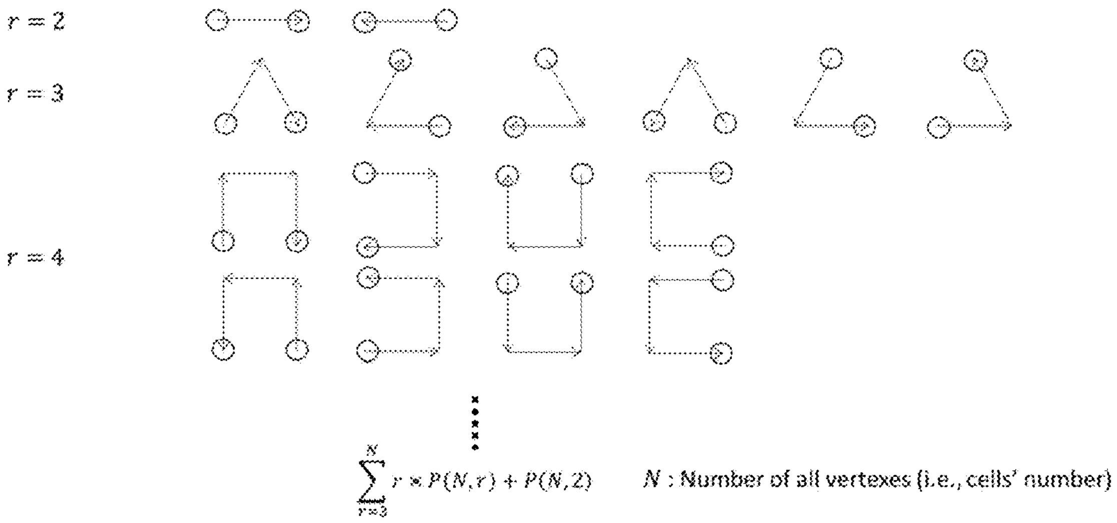
FIG. 4: a drawing to illustrate an example of the method to count the number of cases of links between two points.
Figure 5:
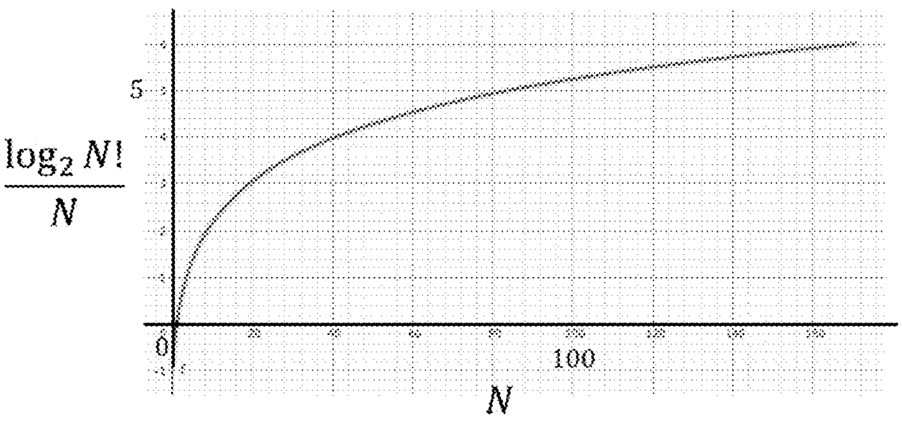
FIG. 5: a drawing to plot the ratio of information quantity of network to that of bit (bit number) regarding node number (N).
Figure 6:
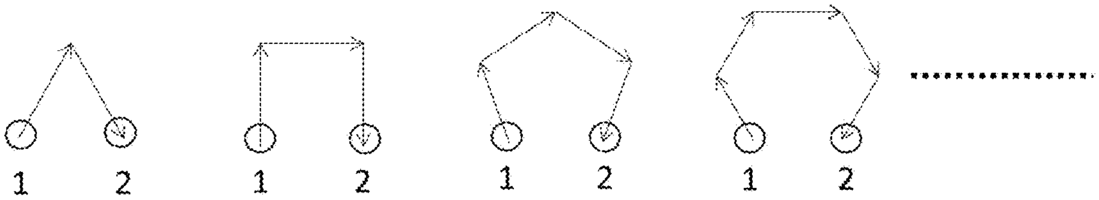
FIG. 6: a drawing to illustrate a possibility that the input to the end points is different if paths connecting the same initial and end points are different.
Figure 7:
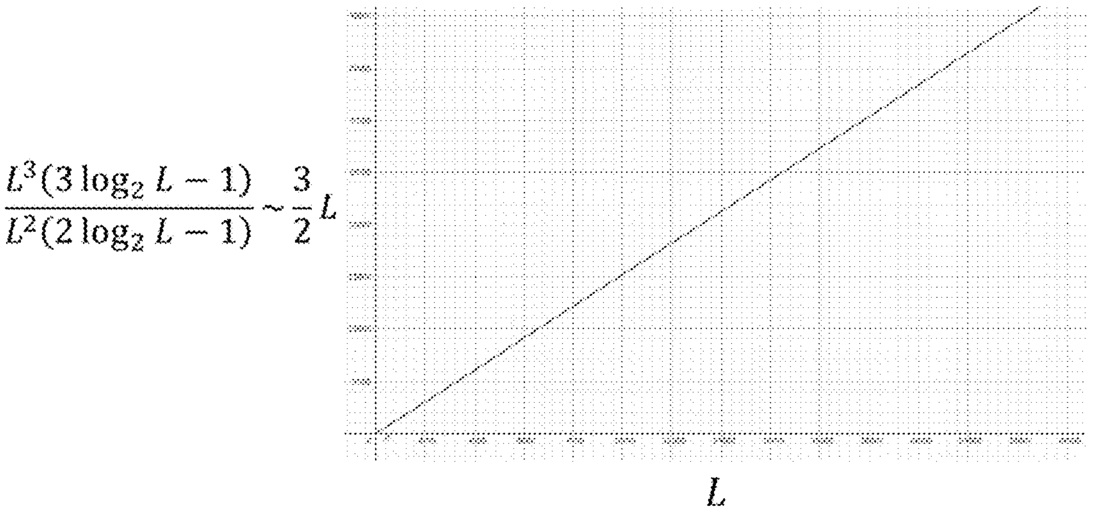
FIG. 7: a drawing to plot the ratio of information quantities of three-dimensional and two-dimensional networks regarding the size of one side of the cell array.
Figure 22:
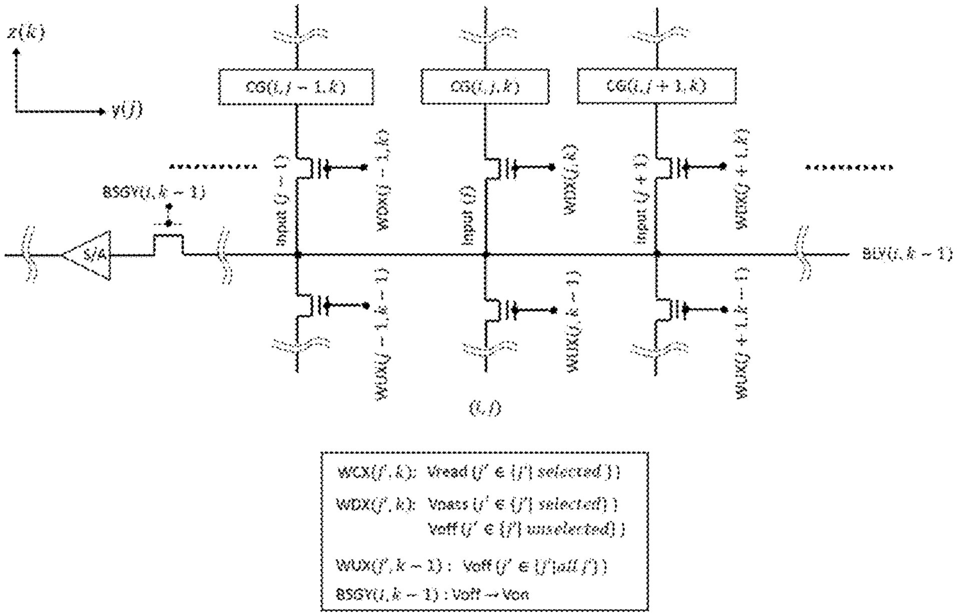
FIG. 22: a drawing to illustrate an example of the embodiment wherein a y-direction bit line BLY (i, k−1) is a soma body.

However, to reproduce the perceptron in FIG. 3, a mechanism to add multiple inputs is necessary. In FIG. 22, what is illustrated is a method that bit line BLY (i, k−1) adds multiple outputs from CG (i, *, k) which are arrayed along the y-direction. However, * is an integer ranging from 1 to Ly. First, to make BLY (i, k−1) floating, Voff is applied on BSGY (i, k−1), Voff is applied on WDX (*, k), Voff is applied on WUX (*, k−1).

Of course, it is not always necessary to add outputs from all cells along the y-direction. It may be good enough to add outputs from cells having been chosen at convenience. For this aim, Vread is applied on the select gate WDX (j1, k). However, j1 is the y-address (the first select y-address) of cells having been chosen to add their outputs at BLY (i, k−1). The first select y-address(es) may be multiple or single.

A cell arrayed on the first select y-address can output current in response to a state of charge storage region (Vt). As explained using the three-states of (1), (2), and (3) in FIG. 12, as an example, the number of states is not always three. It may be possible that the number of states is two, four, or more. That is, the M states are possible, where, in general, M is generally an integer which is greater than 1.

This is called M-level per cell (MLC). In the technical field of flash memory, MLC is conventionally used for 4-states per cell. The 8-states above it is called TLC, and the 16-states is called QLC. Like this, it has been found that the state number per cell can be until 16 in the product level. (See non-patent document 3.) The state number per cell may increase later thanks to the technical innovation. Moreover, it is not always a multiple of two. Accordingly, said M (state number per cell) can be an arbitral integer which is greater than 1.

To disconnect BLY (i, k−1) from the lower layers, Voff is applied on WUX (*, k−1). However, * is an arbitral integer ranging from 1 to Ly. The voltage applied on WDX (j1, k) in the first select y-address (j1) is increased from Voff to Vpass. Or Vpass can be applied on WDX (*, k) at all y-address (*) if Voff is applied on non-selected WDX (non-selected j, k). However, * is an arbitral integer which is greater than 1. It is in a stand-by state while voltage applied on the y-direction bit line select gate BSGY (i, k−1) is Voff. Increasing this Voff to Von, the output currents from the selected cells CG (j1, k), which are added at the BLY (i, k−1), can be sensed by the sense-amplifier (S/A).

Said sense-amplifier is usually included in a decoder. But it may be set up separately from the decoder. Anyway, it can be set up out of the cell array. Said sense-amplifier can check if the level of currents having been added at BLY (i, k−1) is higher or lower than a predetermined threshold. After checking it, Voff is applied on BSGY (i, k−1) again. In the case that said level of added currents is higher than said predetermined threshold, it can be regarded as in an excited state of synapsis. Otherwise, it can be regarded as in a non-excited state of synapsis.

Figure 23:
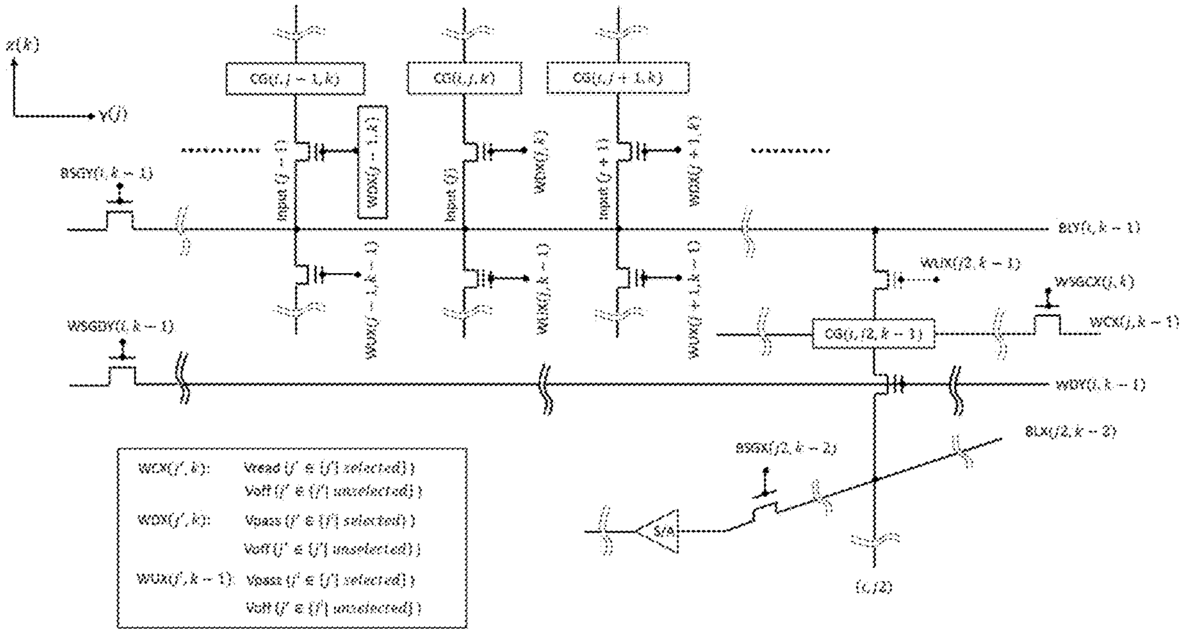
FIG. 23: a drawing to illustrate an example of the embodiment wherein a y-direction bit line BLY (i, k−1) is a soma body.

In a case of excited state of synapsis, as shown in FIG. 23, voltage applied on WUX (j2, k−1) is increased from Voff to Vpass. Hence, the current added at BLY (i, k−1) is transferred to the second select cell CG (j2, k−1) as a new input. However, j2 is the second select y-address. Applying Von, Von, and Vpass on BSGX (j2, k−2), WSGDY (i, k−1) and WDY (i, k−1), respectively, the sense-amplifier can read output from the second select cell CG (j2, k−1). This sense-amplifier may be the same as that in FIG. 22, or another sense-amplifier separately set up. Hence, the voltage applied on WCX (j, k−1) is Vread or Vpass.

Figure 1:
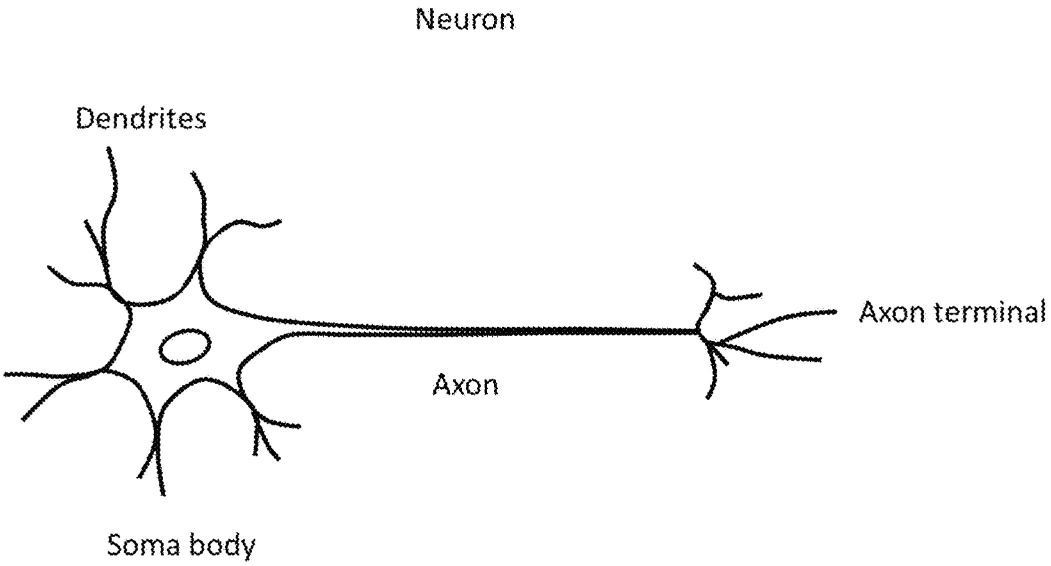
FIG. 1: a drawing to illustrate an example of neural network.
Figure 2:
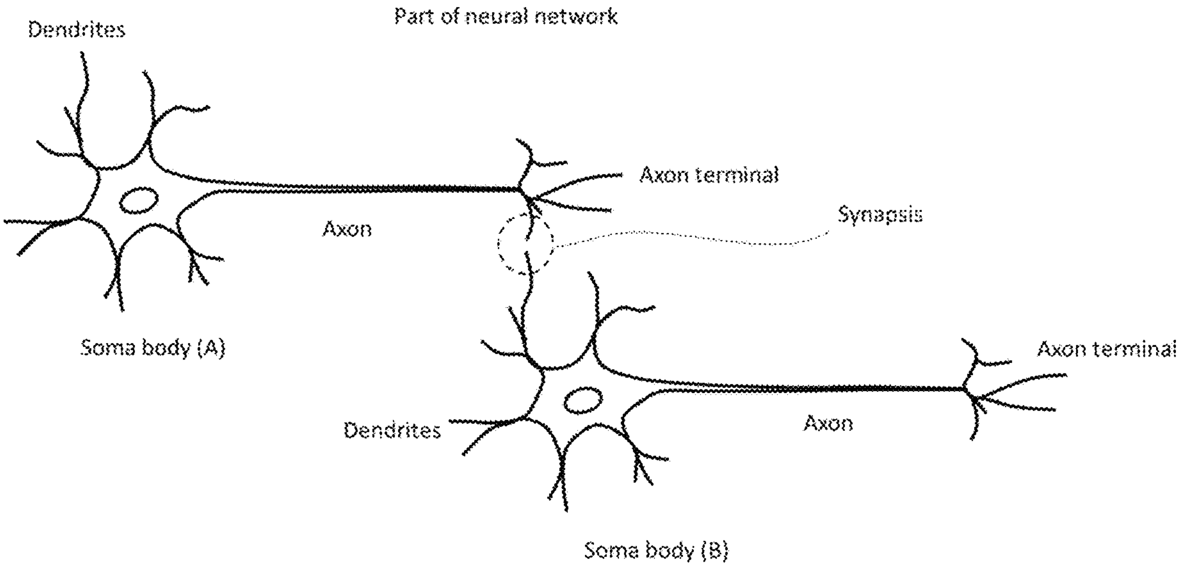
FIG. 2: a drawing to illustrate an example of synapsis.

Like this, the present invention can imitate the soma body (A) shown in FIGS. 1 and 2 using BLY (i, k−1), BSGY (i, k−1), and sense-amplifier. The cell CG (i, j1, k) having a plural of or single said first select y-addresses (j1) corresponds to dendrites of the soma body (A) in FIG. 2. That is, the current input to CG (i, j1, k) corresponds to the signal input to a dendrite of soma body (A) in FIG. 2. This signal corresponds to x (j1) in FIG. 3. The Vt of those cells is variable, and each of these cells is in a state having been programed. If Vread is applied on a word line of each cell, then the output from a cell CG (i, j1, k) having j1 as an argument is variable in response to a state of Vt having been programmed, respectively. This corresponds to multiplying the weight W (j1) and the input x (j1) in the perceptron in FIG. 3. However, j1 is an integer ranging from 1 to N in FIG. 3. That is, the input to CG (i, j1, k) corresponds to x (j1) in FIG. 3. The output from CG (i, j1, k) corresponds to the product with the weight, x (j1) W (j1). What can be obtained at BLY (i, k−1) by adding this product x (j1) W (j1) for each j1 ranging from 1 to N is the SUM of the perceptron in FIG. 3. In this case, it can be regarded that BLY (i, k−1) corresponds to the main body of soma body (A) in FIG. 2. The sense-amplifier and the select gate BSGY (i, k−1) can be used to illustrate the function of soma body (A).

Said SUM can be sensed by the sense-amplifier and then compared with threshold (threshold of excitation). If the SUM is higher than the threshold, then the synapsis is regarded as excited and then BLY (i, k−1) is connected to CG (i, j2, k−1) having the second select y-address (j2) as an argument by applying Vpass on WUX (j2, k−1). Hence, a synapsis can be generated. That is, the CG (i·j2·k−1) takes the role of a dendrite of soma body (B), which forms a synapsis of soma body (B) and soma body (A) in FIG. 2. In this case, the BLX (j2, k−2) can be regarded as the main body of the soma body (B) in FIG. 2. The select gate BSGX (j2, k−2) and the sense-amplifier can be used to illustrate the function of soma body (B).

Figure 24:
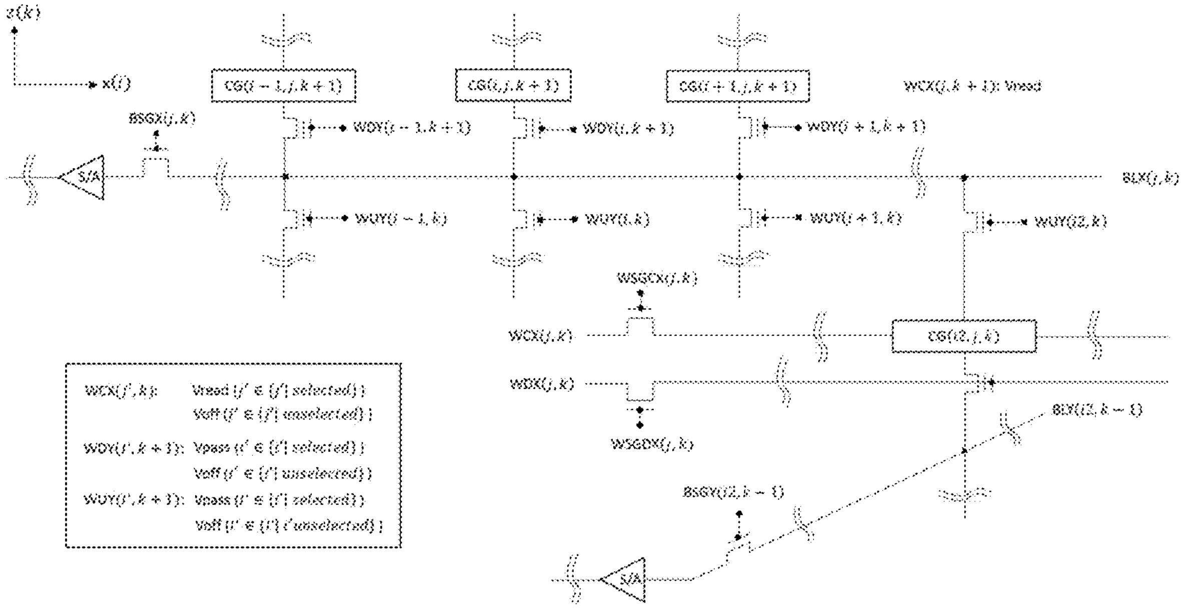
FIG. 24: a drawing to illustrate an example of the embodiment wherein a x-direction bit line BLX (j, k) is a soma body.

FIG. 24 is a drawing to illustrate an example of the method to add outputs from CG (*, j, k+1) using BLX (j, k). However, * is an arbitral integer ranging from 1 to Lx. Vread is applied on the word line WCX (j, k+1) associated with every cell. Subsequently, to make BLX (j, k) floating, Voff is applied on BSGX (j, k) and then Voff is applied on WUY (*, k) and WDY (*, k+1). The voltage applied on WDY (i1, k+1) associated with the selected x-address (the first select x-address i1) is increased from Voff to Vpass. However, the first select address i1 may be a single integer or plural ones. Vpass is applied on WUY (i2, k) associated with the next selected x-address (the second x-address i2). Hence, the current added at BLX (j, k) can be transferred to the cell CG (i2, j, k).

By this way, the soma body (A) in FIGS. 1 and 2 can be imitated using BLX (j, k), BSGX (j, k) and the sense-amplifier. The cell CG (i1, j, k+1) having a plural of or single said first select x-addresses (i1) corresponds to dendrites of the soma body (A) in FIG. 2. The current input to CG (i1, j, k+1) corresponds to the signal input to a dendrite of soma body (A) in FIG. 2. This input signal corresponds to x (i1) in FIG. 3. The Vt of those cells is variable, and each of these cells is in a state having been programed. If Vread is applied on a word line of each cell, then output from cell CG (i1, j, k+1) having i1 as an argument is variable in response to a state of Vt having been programmed, respectively. This corresponds to multiplying the weight W (i1) and the input x (i1) in the perceptron in FIG. 3. However, i1 is an integer ranging from 1 to N in FIG. 3. That is, the input to CG (i1, j, k) corresponds to x (i1) in FIG. 3. The output from CG (i1, j, k) corresponds to the product with the weight, x (i1) W (i1). What can be obtained at BLX (j, k) by adding this product x (i1) W (i1) for each i1 ranging from 1 to N is the SUM of the perceptron in FIG. 3. In this case, it can be regarded that BLX (j, k) corresponds to the main body of soma body (A) in FIG. 2. The sense-amplifier and the select gate BSGX (j, k) can be used to illustrate the function of soma body (A).

Said SUM can be sensed by the sense-amplifier and then compared with threshold (threshold of excitation). If the SUM is higher than the threshold, then the synapsis can be regarded as excited and then BLX (j, k) is connected to CG (i2, j, k) having the second select x-address (i2) as an argument by applying Vpass on WUY (i2, k). That is, the CG (i2, j, k) takes the role of a dendrite of soma body (B), which forms a synapsis of soma body (B) and soma body (A) in FIG. 2. In this case, the BLY (i2, k−1) can be regarded as the main body of the soma body (B) in FIG. 2. The select gate BSGY (i2, k−1) and the sense-amplifier can be used to illustrate the function of soma body (B).

Like this, in the present invention, a bit line takes a role of soma body, and a cell (memory cell) takes a role of dendrite. This is one of the most important characteristics of the present invention.

Figure 25:
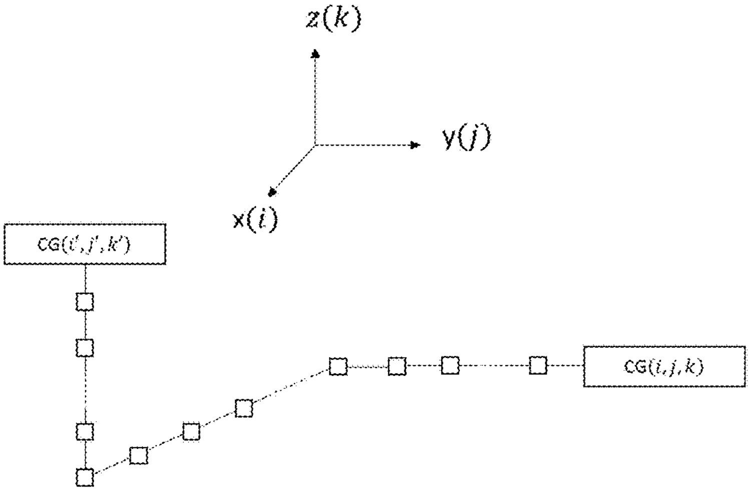
FIG. 25: a drawing to illustrate an example of the embodiment wherein a link is formed.

(The fourth embodiment) If the method having been illustrated in the second embodiment is repeated, it is possible to expand various connections along the x-direction, the y-direction, and the z-direction. This tells us that arbitral two cells can be connected, which cells are arrayed in the cell array. FIG. 25 illustrates an example of it. The cell at the initial point is CG (i', j', k') and the cell at the end point is CG (i, j, k). For the simplicity of illustration, cells, which are passed through to transfer data from the initial to end points, are depicted open square (□) The upper and lower select gates, which compose a unit together with cells which data pass through, have been omitted for simplicity. However, Vpass is applied on upper and lower select gates, which compose a unit together with cells to be passed through. The number of cells to be passed through (□), which connect the initial and end points, may be zero, sole or plural. In the third embodiment, the number of cells to be passed through (□), which connect the initial and end points, is zero.

Said cells to be passed through (□) can be used to reproduce axons in FIGS. 1 and 2. The cell at the initial point CG (i', j', k') and the cell at the end point CG (i, j, k) takes a role of dendrites composing synapsis between soma body (A) and soma body (B) in FIG. 2. In this case, the cell CG (i', j', k') at the initial point corresponds to an axon terminal of soma body (A). The cell at the end point CG (i, j, k) corresponds to a dendrite of soma body (B).

The connection can be further repeated from the cell CG (i, j, k), output signal from which has been added to BLY (i, k−1) in an example of FIG. 22, along the x-direction, the y-direction, and the z-direction.

Figure 26:
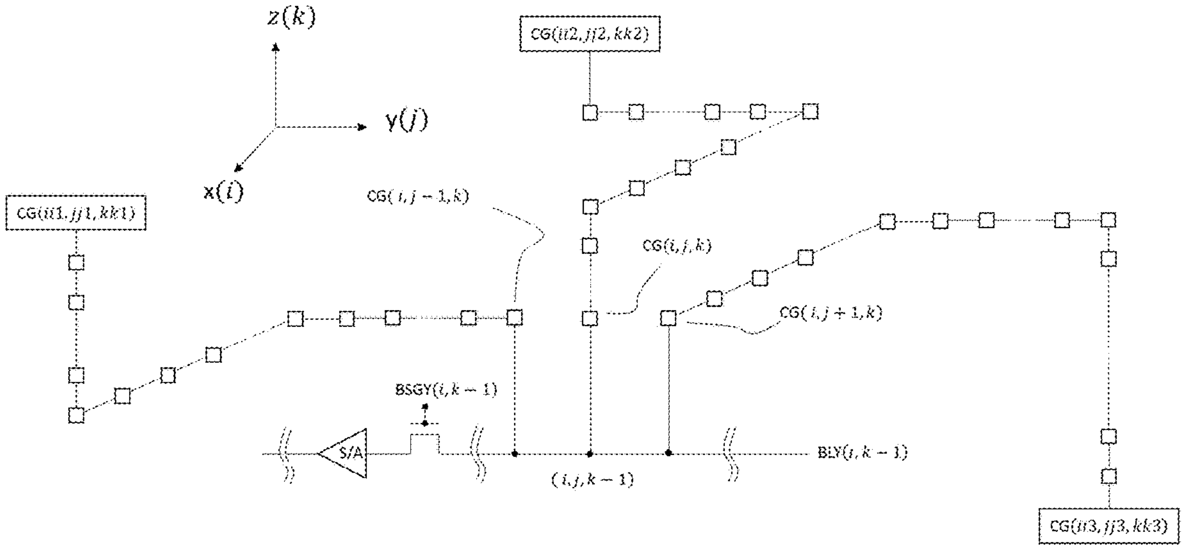
FIG. 26: a drawing to illustrate an example of the embodiment wherein a y-direction bit line BLY (i, k−1) is a soma body.

As an example, in FIG. 26, we can explain the case where inputs from three initial points CG (ii1, jj1, kk1), CG (ii2, jj2, kk2) and CG (ii3, jj3, kk3) are weighted and then added at BLY (i, k−1). Of course, the number of the initial points is not always limited to three. The number of inputs to be added at BLY (i, k−1) may be one or two or a greater integer. Those initial points take the role of the dendrites in FIGS. 1 and 2.

In FIGS. 22 and 23, the cells CG (i, j1, k) having the first select y-address (j1) as an argument are the terminal cells to be associated with BLY (i, k−1). However, j1 is an integer ranging from 1 to N. In FIG. 3, N is the number of external inputs that perceptron receives. In this example, it can be regarded as the same as the number of initial points. That is, the input to the cell at the initial point is the input x (j1) to the perceptron in FIG. 3. Vread is applied on the word lines of cells at the initial points. When the input currents are added at BLY (i, k−1), the weight W (j1) is respectively multiplied to inputs in response to the state of the cell for each initial point. The role of BLY (i, k−1), BSGY (i, k−1) and the sense-amplifier has been omitted in the explanation because it is similar to what was explained in FIGS. 22 and 23.

Either Vpass or Vread may be applied on word line of each cell to be passed through. Besides, the integer kk3 may be smaller than or the same as, or greater than k−1. The integer ii2 may be greater or smaller than or the same as i. The integer jj2 may be greater or smaller than or the same as j.

Figure 27:
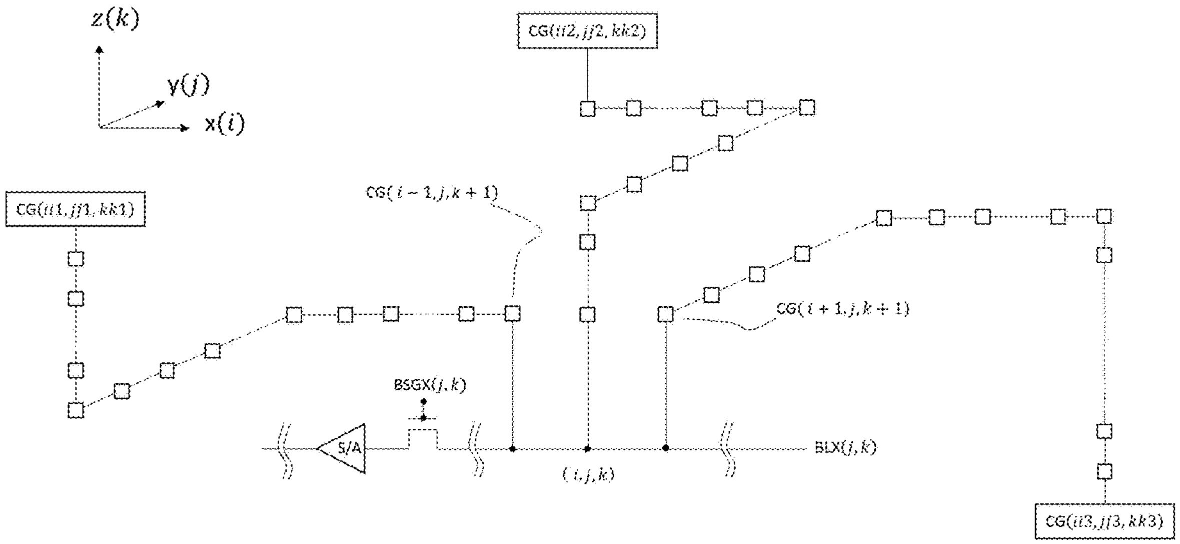
FIG. 27: a drawing to illustrate an example of the embodiment wherein a x-direction bit line BLX (j, k) is a soma body.

As an example, in FIG. 27, we can explain the case where inputs from three initial points CG (ii1, jj1, kk1), CG (ii2, jj2, kk2) and CG (ii3, jj3, kk3) are weighted and then added at BLX (j, k). Of course, the number of initial points is not always limited to three. The number of inputs to be added at BLX (j, k) may be one or two or a greater integer. The limitation of the number of initial points is the product of Lx, Ly, and Lz. Those initial points take the role of the dendrites in FIGS. 1 and 2.

In FIGS. 24, the cells CG (i1, j, k) having the first select x-address (i1) as an argument are the terminal cells to be associated with BLX (j, k−1). However, i1 is an integer ranging from 1 to N. In FIG. 3, N is the number of external inputs that perceptron receives. In this example, it can be regarded as the same as the number of initial points. That is, the input to the cell at the initial point is the input x (i1) to the perceptron in FIG. 3. Vread is applied on the word lines of cells at the initial points. When the input currents are added at BLX (j, k), the weight W (i1) is respectively multiplied to the inputs in response to the state of cell for each initial point. The role of BLX (j, k), BSGX (j, k) and the sense-amplifier is omitted in the explanation because it is similar to what was explained in FIG. 24.

Return back to FIG. 25. Either Vpass or Vread may be applied on word line of each cell to be passed through from the initial point CG (i', j', k') to the end point CG (i, j, k). In the case where Vread is applied on the word lines of all cells to be passed through, the input current flowing into the initial point and that to be transferred to the end point can be regarded as in the same level if we can exclude the effects from wiring resistance, parasitic resistance, etc. In this case, it does not matter which pass the signal has been transported through from the initial point to the end point.

Figure 28:
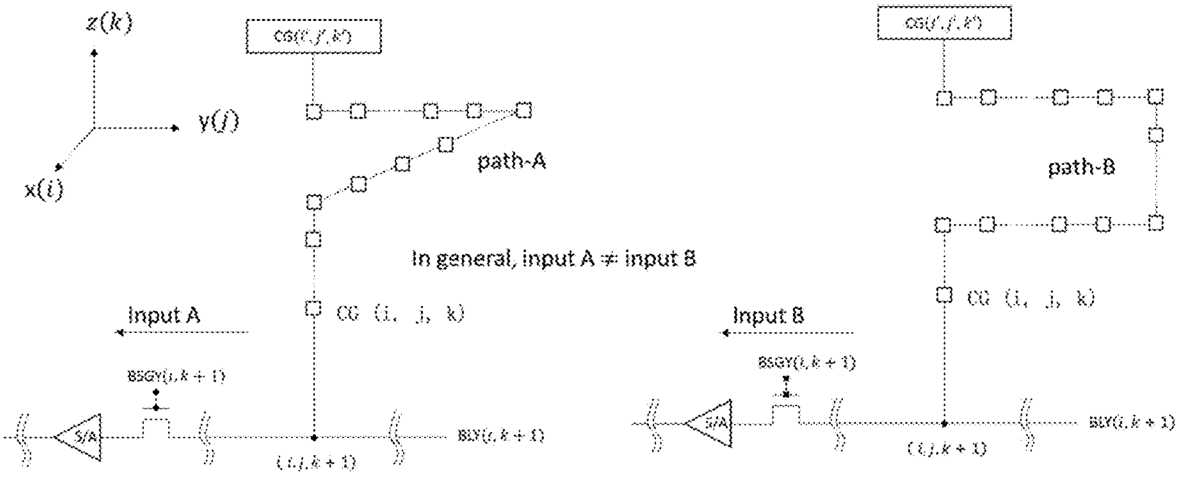
FIG. 28: a drawing to illustrate an example of the embodiment wherein information can be stored using paths.
Figure 29:
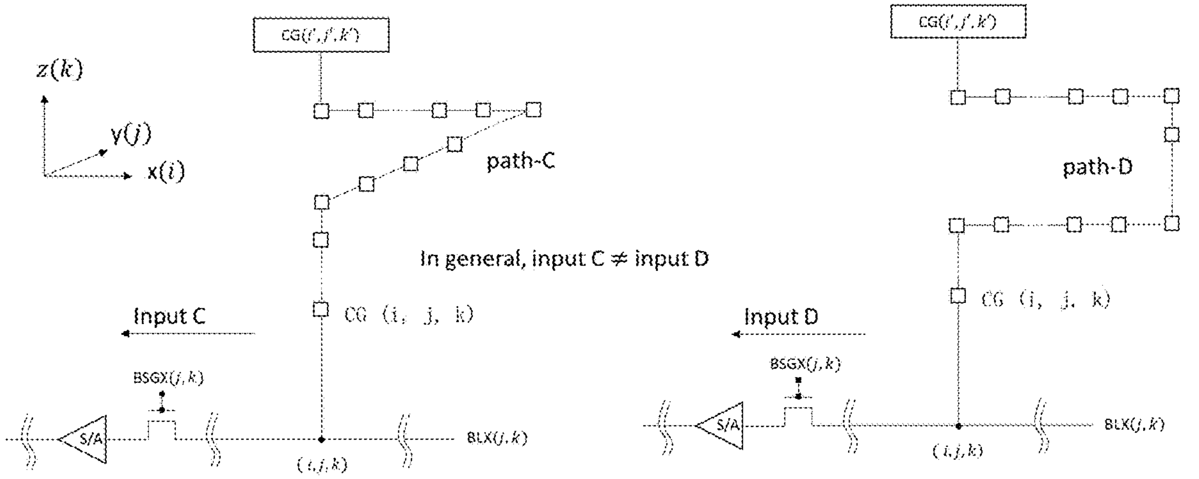
FIG. 29: a drawing to illustrate an example of the embodiment wherein information can be stored using paths.

In contrast, in the case where Vread is applied on one or two or more cells to be passed through in a path from the initial to end points, the current to be transferred from the initial to end points is variable in response to path. It is because there is a possibility that Vt of a cell having been passed through in the path is different. If Vt is different, the output current from that cell to be passed through is different, as illustrated in FIG. 12. That is, as illustrated in FIG. 28, even while the initial point CG (i', j', k') and the end point CG (i, j, k) are the same, there is a possibility that currents having been passed through two different paths (path-A and path-B) to flow into BLY (i, k+1) are different each other. Similarly, as illustrated in FIG. 29, even while the initial point CG (i', j', k') and the end point CG (i, j, k) are the same, there is a possibility that currents having been passed through two different paths (path-C and path-D) to flow into BLX (j, k) are different each other.

In other words, if Vread is applied on a word line of a cell to be passed through, then it may become possible to store information using paths from the initial to end points (network). By this way, it is one of the characteristics of the present invention that information can be stored using paths (network) in a similar way to neural networks.

Here, return back to FIG. 12. The current is different (or changeable) in response to Vt having been programmed in advance in the voltage region of Vread. That is, a cell having been applied with Vread can be regarded as variable resistance. That is, in the case where Vread is applied on every cell to be passed through, the change of the path from the initial to end points is identical to the change of resistance of path from the initial to end points. By this way, it becomes able to store information using network like the neural network of the human brain.

(Fifth embodiment) FIG. 9 is an equivalent circuit to illustrate an example of the first embodiment, while the x-address is i and the y-address is j. There is the y-direction bit line BLY (i, k+1) at the top and the x-direction bit line BLX (j, k−2) at the bottom. There are cell gates CG (i, j, k+1), CG (i, j, k), CG (i, j, k−1) between them. There is the x-direction bit line BLX (j, k) between CG (i, j, k+1) and CG (i, j, k). There is the y-direction bit line BLY (i, k−1) between CG (i, j, k) and CG (i, j, k−1). This reflects the two-floor periodicity which is characteristic of the present invention. The 1 unit can be composed of each cell gate sandwiched by upper select gate SGU and lower select gate SGD. That is, FIG. 9 is an equivalent circuit of 1 module including 3 units along the z-axis.

Figure 30:
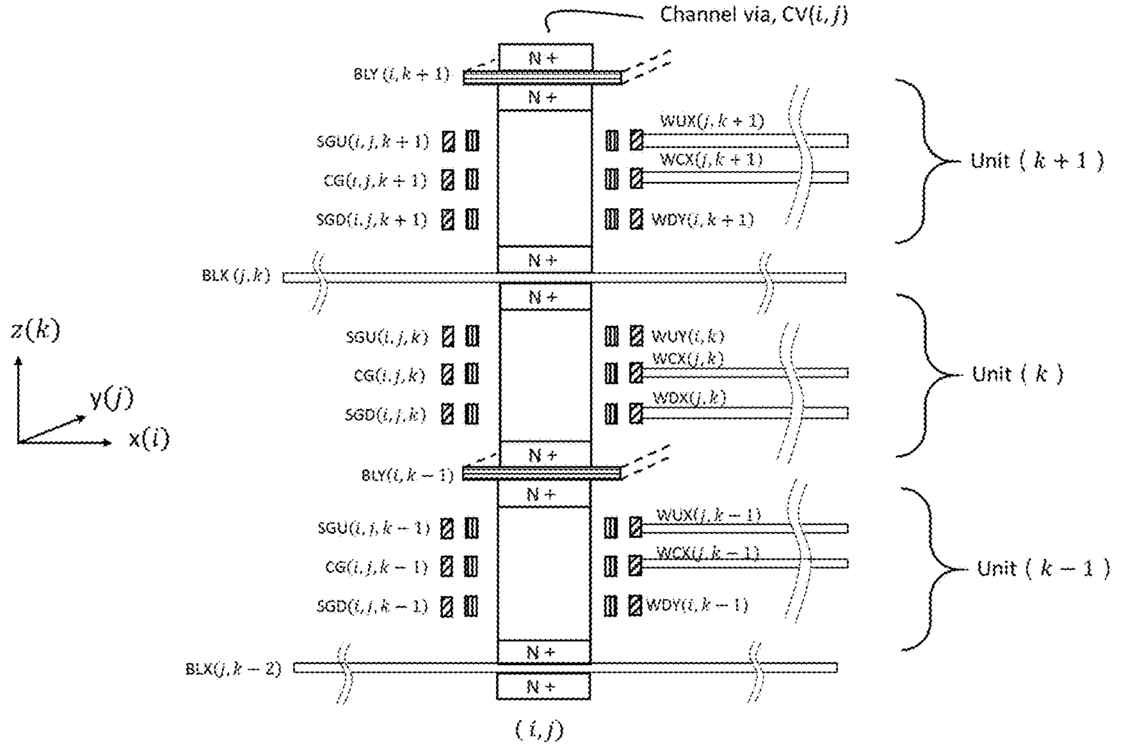
FIG. 30: a drawing to illustrate that the z-direction one module can be composed of three units.

FIG. 30 is a cross-sectional view to illustrate an example of the cell design to realize the equivalent circuit of FIG. 9. However, x-address is i and the y-address is j.

There is the bit line BLY (i, k+1) which expanded along the y-direction at the top end of the one module along the z-axis direction. There is the bit line BLX (j, k−2) which expanded along the x-axis direction at the bottom end of the one module along the z-direction. There are three units, each of which is composed of cell gate CG, upper select gate SGU and lower select gate SGD, from the top along the z-axis direction. Let us call those units, Unit (k+1), Unit (k), Unit (k−1) from the top. There is BLX (j, k) which is expanded along the x-direction between Unit (k+1) and Unit (k). There is BLY (i, k−1) which is expanded along the y-direction between Unit (k) and Unit (k−1).

In this cross-section, Unit (k+1) can be converted to Unit (k−1) by replacing the z-address (k) with k−2. In these two units, the layout of word lines is all the same. If we consider one module along the z-axis like this, then we can understand that the present embodiment has the two-floor periodicity along the z-axis. That is, to explain the characteristics of the cross-section of the present embodiment, it may be good enough to explain a set of Unit (k+1) and Unit (k). This may be like in FIG. 9.

Unit (k+1) is composed of cell gate CG (i, j, k+1), and upper select gate SGU (i, j, k+1) and lower select gate SGD (i, j, k+1), which vertically sandwich CG (i, j, k+1). SGU (i, j, k+1) may be applied with Vpass or Voff from the word line WUX (j, k+1) which is expanded along the x-direction. SGD (i, j, k+1) may be applied with Vpass or Voff from the word line WDY (i, k+1) which is expanded along the y-direction. CG (i, j, k+1) may be applied with Vread, Vpass or Voff from the word line WCX (j, k+1) which is expanded along the x-direction. By this way, the present embodiment has a similar characteristic to the first embodiment.

Unit (k) is composed of cell gate CG (i, j, k), and upper select gate SGU (i, j, k) and lower select gate SGD (i, j, k), which vertically sandwich CG (i, j, k). SGU (i, j, k) may be applied with Vpass or Voff from the word line WUY (i, k) which is expanded along the y-direction. SGD (i, j, k) may be applied with Vpass or Voff from the word line WDX (j, k) which is expanded along the x-direction. CG (i, j, k) may be applied with Vread, Vpass or Voff from the word line WCX (j, k) which is expanded along the x-direction. Like this, the present embodiment may have a similar characteristic to the first embodiment.

The z-direction module in FIG. 30, which has been adopted as an example for the illustration, is located at the XY-address (i, j) on the XY-plane. At this XY-address (i, j), a hole is dug along the z-axis direction, into which semiconductor materials, etc. are filled up to form a channel via. The semiconductor materials may be polysilicon, amorphous silicon, epitaxial silicon, and other semiconductor materials, etc.

Channel vias (CV) may be formed between bit line BLY (i, k+1) and BLX (j, k), between BLX (j, k) and BLY (i, k−1), and between BLY (i, k−1) and BLX (j, k−2), respectively. Bit lines are usually made of thin metal film. Thus, to avoid a defect caused by a Schottky junction at the junction to a channel via (Bit line contact, BL contact), a diffusion layer is necessary to be formed at the junction to bit line. In FIG. 30, a heavy n-type diffusion layer (N+ layer) is formed. The technology to form such a junction is general in semiconductor manufacturing. As an example, first, a hole is dug on the metal surface having been etched. Dopants may be involved into the chamber as approaching the metal film layer while filling up the semiconductor materials into the hole. After that, the anneal may be performed if necessary. For this aim, the distance between bit line and each unit must be wide enough.

Figure 31:
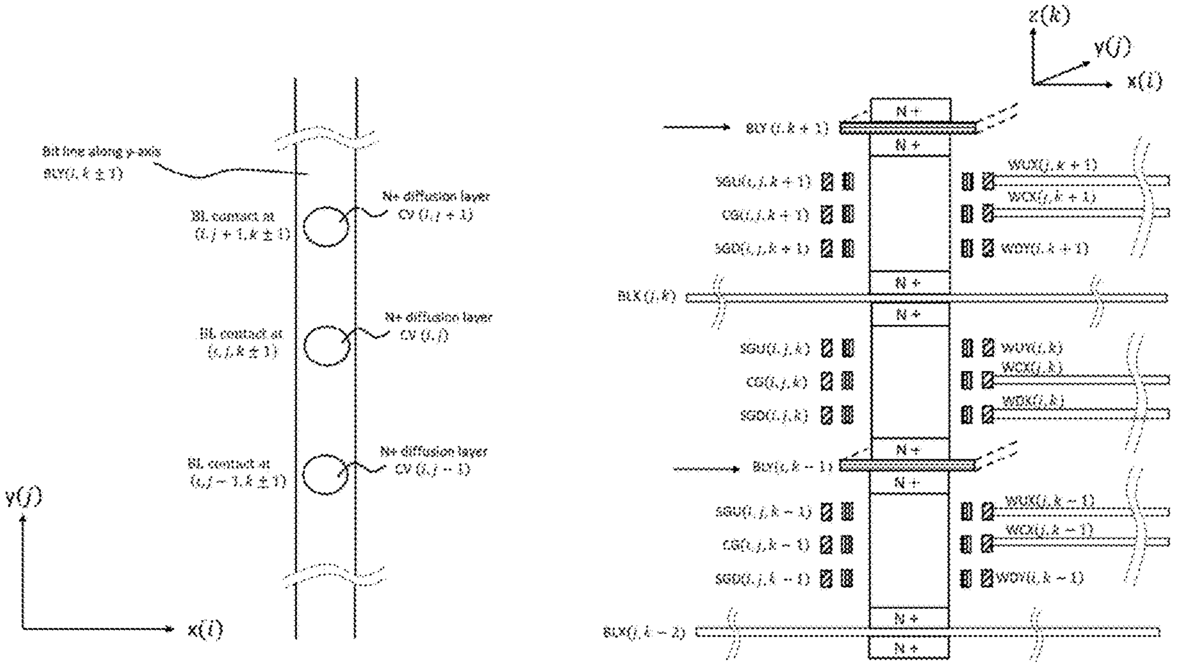
FIG. 31: a drawing to illustrate an example of top view (X-Y plane drawing) of the cross-section at a layer which includes BLY (i, k+1) or BLY (i, k−1).

FIG. 31 is the top view of the bit line BLY (i, k+1) and BLY (i, k−1), which are expanded along the y-direction. That is, it is the cross-sectional view cut out of at the layers with BLY (i, k+1) and BLY (i, k−1), parallel to the XY plane. The bit line width must be always wider than a hole (CV) which is dug to form a channel part even with considering manufacturing tolerances. Hence, a good enough margin is necessary for the gap between the bit line width and the size of CV. In FIG. 31, there are plural bit line contacts (BL contact) along the y-direction. As an example in the present embodiment, the N+ diffusion layer is formed in the CV.

Figure 32:
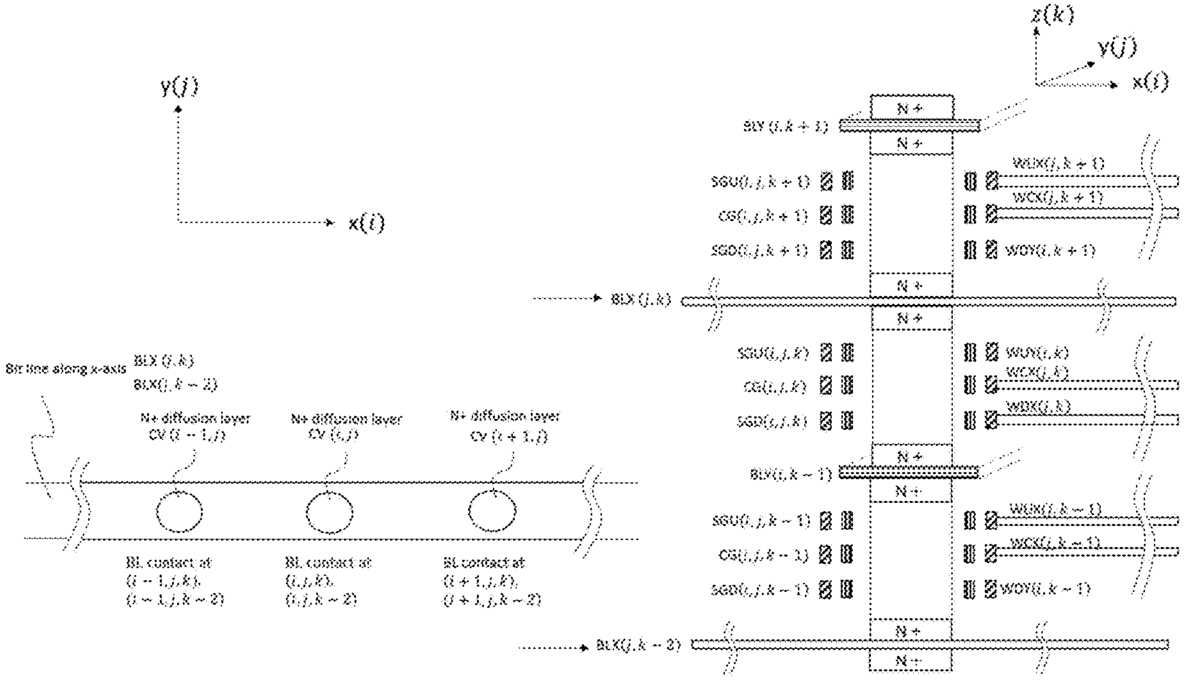
FIG. 32: a drawing to illustrate an example of top view (X-Y plane drawing) of the cross-section at a layer which includes BLX (j, k) or BLX (j, k−2).

FIG. 32 is the top view of the bit lines BLX (j, k) and BLX (j, k−2), which are expanded along the x-direction. That is, it is the cross-sectional view cut out of at the layers with BLX (j, k) and BLX (j, k−2), parallel to the XY plane. The bit line width must be always wider than a vertical hole (CV) which is dug to form a channel part even with considering manufacturing tolerances. Hence, a good enough margin is necessary for the gap between the bit line width and the size of CV. In FIG. 32, there are plural bit line contacts (BL contact) along the x-direction. As an example in the present embodiment, the N+ diffusion layer is formed in the CV.

Figure 33:
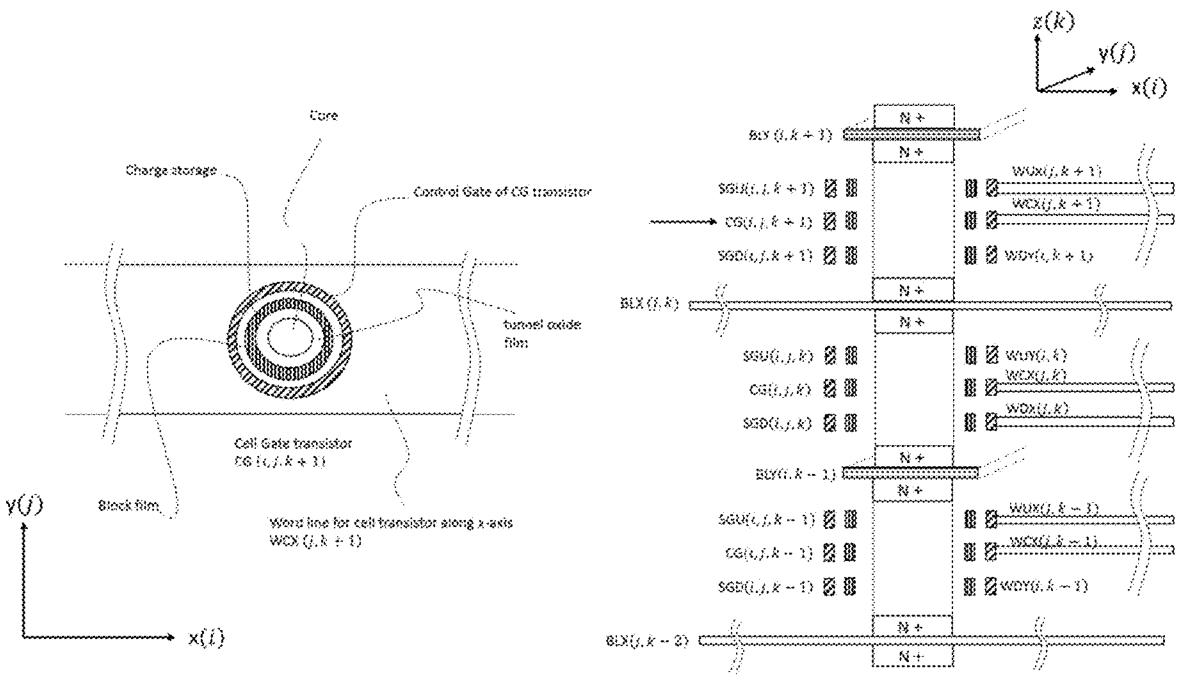
FIG. 33: a drawing to illustrate an example of top view (X-Y plane drawing) of the cross-section at a layer which includes CG (i, j, k+1).

FIG. 33 is the top view of the word line WCX (j, k+1) which is expanded along the x-direction and connected to the cell gate CG (i, j, k+1). That is, it is the cross-sectional view which was cut out at the layer with CG (i, j, k+1), parallel to the XY-plane. The bit line width must be always wider than a vertical hole (CV) which is dug to form a channel part even with considering manufacturing tolerances. Hence, a good enough margin is necessary for the gap between the bit line width and the size of CV.

The inside of channel via (CV) is, from the center, composed of core, tunnel oxide film (or simply tunnel oxide), charge storage layer, block film, control gate, etc. The core is the channel part which electric current flows when switch is on. It may be made of, as an example, polysilicon, etc. The tunnel oxide film is a thin film which electrons or holes can tunnel through by the quantum tunneling. It may be a thin film which is made of, as an example, silicon dioxide, etc. However, quantum tunneling has been referred to represent the Fowler-Nordheim tunneling (FN tunneling), the direct tunneling, etc. The charge storage layer can store electrons and holes which have transported through the tunnel oxide film from the core and can be made of a thin film of silicon-nitride, etc. Incidentally, it is called programing to store electrons or holes by quantum tunneling from the core to the charge storage layer. In contrast, it is called erase to extract electrons or holes from the charge storage layer to the core by quantum tunneling. The block film is for prohibiting the leakage of electrons or holes which have been stored in the charge storage layer to the control gate, and can be made of thicker insulating film of high dielectric oxide, etc. The reason that high dielectric is requested is to enhance the confinement effect by increasing thickness of block film. The control gate is connected to a word line to control the electric field that said word line applies the core. It may be made of a thin film of conductive materials like metal, etc. As illustrated in FIG. 33, it may be a thin cylindrical film (cylindrical conductive film).

Figure 34:
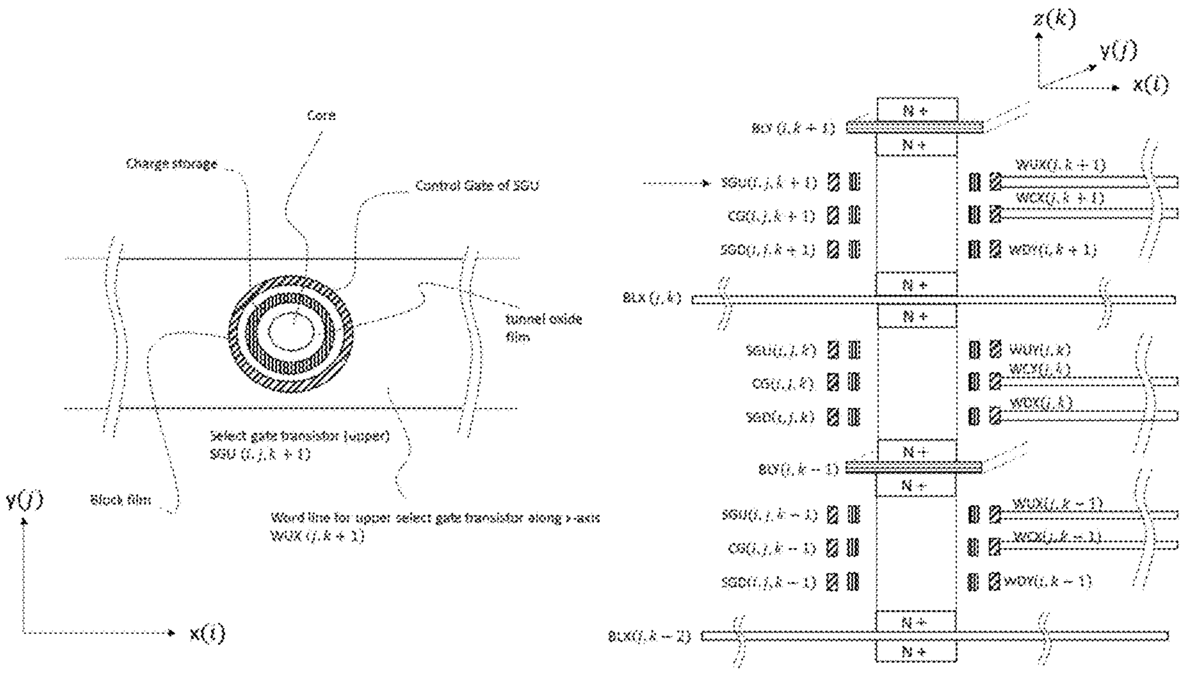
FIG. 34: a drawing to illustrate an example of top view (X-Y plane drawing) of the cross-section at a layer which includes SGU (i, j, k+1).

FIG. 34 is the top view of the word line WUX (j, k+1) which is expanded along the x-direction and connected to the select gate SGU (i, j, k+1). That is, it is the cross-sectional view which was cut out at the layer with SGU (i, j, k+1), parallel to the XY-plane. The word line width must be always wider than a vertical hole (CV) which is dug to form a channel part even with considering manufacturing tolerances. Hence, a good enough margin is necessary for the gap between the word line width and the size of CV. The inside of CV is like in FIG. 33 and then the explanation is omitted. However, even though the coaxial structure is the same, it may be preferable that the programming state of the charge storage layer has been controlled to tune Vt so that a predetermined output current (saturation current) can flow when Vpass is applied on the word line. As an example, it is preferable that Vt is always in the range of Vread in FIG. 12.

Figure 35:
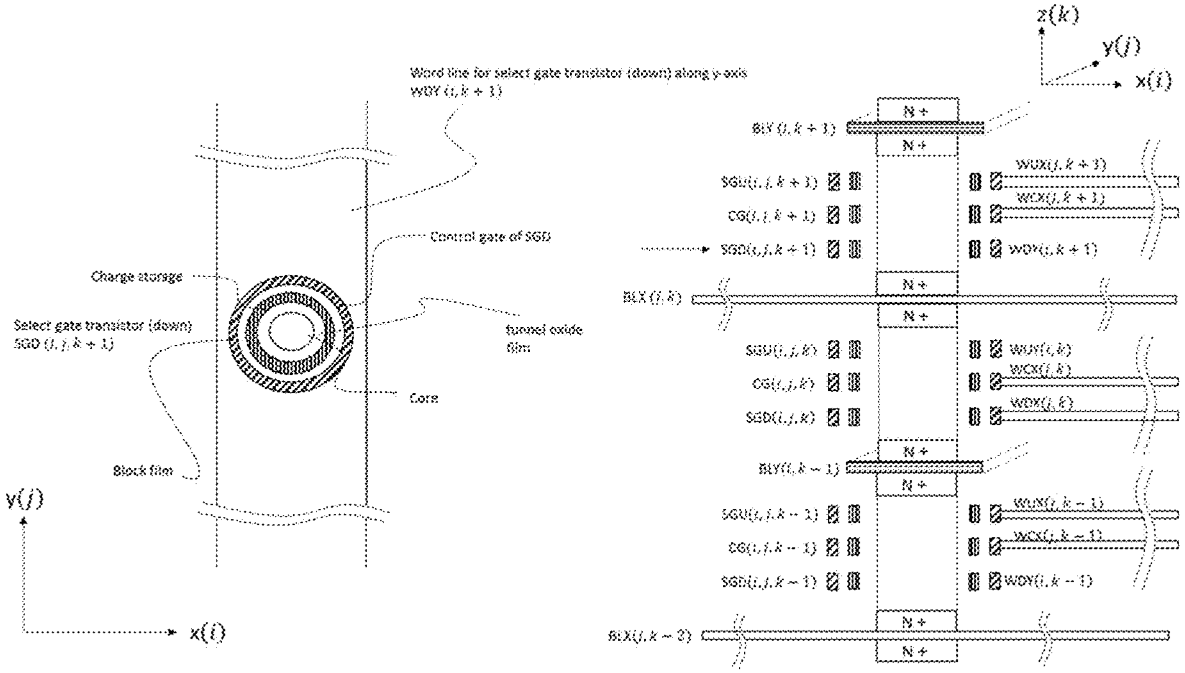
FIG. 35: a drawing to illustrate an example of top view (X-Y plane drawing) of the cross-section at a layer which includes SGD (i, j, k+1).

FIG. 35 is the top view of the word line WDY (i, k+1) which is expanded along the y-direction and connected to the select gate SGD (i, j, k+1). That is, it is the cross-sectional view which was cut out at the layer with SGD (i, j, k+1), parallel to the XY-plane. The word line width must be always wider than a vertical hole (CV) which is dug to form a channel part even with considering manufacturing tolerances. Hence, a good enough margin is necessary for the gap between the word line width and the size of CV. The inside of CV is like in FIG. 33 and then the explanation is omitted. However, even though the coaxial structure is the same, it may be preferable that the programming state of the charge storage layer has been controlled to tune Vt so that a predetermined output current (saturation current) can flow when Vpass is applied on the word line. As an example, it is preferable that Vt is always in the range of Vread in FIG. 12.

Figure 36:
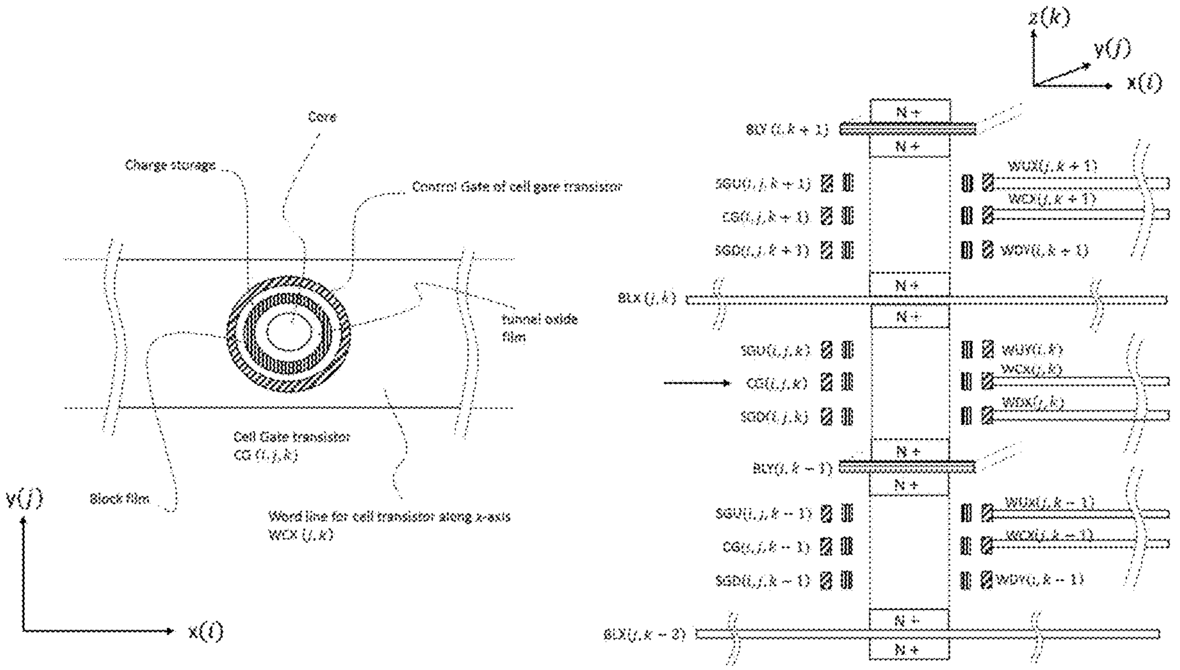
FIG. 36: a drawing to illustrate an example of top view (X-Y plane drawing) of the cross-section at a layer which includes CG (i, j, k).

FIG. 36 is the top view of the word line WCX (j, k) which is expanded along the x-direction and connected to the cell gate CG (i, j, k). That is, it is the cross-sectional view which was cut out at the layer with CG (i, j, k), parallel to the XY-plane. The word line width must be always wider than a vertical hole (CV) which is dug to form a channel part even with considering manufacturing tolerances. Hence, a good enough margin is necessary for the gap between the word line width and the size of CV. The inside of CV is like in FIG. 33 and then the explanation is omitted.

Figure 37:
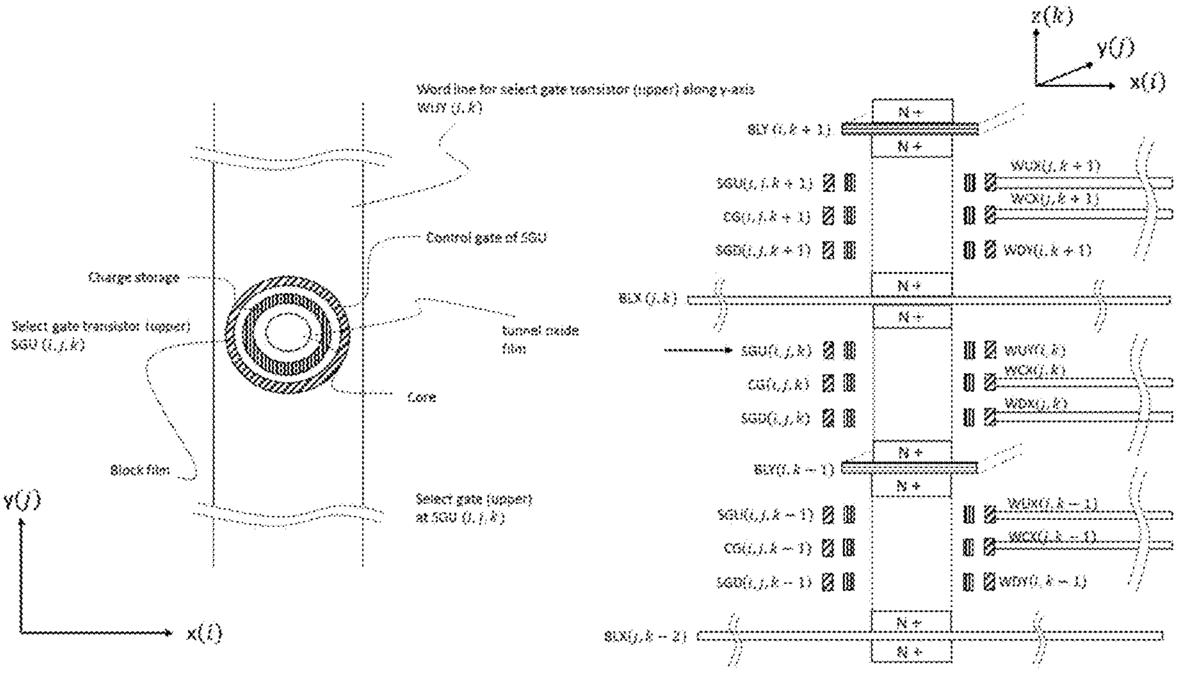
FIG. 37: a drawing to illustrate an example of top view (X-Y plane drawing) of the cross-section at a layer which includes SGU (i, j, k).
Figure 38:
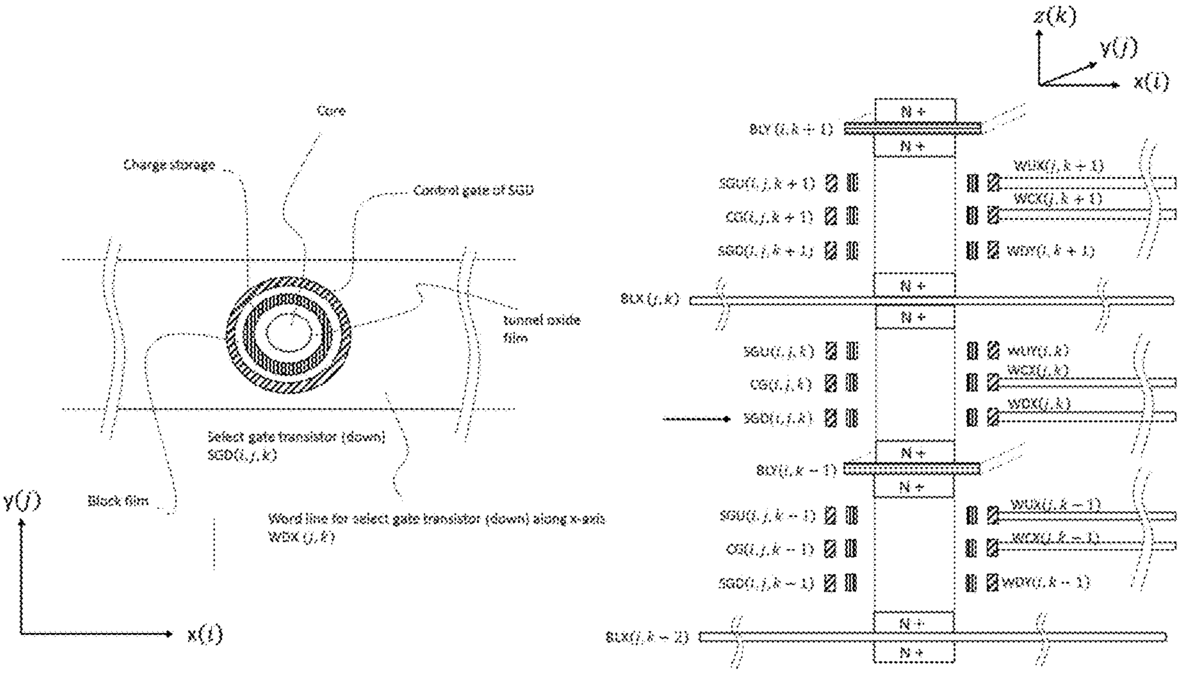
FIG. 38: a drawing to illustrate an example of top view (X-Y plane drawing) of the cross-section at a layer which includes SGD (i, j, k).

FIG. 37 is the top view of the word line WUY (i, k) which is expanded along the y-direction and connected to the upper select gate SGU (i, j, k). That is, it is the cross-sectional view which was cut out at the layer with SGU (i, j, k), parallel to the XY-plane. The word line width must be always wider than a vertical hole (CV) which is dug to form a channel part even with considering manufacturing tolerances. Hence, a good enough margin is necessary for the gap between the word line width and the size of CV. The inside of CV is like in FIG. 33 and then the explanation is omitted. However, even though the coaxial structure is the same, it may be preferable that the programming state of the charge storage layer has been controlled to tune Vt so that a predetermined output current (saturation current) can flow when Vpass is applied on the word line. As an example, it is preferable that Vt is always in the range of Vread in FIG. 12. The explanation of FIG. 38 is almost the same as that of FIG. 35 and then the explanation is omitted.

Figure 39:
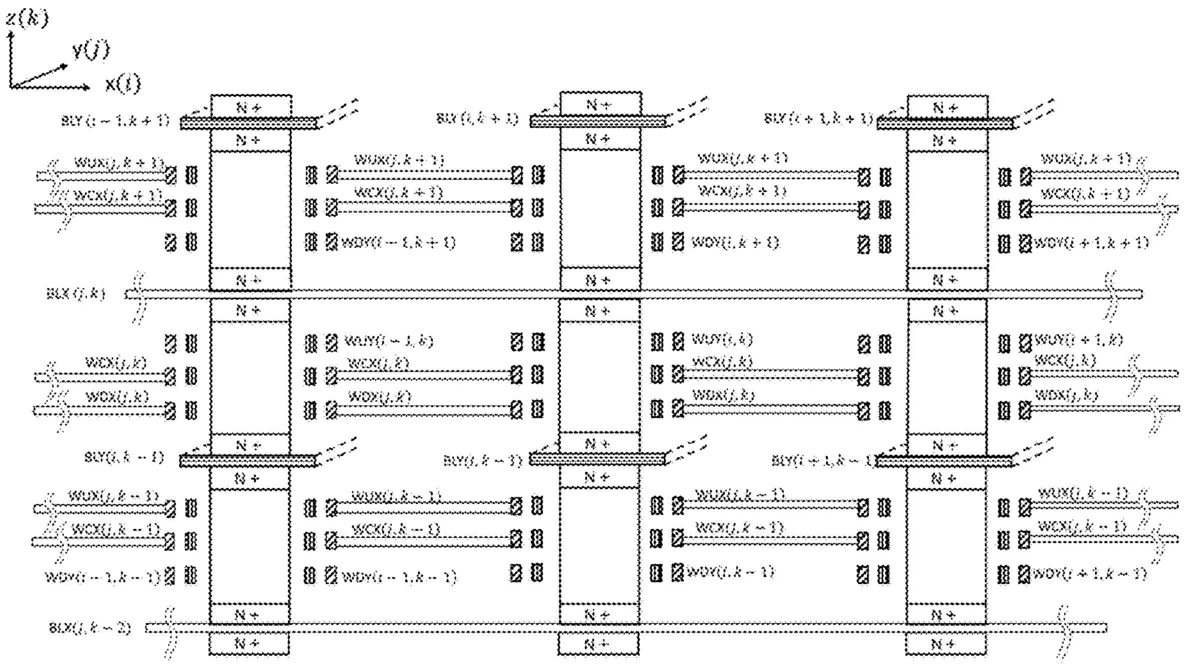
FIG. 39: a drawing to illustrate an example of the cross-section wherein three modules are arrayed along the x-direction.

As mentioned above, the cross-sectional view of the z-directed one module in the zx-plane can be explained. FIG. 39 is an example of the case where there are three z-directed modules along the x-axis. FIG. 10 is an example of the equivalent circuit corresponding to FIG. 39.

Figure 40:
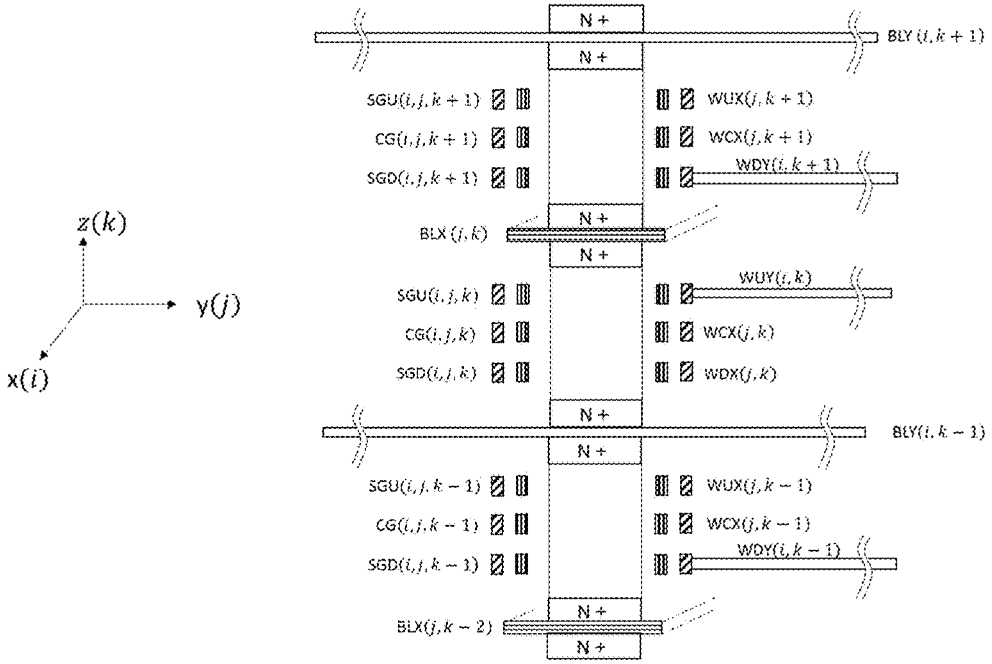
FIG. 40: a drawing to illustrate an example of the cross-section wherein one module is expanded along the y-direction.

FIG. 40 is a cross-section of a z-directed module located at the yz-address (j, k) on the zy-plane. FIG. 30 is just the cross-section of the same module on the zx-plane. The explanation is like that of FIGS. 30-38, and then omitted.

Figure 41:
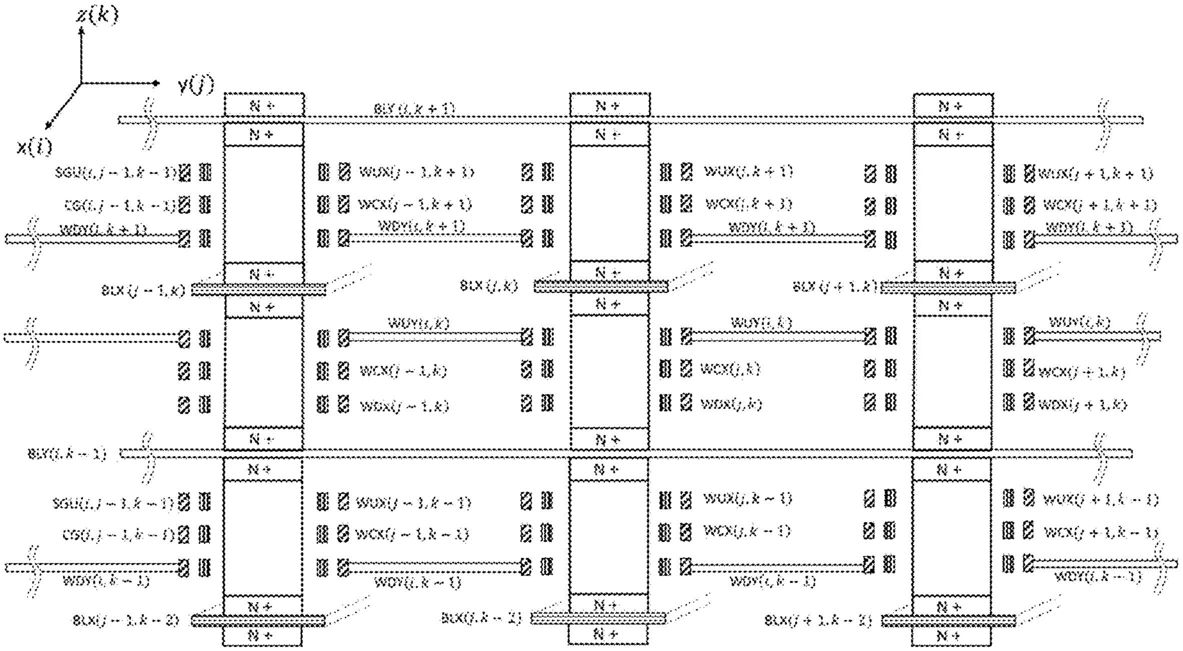
FIG. 41: a drawing to illustrate an example of the cross-section wherein three modules are arrayed along the y-direction.

In FIG. 41, there are three z-directed modules of FIG. 40 along the y-axis direction. FIG. 11 is an example of the equivalent circuit which corresponds to FIG. 41.

Figure 42:
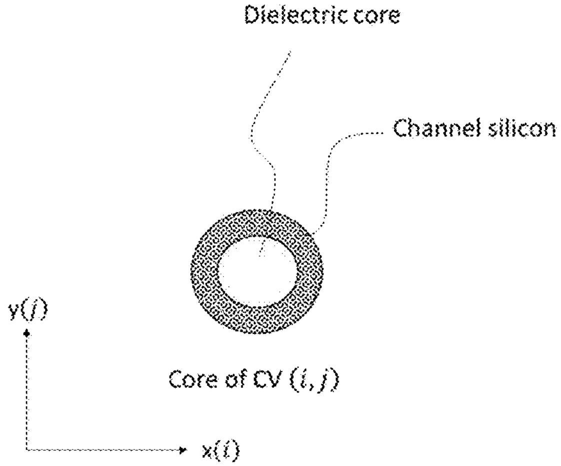
FIG. 42: a drawing to illustrate an example of the inner structure of the core.

FIG. 42 is a drawing to illustrate an example of the inner structure of the core that was explained in FIGS. 33-38. As mentioned above, the core is lapped by the tunnel oxide film, the charge storage layer, the block film, and the control gate. However, it may be possible to replace tunnel oxide film with another tunnel film.

As an example, said core can be further divided into dielectric core and channel silicon from the center. The dielectric core is made of components of dielectrics or insulators. The channel silicon is made of components of silicon, amorphous silicon, or polysilicon, etc. and is a part through which electric current flows as the channel part of the cell when the switch is on. When the channel silicon is polysilicon, such a structure is required to make the average grain size in the channel silicon smaller to suppress fluctuation of current flowing through the channel silicon. Moreover, said core is shared with at least three cells connected in series along the z-direction. Said channel silicon is the channel part shared by three cells connected in series along the z-direction. Accordingly, when the current flows through said channel part, the current flows throughout said three cells connected in series.

(Sixth embodiment) In general, the channel via of three-dimensional (3D) NAND flash can be fabricated using the gate-last method. (See non-patent document 4.) However, the device structure of the present invention has the two-floor periodicity, as mentioned above. To fabricate the two-floor periodicity along the z-direction, which is characteristic in the present invention, a fabrication method, which is different from the general gate-last method, is necessary.

First, let us start to illustrate a general gate-last method, before explaining the characteristics of the present invention.

Figure 43:
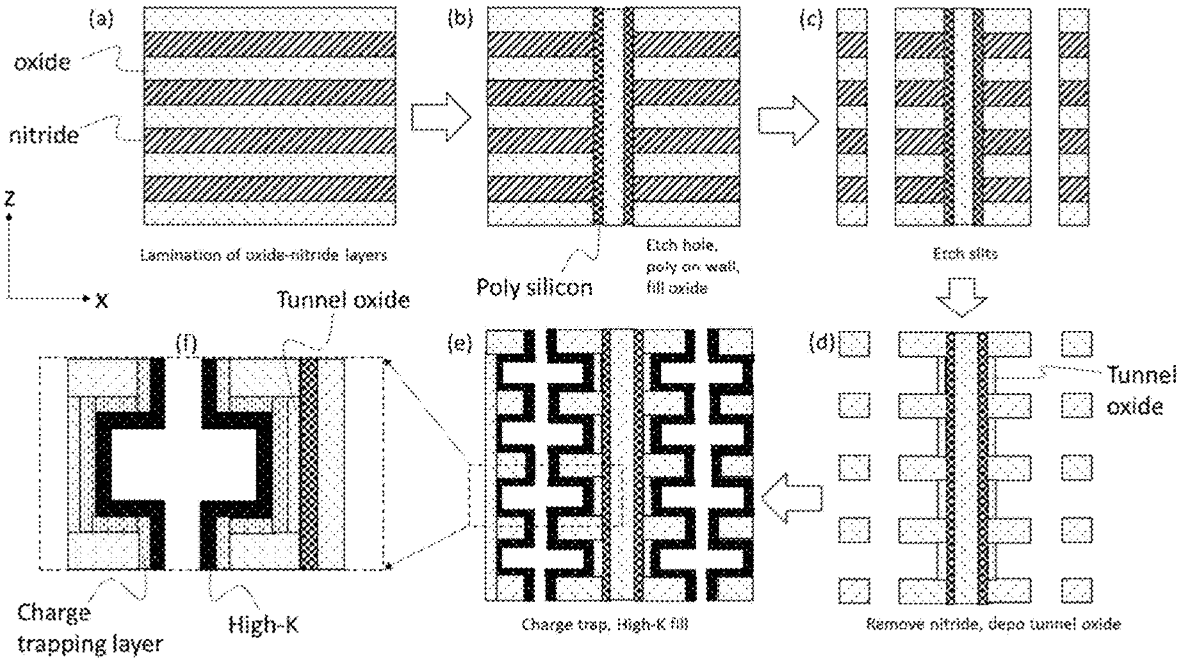
FIG. 43: a drawing to illustrate a general gate-last method.
Figure 44:
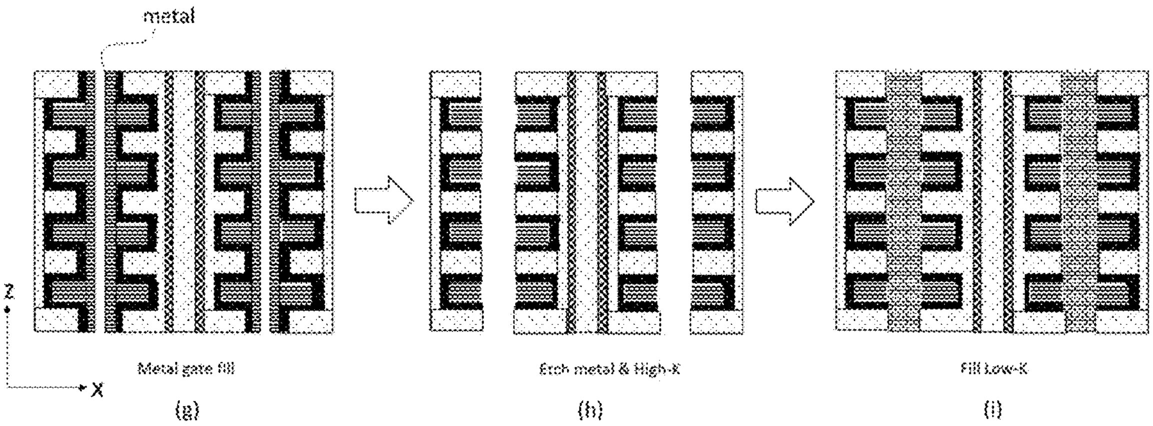
FIG. 44: a drawing to illustrate a general gate-last method.

FIGS. 43 and 44 are the drawings to simply illustrate the general gate-last method.

First, as illustrated in (a) of the figure, the oxide and nitride are alternatively stacked along the z-direction (vertical in the figure). The horizontal axis in the figure is assumed to be the x-direction. Subsequently, as illustrated in (b), a vertical hole is dug to penetrate the stacked oxides and nitrides (Etch hole). After covering the sidewall by polysilicon (poly on wall), the oxide film is filled into the hole (fill oxide). Subsequently, a slit is dug at a different location from the vertical hole (Etch slit). The slit is expanded along the y-direction. Though the angle that the x-axis and the y-axis cross may be an arbitral angle other than 180 degree or zero degree, it may be possible to maximize the integration of vertical holes on the xy-plane.

Next, the gas is injected to remove the nitrides from the slit (remove nitride) and then deposits tunnel oxide. Subsequently, after forming charge trapping layer, high-dielectric film (High-K) is applied. Then, the cross-section shown in (e) can be obtained. However, to clarify the charge trapping layer, which was difficult to illustrate due to the want of space, the part enclosed by the dotted line was expanded in (f). By this way, the charge storage layer (i.e., charge trapping layer) was formed like sandwiched between the tunnel oxide and the high dielectric film.

Furthermore, as shown in (g), the metal gate is formed (metal gate fill). Then, as shown in (h), a part of the metal gate and the high dielectric film are etched to be removed (Etch metal & high-K). By this way, as shown in (i), the hole is to be filled with a low dielectric film (fill low-K).

The gate-last method can be, in general, used to fabricate three-dimensional NAND flash. In the cross-section (i), the poly on wall, which is expanded vertically (along the z-axis), is a channel which carriers can transport through. This channel is like a cylindrical shell with the core being the deposited oxide in (b), and was formed in a structure, wherein it is further lapped by the tunnel oxide, the charge trapping layer, the high dielectric film, and the metal gate in turn. Accordingly, the metal gate is in the shape of a circle-shell (doughnut-shaped). Each metal gate corresponds to a cell (or memory cell). In this cross section, four metal gates share a channel which are vertically expanded. That is, plural gates, which are stacked vertically, are connected in series. This is a characteristic of three-dimensional NAND. In the present invention, three cells vertically connected in series form one unit. One of them, the located upper, is used as upper select gate (SGU), the center as cell gate (CG), and the lower as lower select gate (SGD). Another characteristic of the present invention is the top of each unit is connected to one of BLX and BLY, and the bottom is connected to the other.

However, as shown in FIG. 9, in the present invention, the bit line BLX, which is expanded along the x-direction, and the bit line BLY, which is expanded along the y-direction, are alternatively stretched around. Such a characteristic cannot be seen in the conventional three-dimensional NAND flash.

For example, in FIG. 9, six gates are connected in series between two BLXs (BLX (j, k−2) and BLX (j, k)). Those gates are, from the bottom, SGD (i, j, k−1), CG (i, j, k−1), SGU (i, j, k−1), SGD (i, j, k), CG (i, j, k), and SGU (i, j, k). SGU (i, j, k−1) and SGD (i, j, k) are connected via BLY (i, k−1).

WDY (i, k−1) connected to the gate electrode (or metal gate) of SGD (i, j, k−1) is expanded along the y-direction. WCX (j, k−1) connected to the gate electrode (or metal gate) of CG (i, j, k−1) is expanded along the x-direction. WUX (j, k−1) connected to the gate electrode (or metal gate) of SGU (i, j, k−1) is expanded along the x-direction.

WDX (j, k) connected to the gate electrode (or metal gate) of SGD (i, j, k) is expanded along the x-direction. WCX (j, k) connected to the gate electrode (or metal gate) of CG (i, j, k) is expanded along the x-direction. WUY (i, k) connected to the gate electrode (or metal gate) of SGU (i, j, k) is expanded along the y-direction.

That is, in the present invention, the directions of the word lines periodically changes as one y-direction (WDY (i, k−1)) and two x-directions (WCX (j, k−1), WUX (j, k−1)) below BLY (i, k−1), and two x-directions (WDX (j, k), WCX (j, k)) and one y-direction (WUY (i, k)) above BLY (i, k−1).

In FIG. 43 (*c*), since the slit was formed only along the y-direction, the conventional gate-last method cannot separately fabricate the word lines periodically along the x-direction and the y-direction like the present invention.

The fabrication method of the present invention is illustrated using drawings below.

Figure 45:
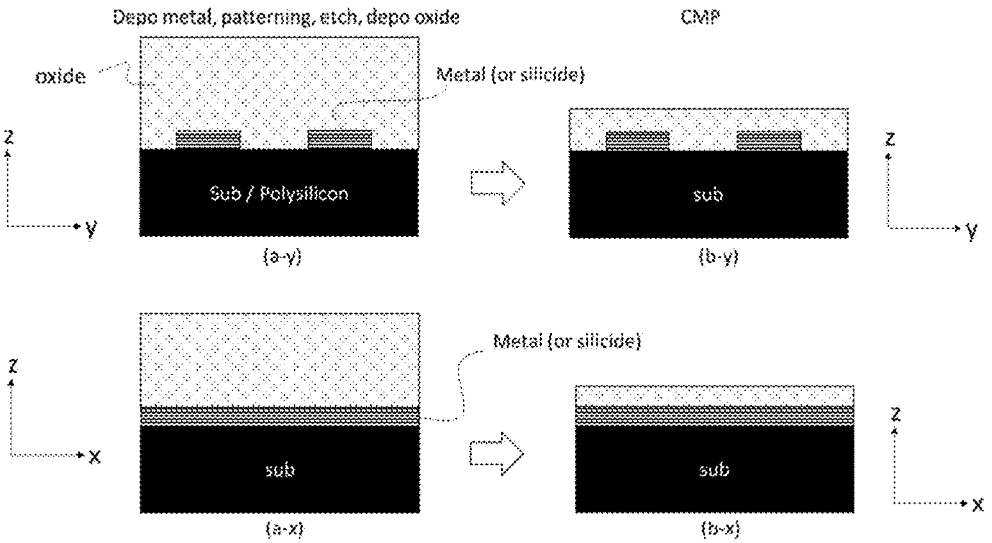
FIG. 45: a drawing to illustrate an example of the patterning of metal to be bit lines.

In FIG. 45, the metal patterning on the substrate, in which metals will become bit lines, is illustrated.

First, metal film (or simply metal) is deposited (depo metal) and then the metal film is patterned (patterning). In this figure, as an example, the patterning of bit line BLX expanded along the x-direction is adopted to illustrate the method. Exchanging the x-direction and the y-direction, it can be the explanation of the patterning of bit line BLY expanded along the y-direction.

Oxide is deposited after the patterning (depo oxide). (a-y) is a cross-section on the z-y plane, and (a-x) is a cross-section on the z-x plane. A Bit line BLX expanded along the x-direction has been formed by the patterning. Usually, after this, the surface of the deposited oxide is made flat by using chemical physical process (CMP). However, the deposited oxide is also thinned by polishing. It is necessary to tune thickness of oxide film to be deposited considering thickness reduction by CMP. (b-y) is a cross-section on the z-y plane. (b-x) is a cross-section on the z-x plane.

Figure 46:
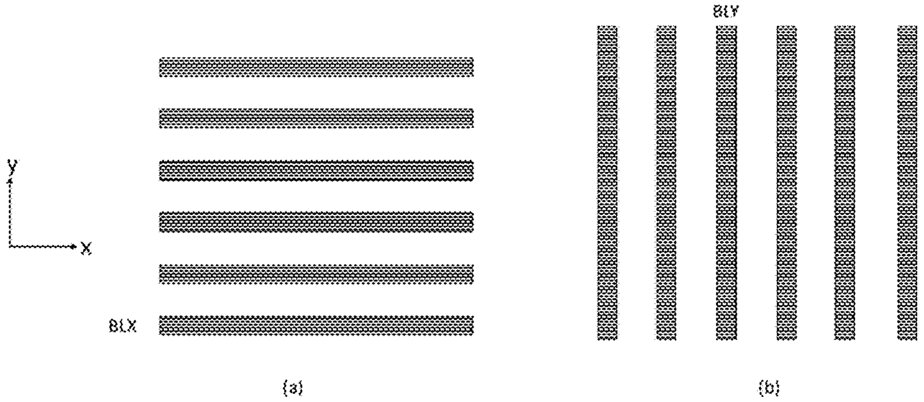
FIG. 46: a drawing to illustrate the top view (X-Y plane) after the patterning of metal to be bit lines. (a) is the case wherein the patterning was made so that bit lines are expanded along the x-direction. (b) is the case wherein the patterning was made so that bit lines are expanded along the y-direction.

FIG. 46 is the top view (on the x-y plane). (a) illustrates the case where the patterning was performed so that the bit lines are expanded along the x-direction, which corresponds to the case explained in FIG. 45. (b) is the case where the patterning was performed so that the bit lines are expanded along the y-direction. The direction of the patterning can be freely selected along the x-direction or along the y-direction.

In FIG. 45, as an example, the bit line patterning was illustrated assuming the case where metals are patterned on a substrate (Sub) such as silicon substrate, etc. However, the surface of the substrate may not always be flat. The metal film deposited on the substrate surface having been patterned as needed may be patterned. Or the patterning of deposited metal films may be performed on polysilicon which has been patterned conveniently. Anyway, as illustrated in FIG. 46, it may be necessary to a-purpose pattern metal films along the x-direction or along the y-direction. Furthermore, as necessary, as illustrated using (b-y) and (b-x) in FIG. 45, it may be preferable to deposit metal film and then to make its surface flat using CMP and so forth after the metal patterning. Or taking into consideration the compatibility with silicon or polysilicon, it may be preferable that metal film is silicide.

FIGS. 47-60 are to illustrate the fabrication process to form an example of the characteristic of the present invention on the metal film having been patterned expanding along the x-direction.

Figure 47:
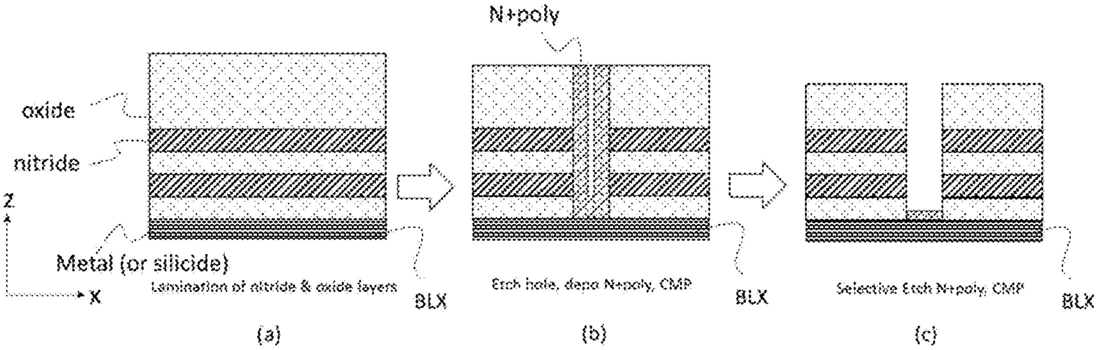
FIG. 47: a drawing to illustrate an example of the fabrication process to form a unit having a characteristic of the present invention on the metal film having been patterned to be expanded along the x-direction.

FIG. 47 (*a*) is a cross-sectional view wherein nitride, oxide, nitride, and oxide are laminated on the flattened deposited oxide lapping metal film (Metal) using CMP and so forth. However, the metal film is, as an example, patterned to expand along the x-direction so that it can be a bit line BLX expanded along the x-direction. This corresponds to FIG. 46 (*a*). The metal film may also be silicide. It is common with the gate-last method that a part of nitride will become a gate later. That is, in this example, two cells are connected in series along the z-direction (vertical direction). If the number of nitride layers is one, then only one cell can be fabricated along the z-direction. If the number of nitride layers is three, then three cells can be fabricated along the z-direction. That is, the number of nitride layers to be laminated can determine the number of cells connected in series along the z-direction. Here, as an example, two cells are connected in series along the z-direction.

Subsequently, in (b), a vertical hole is dug (Etch hole), N+ type polysilicon (N+poly) is deposited, and then its surface is flattened using CMP method, etc. In (c), N+polysilicon is selectively etched and then flattened using CMP, etc. The N+polysilicon, which remains at the bottom of the vertical hole, turns out to be a contact to BLX.

Figure 48:
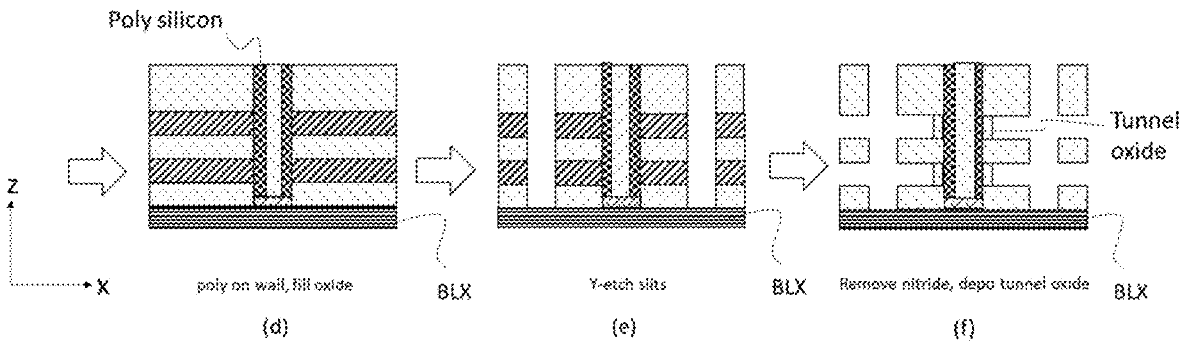
FIG. 48: a drawing to illustrate an example of the fabrication process to form a unit having a characteristic of the present invention on the metal film having been patterned to be expanded along the x-direction.

In FIG. 48 (*d*), the side wall of the vertical hole is covered with polysilicon (poly on wall), oxide is deposited to fill the hole. In (e), the slits are formed (by notching the laminated films) along the y-direction (Y-etch slits). In (f), etching gas is injected from the slits to selectively remove only nitrides. After that, tunnel oxide is deposited.

Figure 49:
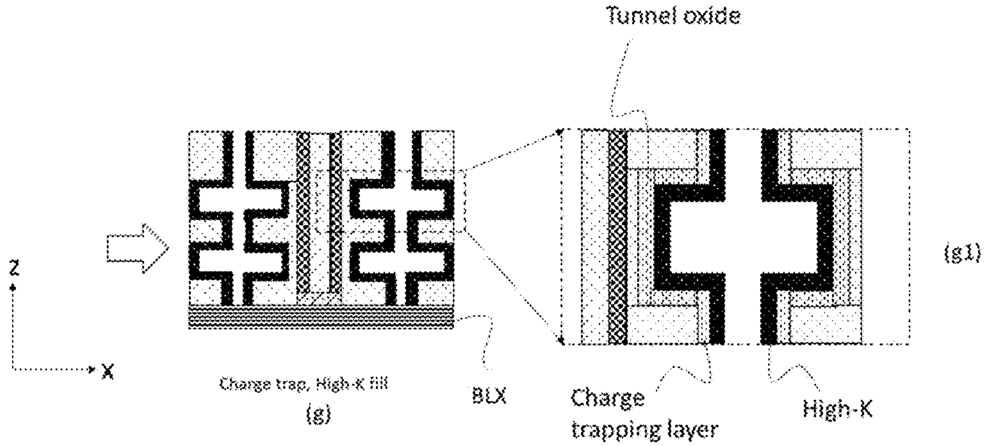
FIG. 49: a drawing to illustrate an example of the fabrication process to form a unit having a characteristic of the present invention on the metal film having been patterned to be expanded along the x-direction.

In FIG. 49 (*a*), the high dielectric film (High-K) is formed after forming the charge trapping layer on the side wall. The portion enclosed by the dotted line is zoomed in to be (g1), wherein the charge trapping layer is sandwiched by the tunnel oxide and the high dielectric film.

Figure 50:
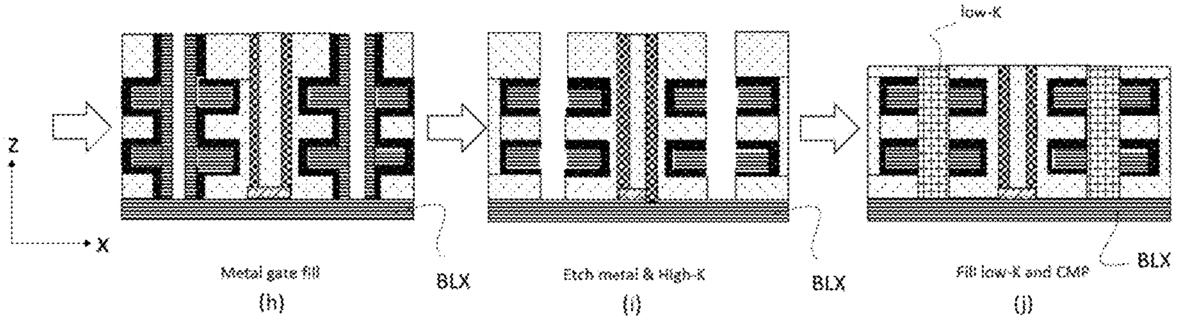
FIG. 50: a drawing to illustrate an example of the fabrication process to form a unit having a characteristic of the present invention on the metal film having been patterned to be expanded along the x-direction.

In FIG. 50 (*h*), the slits are covered by metal to make the metal gate there (metal fill). In (i), a part of the metal and the high dielectric film is removed (Etch metal & high). And the surface is flattened using the CMP and so forth after the low dielectric films are deposited into the slits (fill low-K).

Figure 51:
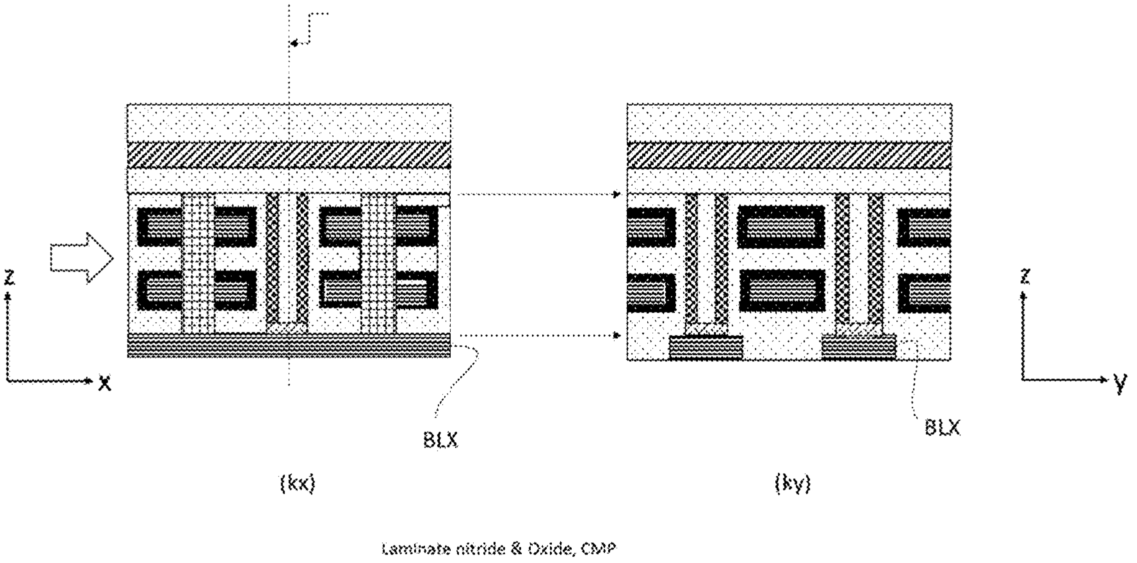
FIG. 51: a drawing to illustrate an example of the fabrication process to form a unit having a characteristic of the present invention on the metal film having been patterned to be expanded along the x-direction.

In FIG. 51, oxide, nitride, and oxide are further laminated thereon (laminate). Since the number of nitride layers which will form a gate is one later, as an example, one cell is added along the vertical axis here. (kx) is a cross-sectional view on the z-x plane. (ky) is a cross-sectional view on the z-y plane.

Figure 52:
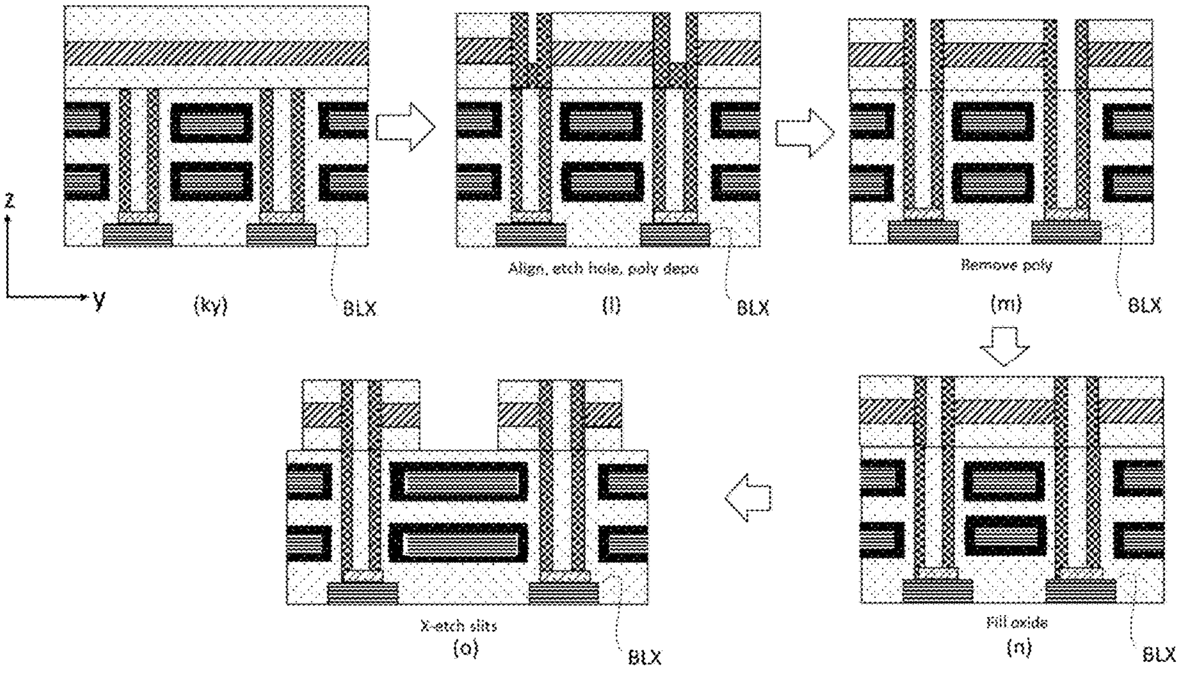
FIG. 52: a drawing to illustrate an example of the fabrication process to form a unit having a characteristic of the present invention on the metal film having been patterned to be expanded along the x-direction.

The illustration of FIG. 52 starts with (ky) in FIG. 51. That is, the illustration is to be continued by moving the z-y cross-section. In (1), a vertical hole is dug on the oxide having been laminated first in FIG. 51 (etch hole). In this, the locations of the vertical holes on the x-y plane should be aligned with the locations of the vertical holes having been dug in FIG. 47 as possible (align). After that, the polysilicon is deposited. Furthermore, it is preferable to flatten the surface using CMP, etc.

In (m), the polysilicon is partially removed leaving only the side wall (remove poly). In (n), the oxide is deposited to fill the hole. And then in (o), the slit is formed along the x-direction (X-etch slits). Like this, it is a characteristic of the present invention that the slits are formed by repeatedly replacing the x-direction and the y-direction.

In 53 (*p*), gas is injected from the slit to selectively remove nitride (remove nitride). Subsequently, tunnel oxide is deposited. Then, after forming the charge trapping layer, high dielectric film is covered (high-K fill). In (p1), by zooming in the portion enveloped by the dotted line, we can see that the charge storage layer (or charge trapping layer) is sandwiched by tunnel oxide and high dielectric film.

Figure 53:
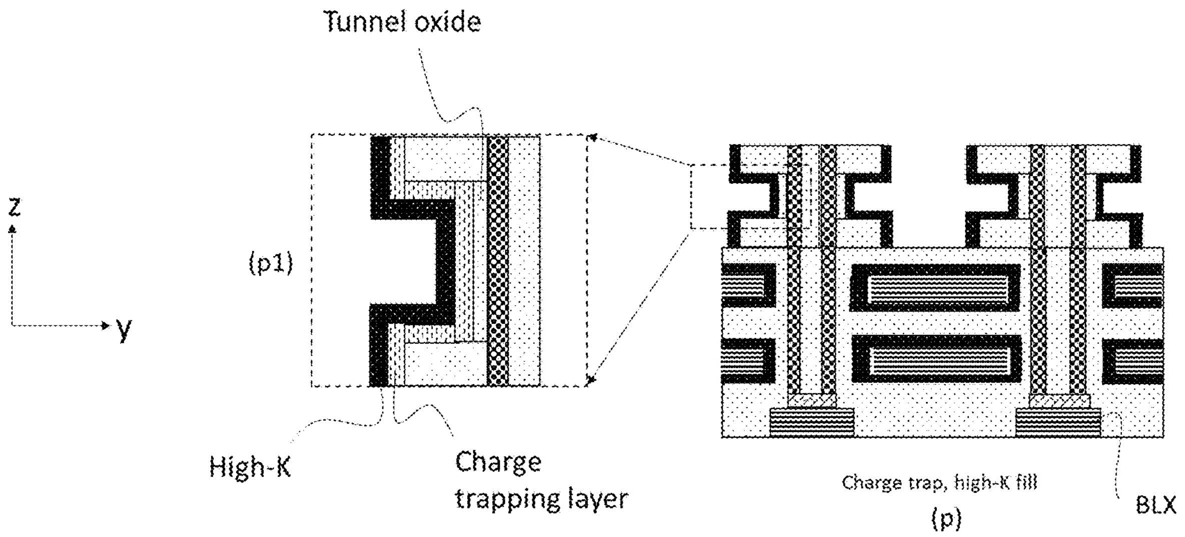
FIG. 53: a drawing to illustrate an example of the fabrication process to form a unit having a characteristic of the present invention on the metal film having been patterned to be expanded along the x-direction.
Figure 54:
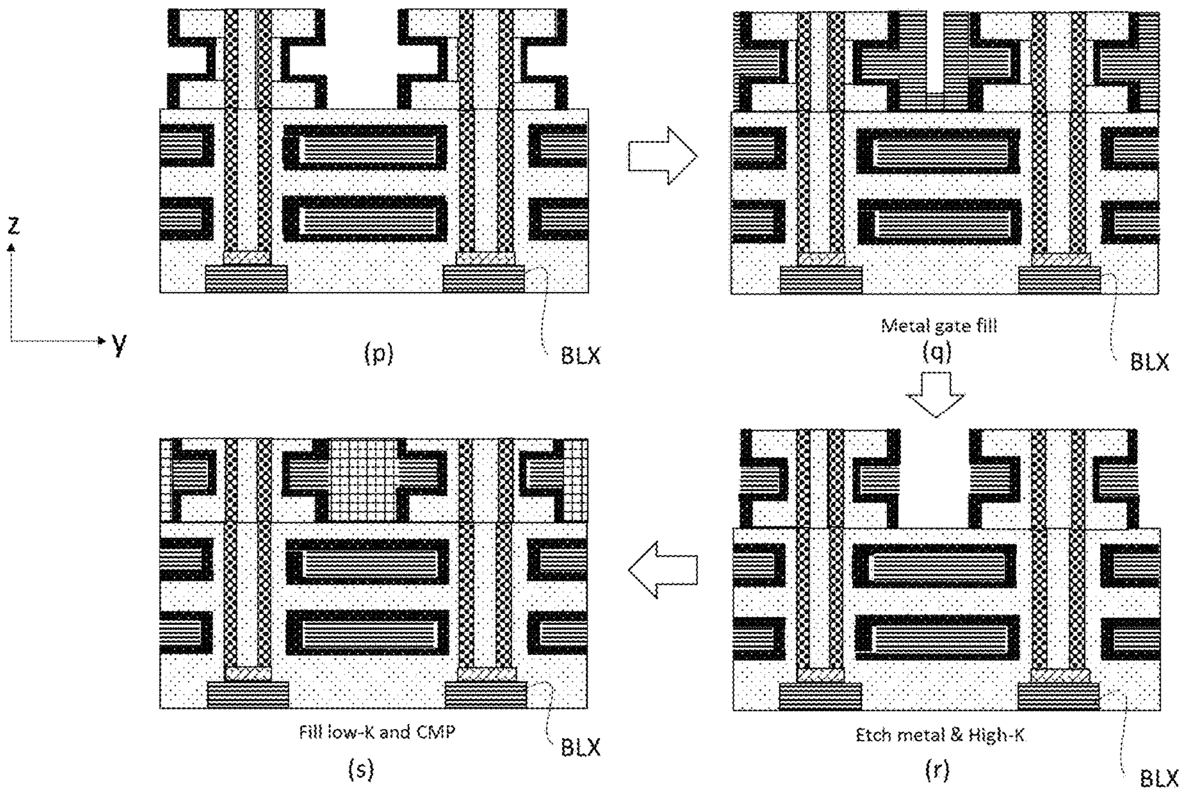
FIG. 54: a drawing to illustrate an example of the fabrication process to form a unit having a characteristic of the present invention on the metal film having been patterned to be expanded along the x-direction.

The illustration of FIG. 54 starts with (p) in FIG. 53. In (q), the slits are filled with metal (film) to become metal gate later. In (r), a part of metal and high dielectric films are removed leaving only the part to become metal gate (etch metal & high-K). In(s), low dielectric film is deposited into the slits and then the surface is flattened using CMP, etc.

Figure 55:
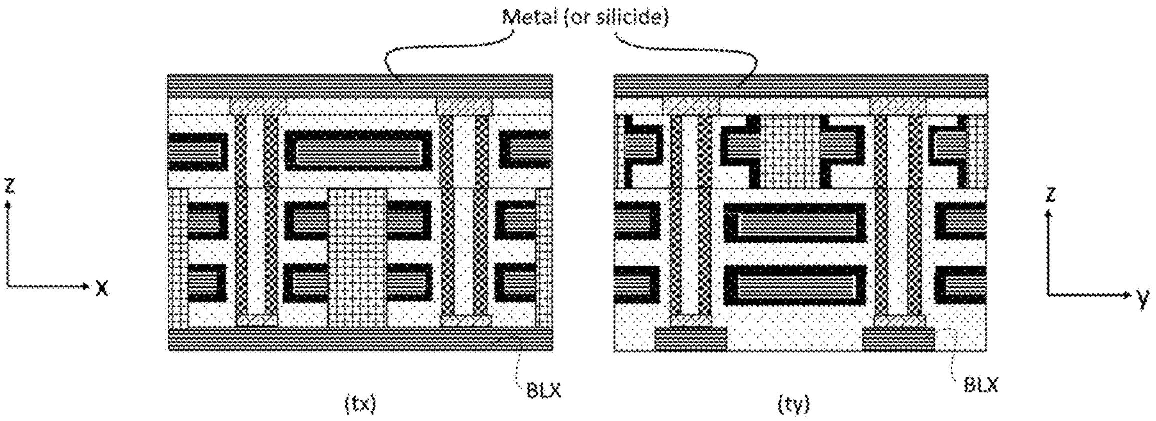
FIG. 55: a drawing to illustrate an example of the fabrication process to form a unit having a characteristic of the present invention on the metal film having been patterned to be expanded along the x-direction.

In FIG. 55, N+polysilicon is patterned, which will become a contact to the y-direction bit line BLY later. In concrete, by patterning the resist to be aligned to the vertical holes, the N+polysilicon is deposited therein (align, resist patterning, N+poly depo). After flattening the surface using CMP, etc., the resist is removed and then oxide is deposited and the surface is flattened using CMP, etc. Then, metal film is deposited to become BLY later. Furthermore, it is preferable to flatten the surface using CMP, etc. (tx) is the cross-sectional view on the z-x plane. (ty) is the cross-sectional view on the z-y plane.

Figure 56:
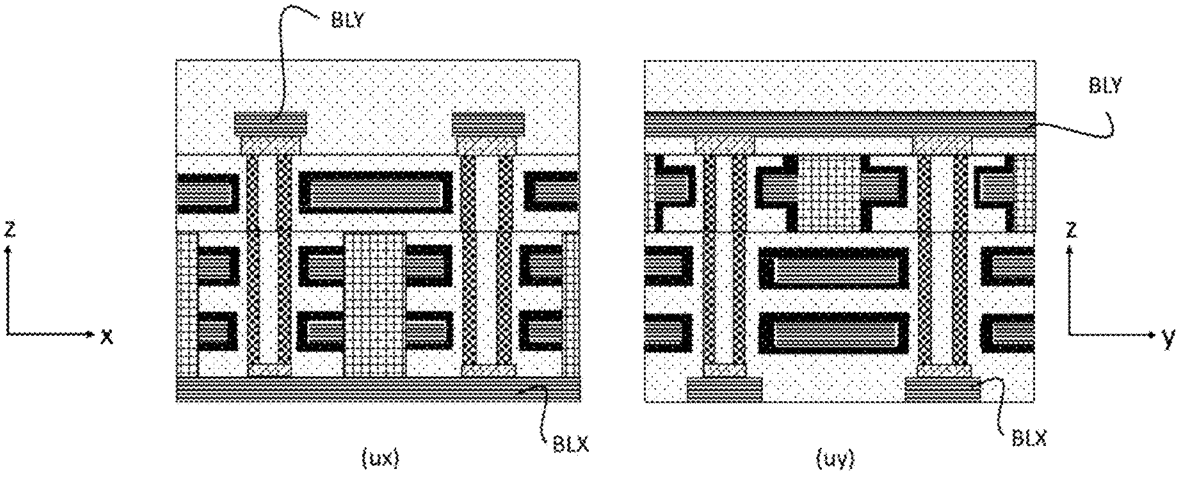
FIG. 56: a drawing to illustrate an example of the fabrication process to form a unit having a characteristic of the present invention on the metal film having been patterned to be expanded along the x-direction.

Subsequently, in FIG. 56, the resist deposited on the metal film is patterned. Then, after etching the metal, low dielectric film is filled into the gap (metal patterning or subtractive method). After that, oxide is deposited and then the surface is flattened using CMP, etc. (ux) is the cross-sectional view on the z-x plane. (uy) is the cross-sectional view on the z-y plane. However, the metal patterning may be replaced with damascene process, etc.

Anyway, like this, the y-direction bit line BLY is formed. In this example, three gates are connected in series between BLX and BLY from the bottom. One unit is composed of one cell sandwiched by the other two cells. Both ends of the channel vertically expanded are contacted to N+polysilicon. There is BLX below the bottom N+polysilicon. There is BLY above the top N+polysilicon. The three metal gates are respectively three word-lines. The bottom two word-lines are expanded along the y-direction. The top word line is expanded along the x-direction.

Figure 57:
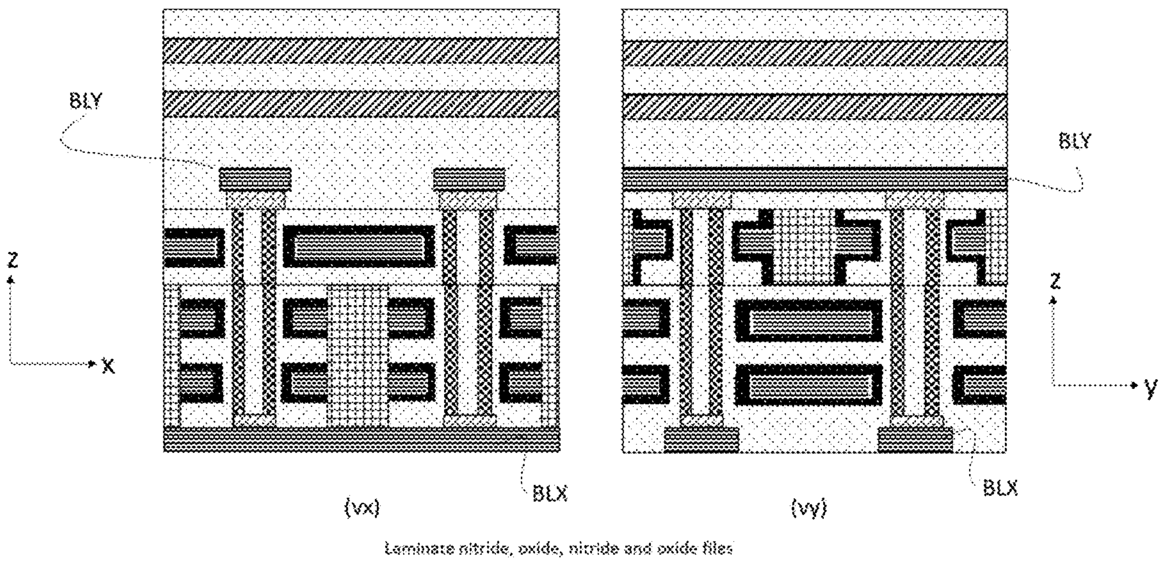
FIG. 57: a drawing to illustrate an example of the fabrication process to form a unit having a characteristic of the present invention on the metal film having been patterned to be expanded along the x-direction.

In FIG. 57, furthermore above, nitride, oxide, nitride, and oxide are laminated layer-by-layer. Here note that the number of cells, which are stacked, is two because the number of nitride layers is two. (vx) is a cross-sectional view on the z-x plane. (vy) is a cross-sectional view on the z-y plane.

Figure 58:
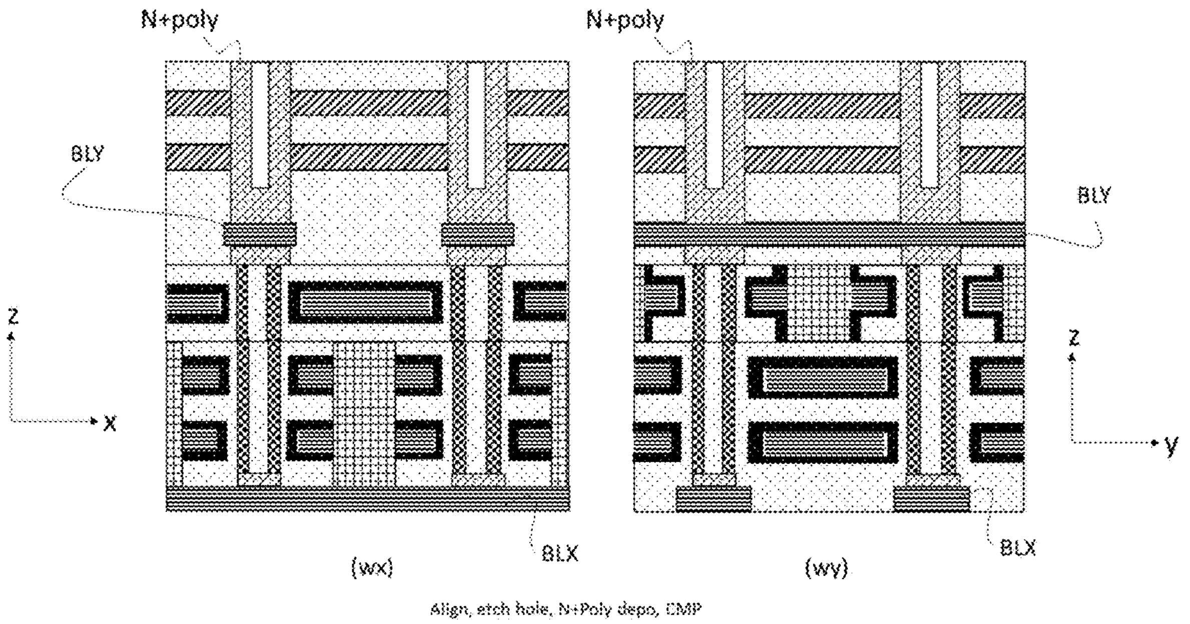
FIG. 58: a drawing to illustrate an example of the fabrication process to form a unit having a characteristic of the present invention on the metal film having been patterned to be expanded along the x-direction.

In FIG. 58, a vertical hole is dug in the oxide-nitride laminated layers (etch hole) with aligning the hole locations to the location of the contacts below BLY (N+polysilicon). Subsequently, N+polysilicon is deposited (N+poly depo), and then the surface is flattened using CMP, etc. (wx) is a cross-sectional view on the z-x plane. (wy) is a cross-sectional view on the z-y plane.

Figure 59:
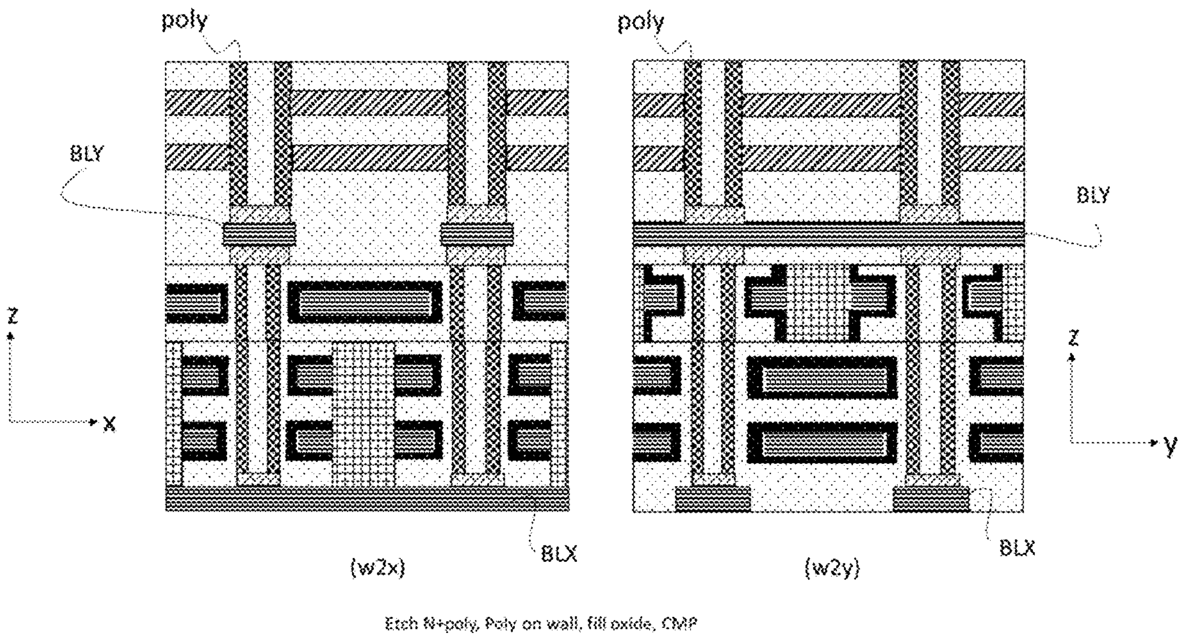
FIG. 59: a drawing to illustrate an example of the fabrication process to form a unit having a characteristic of the present invention on the metal film having been patterned to be expanded along the x-direction.

In FIG. 59, N+polysilicon inside the vertical hole is etched at convenience (etch N+poly) so that the N+polysilicon remaining at the bottom becomes the contact on BLY. The side wall is covered with polysilicon (poly on wall). The inside of the hole is filled by oxide (fill oxide). Furthermore, the surface is flattened using CMP, etc. (w2*x*) is a cross-sectional view on the z-x plane. (w2*y*) is a cross-sectional view on the z-y plane.

Figure 60:
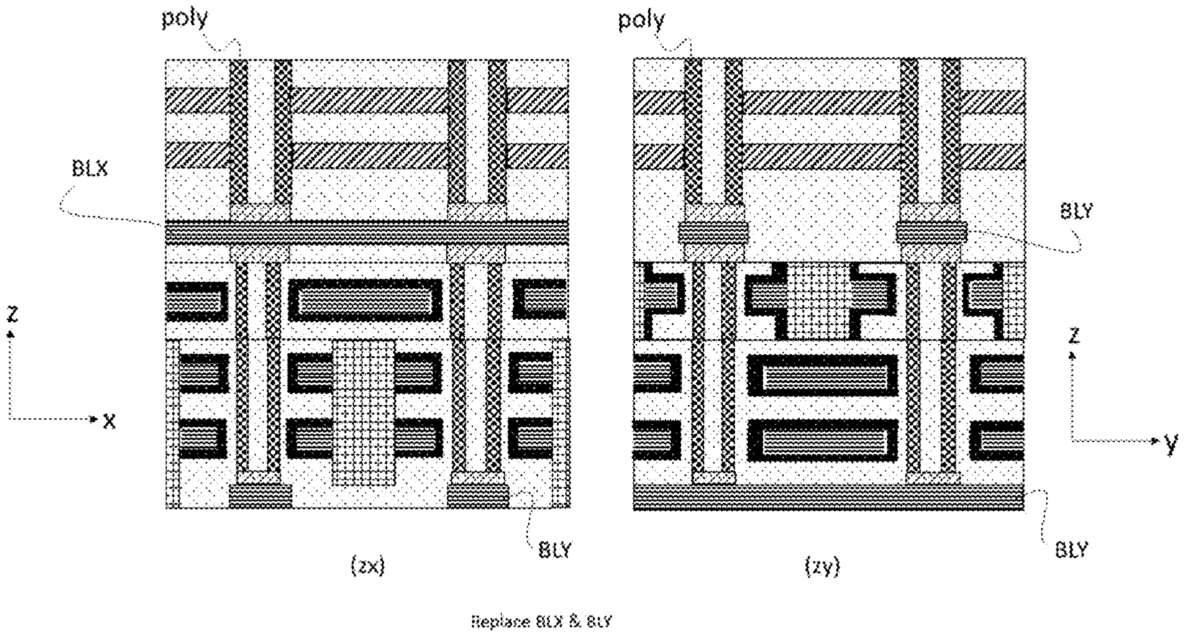
FIG. 60: a drawing to illustrate an example of fabrication process to form a unit having a characteristic of the present invention on the metal film having been patterned to be expanded along the x-direction.

FIG. 60 is the cross-sectional view in the case where (b) is selected in FIG. 46. Since the y-direction bit line BLY was formed at the bottom, the upper bit line must become the x-direction BLX. That is, it is what can be obtained by replacing BLX and BLY (replace BLX&BLY). The other fabrication processes are the same as FIG. 59. That is, this is the cross-sectional view to be obtained using the same fabrication process as in FIGS. 46 to 59 other than the replacement of the direction in the bit line patterning. Hence, the detailed explanation can be omitted. (zx) is a cross-sectional view on the z-x plane. (zy) is a cross-sectional view on the z-y plane.

Figure 61:
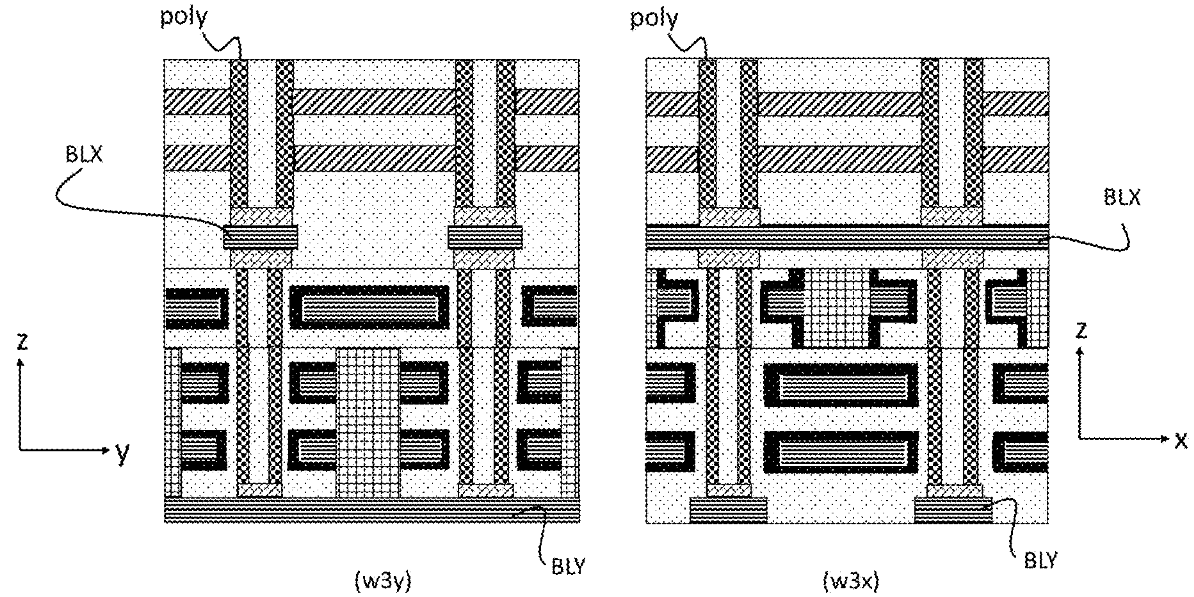
FIG. 61: a drawing to illustrate the case wherein X and Y in FIG. 59 were replaced.

FIG. 61 is the same as what can be obtained by replacing X and Y in FIG. 59. Since the replacement of the x-direction and the y-direction is the same as the coordinate transformation of the right-hand system and the left-hand system, there is not any change in the fabricated device structure. (w3*x*) is a cross-sectional view on the z-x plane. (w3*y*) is a cross-sectional view on the z-y plane. After this, the slit is formed along the x-direction and then the process to form the x-direction word line will start. Since the processes after this are like those after FIG. 48 (*e*), the illustrations are omitted. The real aim of FIG. 61 is to clarify that the structure sandwiched by BLX and BLY corresponds to the one unit in FIG. 9.

Figure 62:
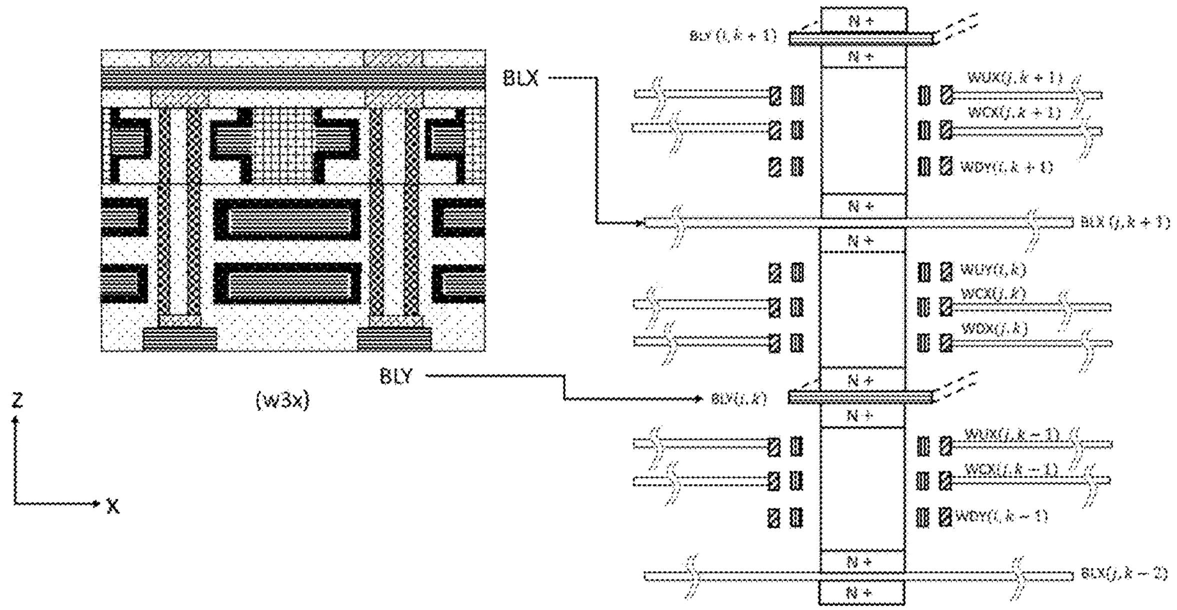
FIG. 62: a drawing to compare (w3*x*) in FIG. 61 and a part of module (corresponding to one unit) in FIG. 9.

In FIG. 62, (w3*x*) in FIG. 61 and a part of module (1 unit) in FIG. 9 are compared. We can see that BLX in FIG. 61 just corresponds to BLX (j, k+1) in FIG. 9, and BLY in FIG. 61 just corresponds to BLY (i, k) in FIG. 9.

Figure 63:
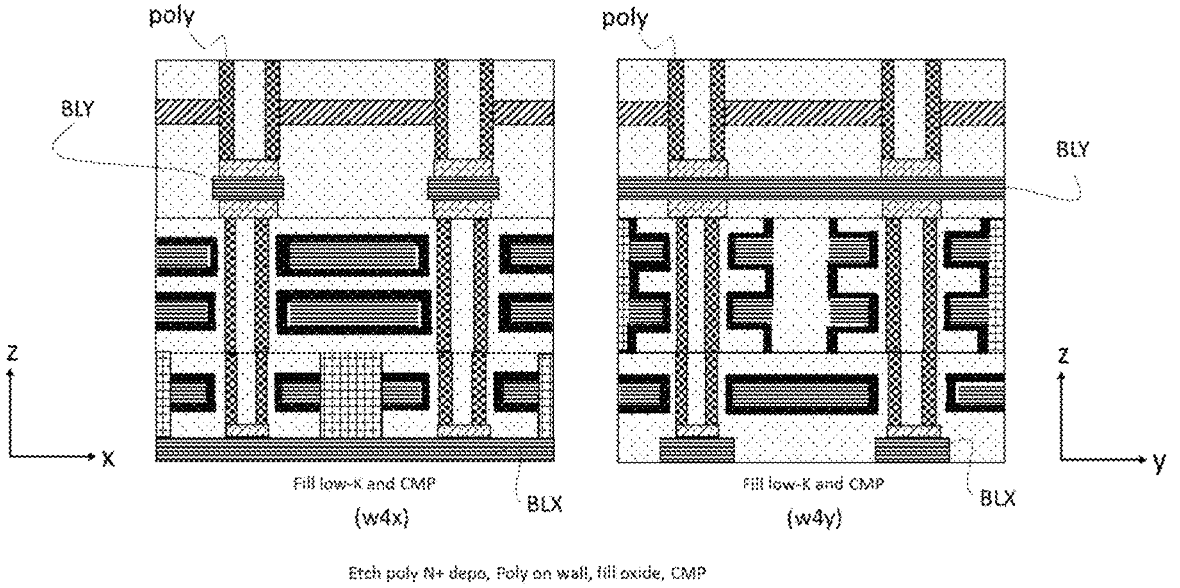
FIG. 63: a drawing to illustrate an example of unit which can be fabricated by changing the combination of numbers of nitride layers in FIG. 59.

FIG. 63 is what can be obtained by changing the set of nitride layers in FIG. 59. That is, it is the device structure that can be obtained by following the same fabrication processes in FIGS. 47 to 59 other than by changing the number of stacked nitride layers from 2 to 1 in FIG. 47 and the number of stacked nitride layers from 1 to 2 in FIG. 51. (w4*x*) is a cross-sectional view on the z-x plane. (w4*y*) is a cross-sectional view on the z-y plane.

Figure 64:
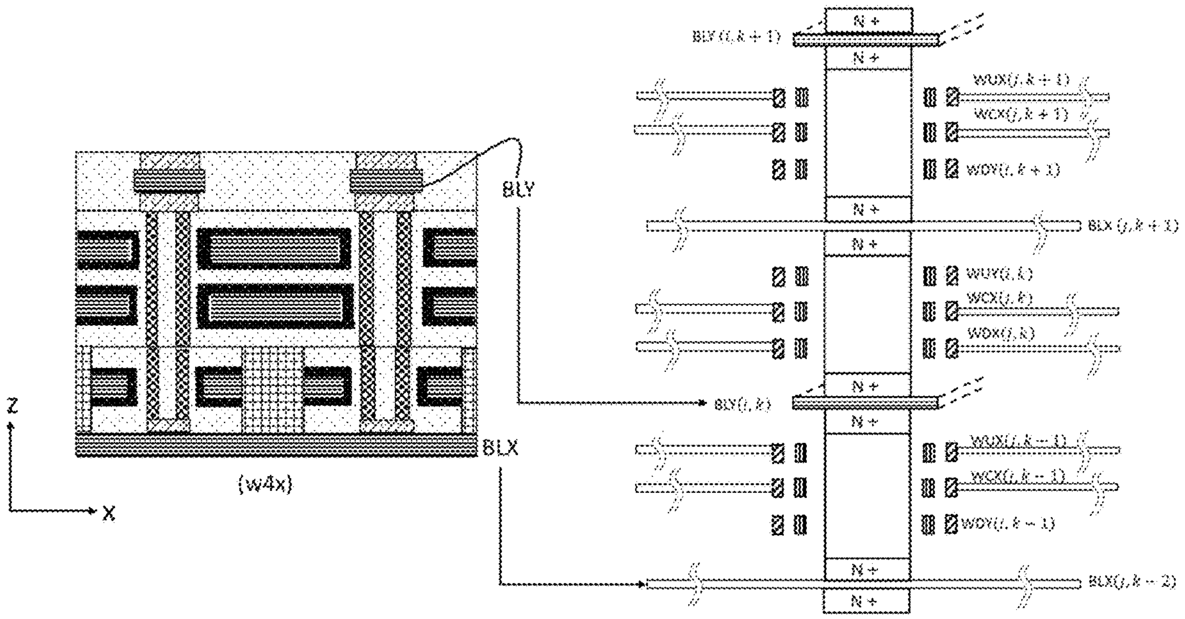
FIG. 64: a drawing to compare (w4*x*) in FIG. 63 and a part of module (corresponding to one unit) in FIG. 9.

In FIG. 64, (w4x) in FIG. 63 and a part of module (1 unit) in FIG. 9 are compared. We can see that BLX in FIG. 64 just corresponds to BLX (j, k−2) in FIG. 9, and BLY in FIG. 64 just corresponds to BLY (i, k) in FIG. 9.

By this way, by using the present embodiment, the device structure having the two-floor periodicity along the z-direction, which is characteristic of the present invention, can be fabricated. However, the two-floor periodicity is what the same structure can be obtained in the cross-sections on both the z-x plane and the z-y plane by shifting the z-address (k) by 2.

(Seventh embodiment) In three-dimensional circuits, in general, the number of word lines and bit lines likely increases as the number of layers along the z-direction (vertical direction). Hence, the number of contacts to peripheral circuits likely increases more than in the two-dimensional circuits. Accordingly, an idea to deploy contacts for saving the chip area is necessary. Inherently, the device structure as core is critical to how to deploy the contacts.

In the present invention, there is the two-floor periodicity in the z-address (k). How this affects the method to deploy the contacts is illustrated using the drawings.

Figure 65:
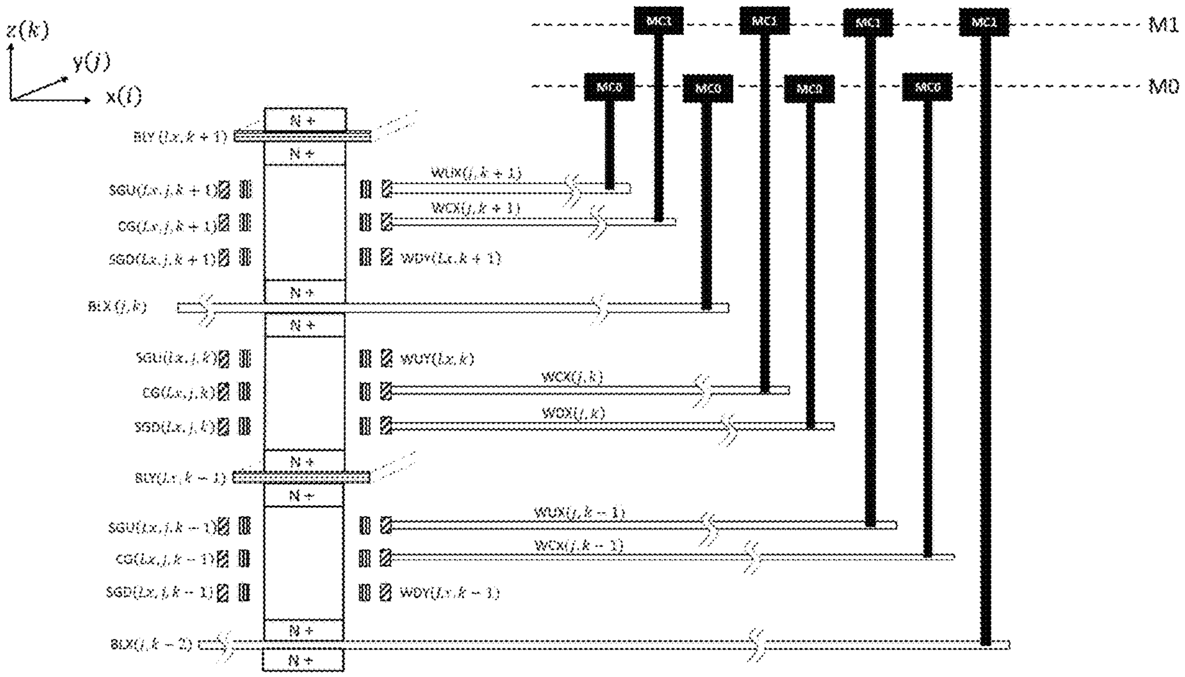
FIG. 65: a drawing to illustrate an example of the contacting method of the group of word lines (group of WUX and WCX) and the group of bit lines (group of BLX), which are expanded along the x-direction.

FIG. 65 is a drawing to illustrate the method to allocate the contacts of the group of the word lines (the group of WUX and WCX) and the group of the bit lines (the group of BLX), which are expanded along the x-direction. However, it is what illustrates the module located at the end along the x-axis (i=Lx) and with the z-address ranging from k+1 to k−2.

In general, the size of the contact portion (MC0 and MC1) is greater than the diameter of the metal via portion to be dug along the z-axis. Accordingly, it is preferable that adjoining contact portions are alternatively arrayed in the metal layer 0 (M0 layer) (or simply metal 0 layer) and the metal layer 1 (M1 layer) (or simply metal 1 layer). However, the contact in the M0 layer is MC0, and the contact in M1 layer is MC1.

However, in the present invention, all word lines and bit lines are not expanded along the x-direction due to the two-floor periodicity in the z-address (k). In an example of FIG. 65, WDY (Lx, k+1), WUY (Lx, k), and WDY (Lx, k−1) are the word lines expanded along the y-direction. BLY (Lx, k+1) and BLY (Lx, k−1) are the bit lines expanded along the y-direction.

In FIG. 65, the contact of WUX (j, k+1) is MC0. The contact of WCX (j, k+1) is MC1. The contact of BLX (j, k) is MC0. The contact of WCX (j, k) is MC1. The contact of WDX (j, k) is MC0. The contact of WUX (j, k−1) is MC1. The contact of WCX (j, k−1) is MC0. The contact of BLX (j, k−2) is MC1.

Figure 66:
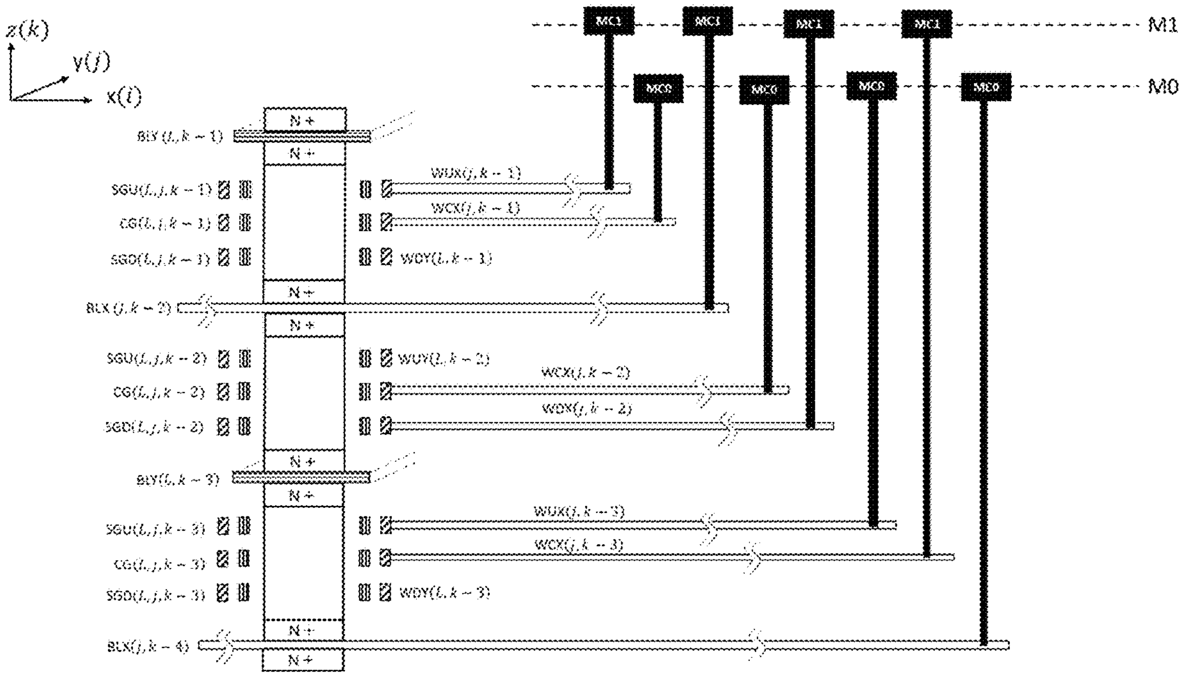
FIG. 66: a drawing to illustrate an example of the contacting method of the group of word lines (group of WUX and WCX) and the group of bit lines (group of BLX), which are expanded along the x-direction.

In FIG. 66, the module to be continued below that in FIG. 65 is illustrated, where the z-address ranges from k−1 to k−4. The contact of WUX (j, k−1) is MC1. The contact of WCX (j, k−1) is MC0. The contact of BLX (j, k−2) is MC1. The contact of WCX (j, k−2) is MC0. The contact of WDX (j, k−2) is MC1. The contact of WUX (j, k−3) is MC0. The contact of WCX (j, k−3) is MC1. The contact of BLX (j, k−4) is MC0.

Figure 67:
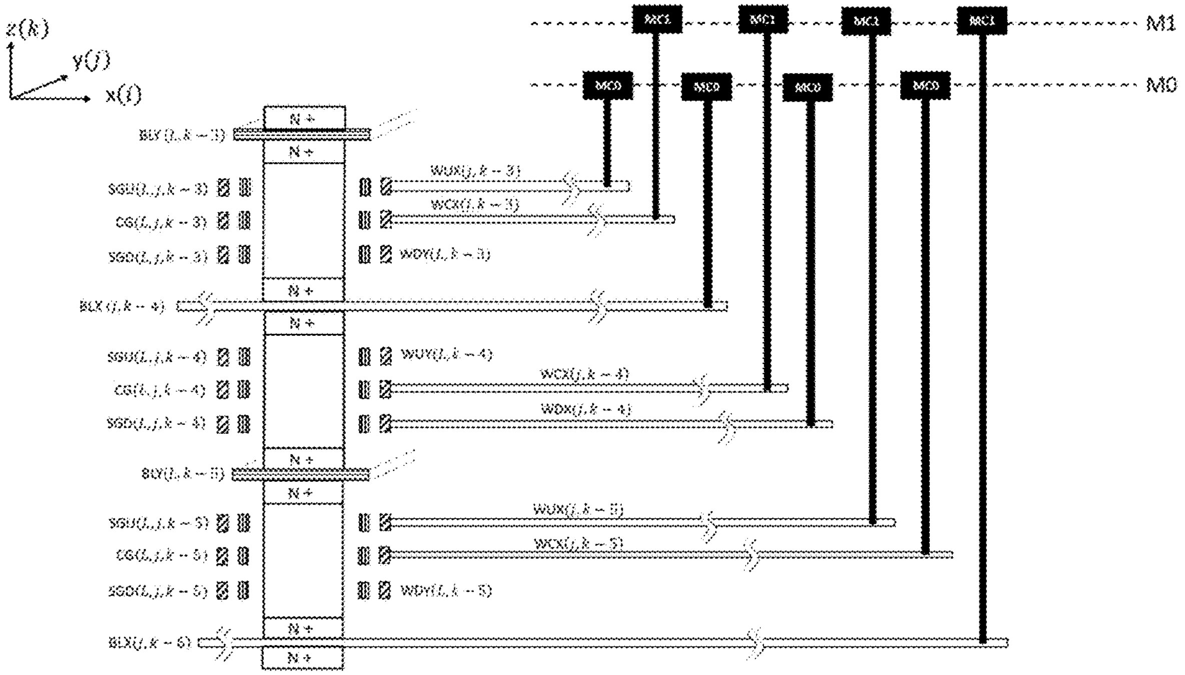
FIG. 67: a drawing to illustrate an example of the contacting method of the group of word lines (group of WUX and WCX) and the group of bit lines (group of BLX), which are expanded along the x-direction.

In FIG. 67, the module to be continued below that in FIG. 66 is illustrated, where the z-address ranges from k−3 to k−6. The contact of WUX (j, k−3) is MC0. The contact of WCX (j, k−3) is MC1. The contact of BLX (j, k−4) is MC0. The contact of WCX (j, k−4) is MC1. The contact of WDX (j, k−4) is MC0. The contact of WUX (j, k−5) is MC1. The contact of WCX (j, k−5) is MC0. The contact of BLX (j, k−6) is MC1.

Figure 68:
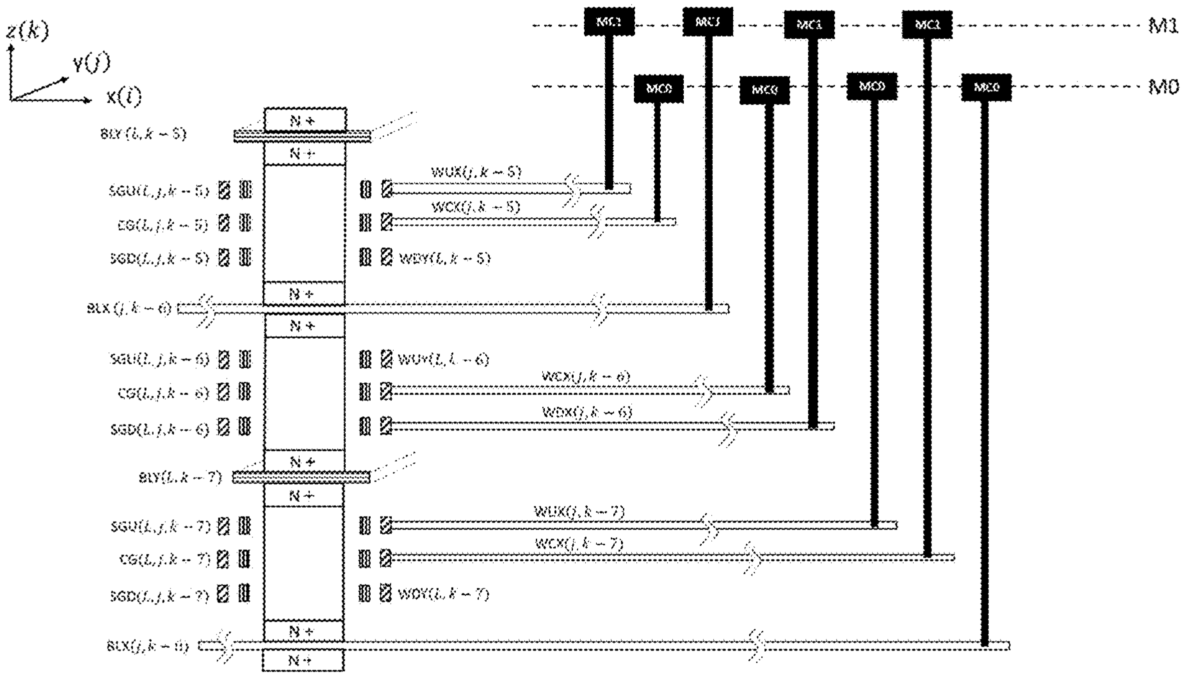
FIG. 68: a drawing to illustrate an example of the contacting method of the group of word lines (group of WUX and WCX) and the group of bit lines (group of BLX), which are expanded along the x-direction.

In FIG. 68, the module to be continued below that in FIG. 67 is illustrated, where the z-address ranges from k−5 to k−8. The contact of WUX (j, k−5) is MC1. The contact of WCX (j, k−5) is MC0. The contact of BLX (j, k−6) is MC1. The contact of WCX (j, k−6) is MC0. The contact of WDX (j, k−6) is MC1. The contact of WUX (j, k−7) is MC0. The contact of WCX (j, k−7) is MC1. The contact of BLX (j, k−8) is MC0.

Figure 69:
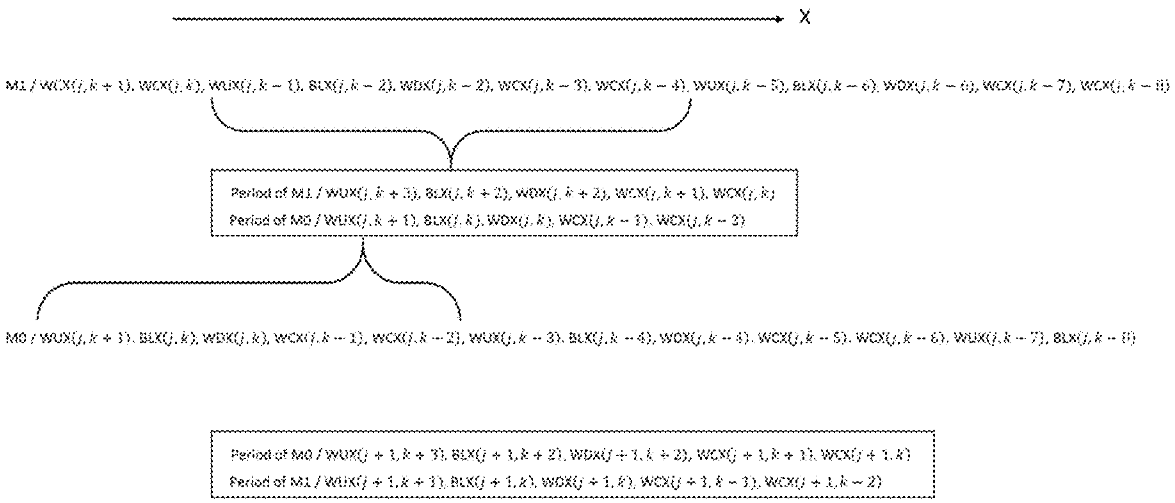
FIG. 69: a drawing to illustrate that each contact is connected to which word line or which bit line by dividing the contacts into those connecting to M1 layer or M0 layer.

In FIG. 69, it is summarized that each contact is connected to which word line or which bit line by classifying M1 layer and M0 layer.

In FIG. 69, it can be found that the four-floor periodicity (period of M1) along the z-axis occurs in the set of WUX (j, k+3), BLX (j, k+2), WDX (j, k+2), WCX (j, k+1), and WCX (j, k).

In a similar way, the four-floor periodicity (period of M0) along the z-axis occurs in the set of WUX (j, k+1), BLX (j, k), WDX (j, k), WCX (j, k−1), and WCX (j, k−2). This contact pattern along the x-axis has a relation with the structure along the z-axis. In particular, the reason for the four-floor periodicity, as explained below, is that the contacts are layout by dividing them into the x-axis and the y-axis.

Let us shift the y-address from j to j+1 one-by-one. In this case, the adjoining contacts along the y-direction may also need to be alternatively allocated to M0 layer and M1 layer. Accordingly, the four-floor periodicity along the z-direction occurs in the set of WUX (j+1, k+3), BLX (j+1, k+2), WDX (j+1, k+2), WCX (j+1, k+1), and WCX (j+1, k), which are arrayed along the x-direction on the M0 layer (period of M0), with regard to the y-address (j+1). Moreover, the four-floor periodicity along the z-axis occurs in the set of WUX (j+1, k+1), BLX (j+1, k), WDX (j+1, k), WCX (j+1, k−1), and WCX (j+1, k−2), which are arrayed along the x-direction on the M1 layer (period of M1).

Figure 70:
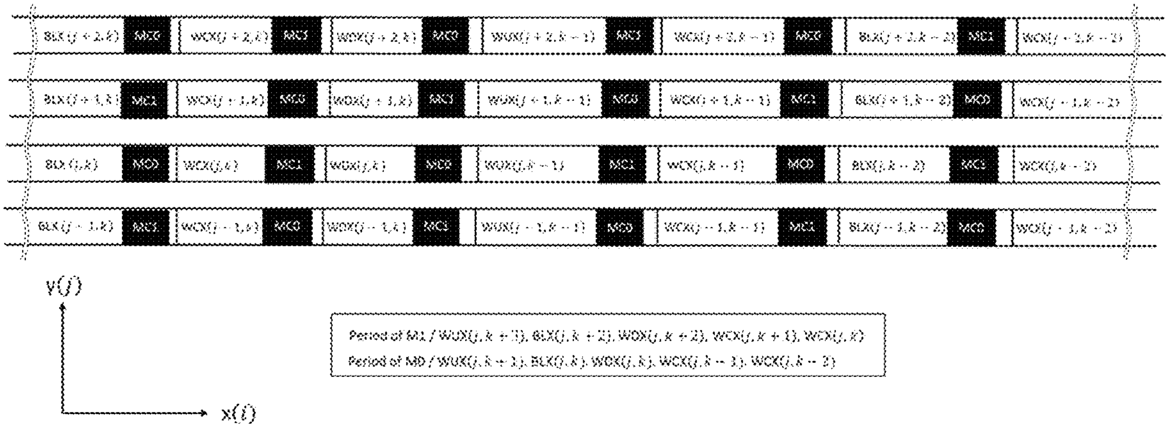
FIG. 70: a drawing to illustrate an example of the method to layout MC0 and MC1 on the X-Y plane so that the z-direction periodicity, which is characteristic of the present invention, can be satisfied.

FIG. 70 is a drawing to illustrate an example of the layout of MC0 and MC1 on the X-Y plane to satisfy the above-mentioned four-floor periodicity along the z-direction.

Figure 71:
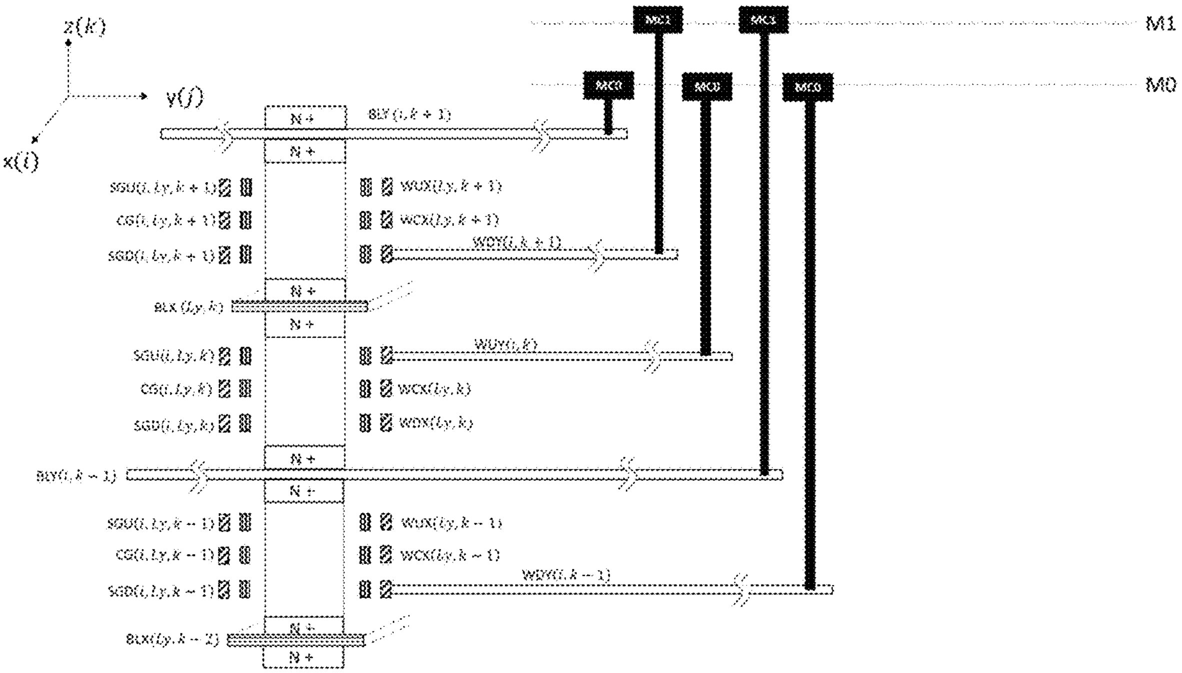
FIG. 71: a drawing to illustrate an example of the contacting method of the group of word lines (group of WDY and WUY) and the group of bit lines (group of BLY), which are expanded along the y-direction.

FIG. 71 is a drawing to illustrate the method to allocate the contacts of the group word lines (the group of WDY and WUY) and the group of bit lines (the group of BLY), which are expanded along the y-direction. However, it is what illustrates the module located at the end along the y-axis (i=Ly) and with the z-address ranging from k+1 to k−2.

As mentioned above, in the present invention, all word lines and bit lines are not expanded along the y-direction due to the two-floor periodicity in the z-address. In an example of FIG. 71, WUX (Ly, k+1), WCX (Ly,k+1), WCX (Ly, k), WDX (Ly, k), WUX (Ly, k−1), and WCX (Ly, k−1) are the word lines expanded along the x-direction. BLX (Ly, k) and BLX (Ly, k−2) are the bit lines expanded along the x-direction. However, this cell is located at the end along the y-direction (Ly). WDY (i, k+1), WUY (i,k) and WDY (i, k−1) are the word lines expanded along the y-direction. BLY (i, k+1) and BLY (i, k−1) are the bit lines expanded along the y-direction.

In FIG. 71, the contact of BLY (i, k+1) is MC0. The contact of WDY (i, k+1) is MC1. The contact of WUY (i, k) is MC0. The contact of BLY (i, k−1) is MC1. The contact of WDY (i, k−1) is MC0.

Figure 72:
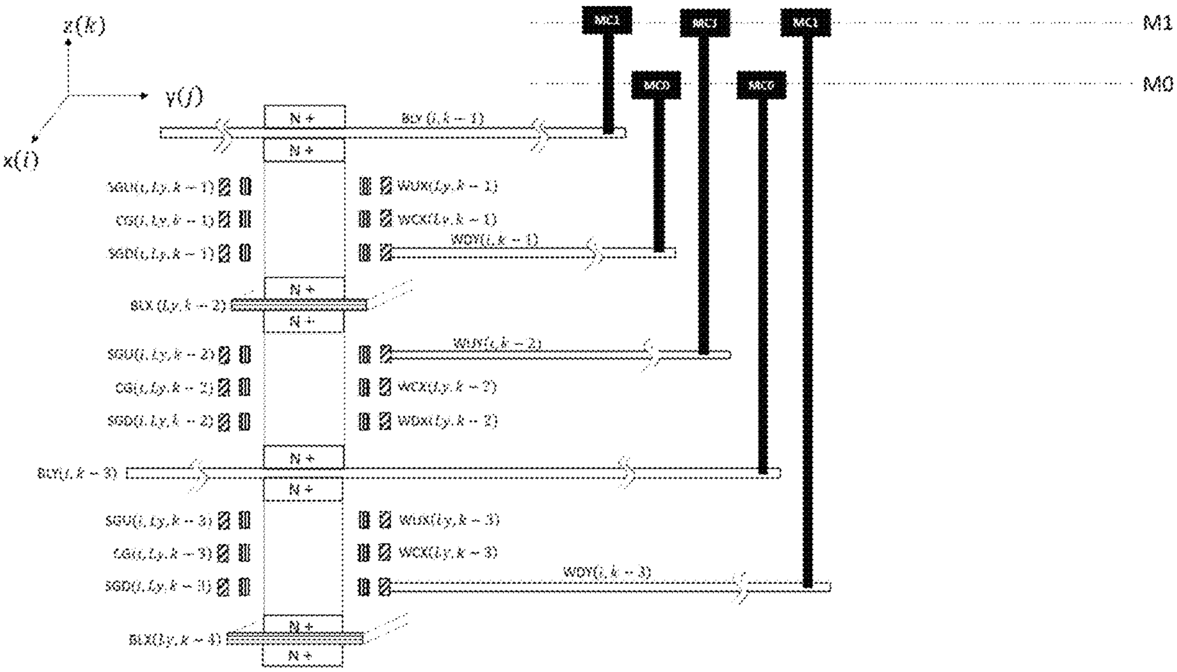
FIG. 72: a drawing to illustrate an example of the contacting method of the group of word lines (group of WDY and WUY) and the group of bit lines (group of BLY), which are expanded along the y-direction.

In FIG. 72, the module to be continued below that in FIG. 71 is illustrated, where the z-address ranges from k−1 to k−4. The contact of BLY (i, k−1) is MC1. The contact of WDY (i, k−1) is MC0. The contact of WUY (i, k−2) is MC1. The contact of BLY (i, k−3) is MC0. The contact of WDY (i, k−3) is MC1.

Figure 73:
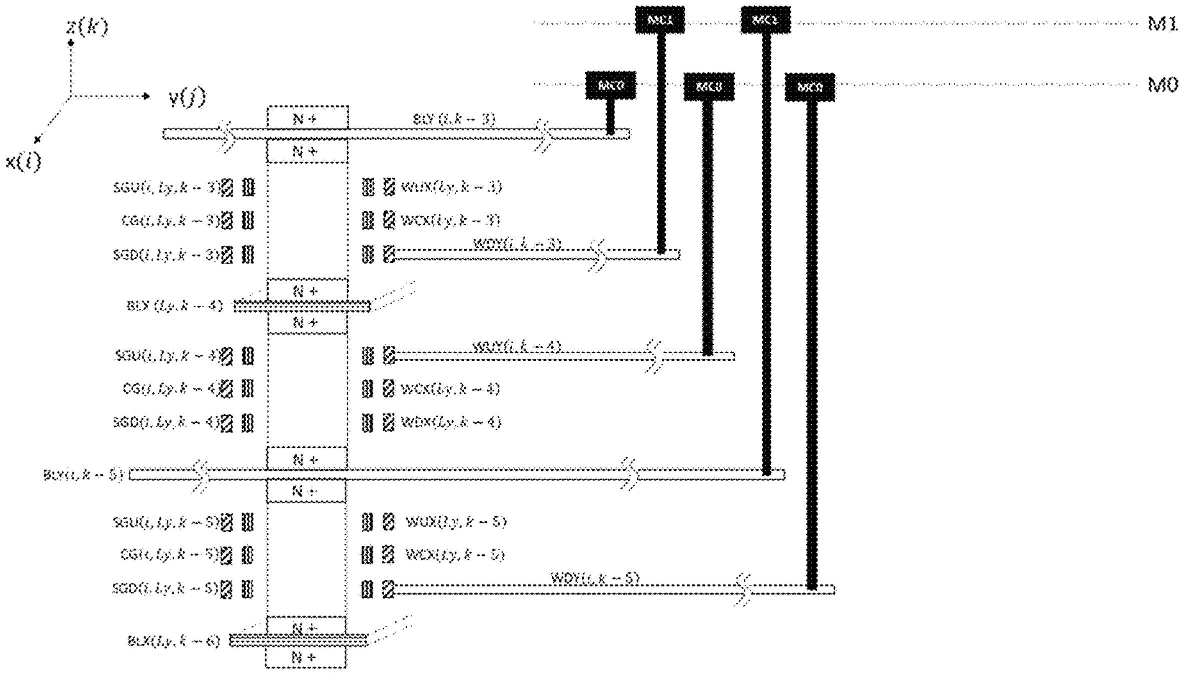
FIG. 73: a drawing to illustrate an example of the contacting method of the group of word lines (group of WDY and WUY) and the group of bit lines (group of BLY), which are expanded along the y-direction.

In FIG. 73, the module to be continued below that in FIG. 72 is illustrated, where the z-address ranges from k−3 to k−6. The contact of BLY (i, k−3) is MC0. The contact of WDY (i, k−3) is MC1. The contact of WUY (i, k−4) is MC0. The contact of BLY (i, k−5) is MC1. The contact of WDY (i, k−5) is MC0.

Figure 74:
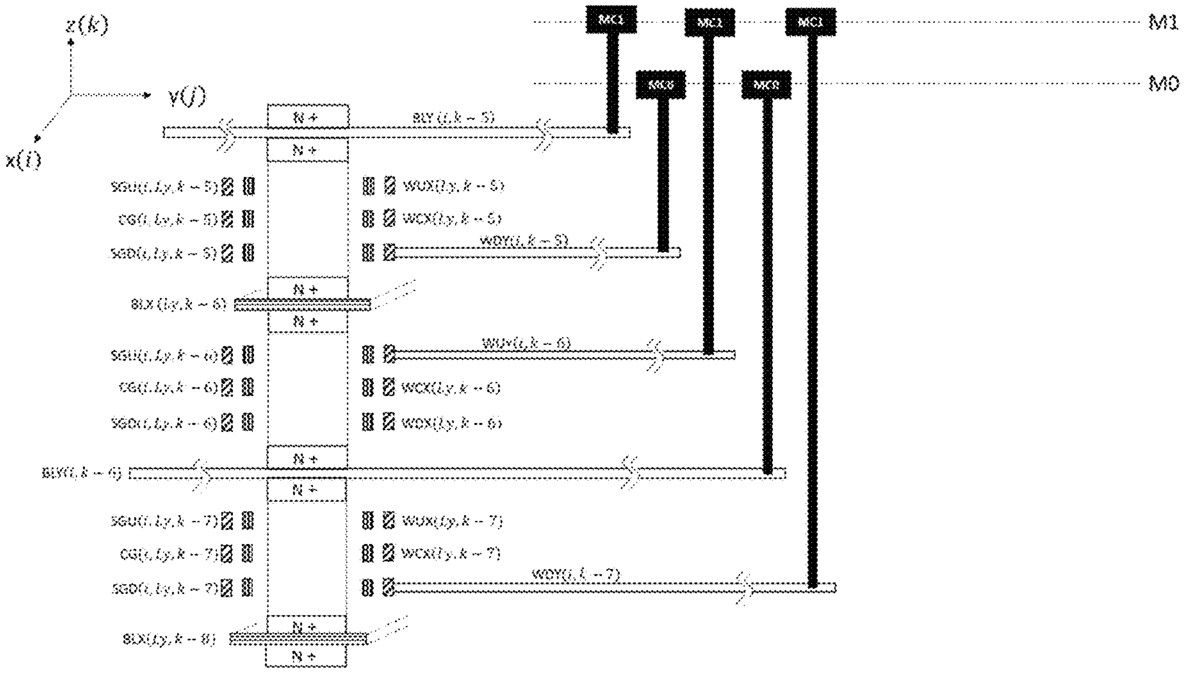
FIG. 74: a drawing to illustrate an example of the contacting method of the group of word lines (group of WDY and WUY) and the group of bit lines (group of BLY), which are expanded along the y-direction.

In FIG. 74, the module to be continued below that in FIG. 73 is illustrated, where the z-address ranges from k−5 to k−8. The contact of BLY (i, k−5) is MC1. The contact of WDY (i, k−5) is MC0. The contact of WUY (i, k−6) is MC1. The contact of BLY (i, k−6) is MC0. The contact of WDY (i, k−7) is MC1.

Figure 75:
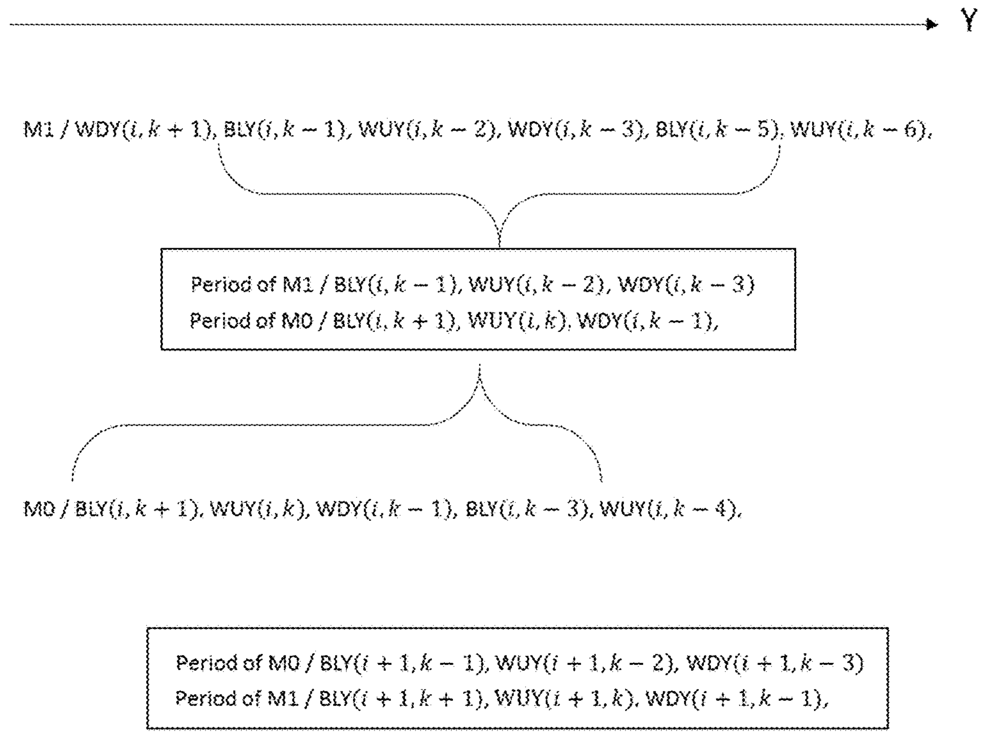
FIG. 75: a drawing to illustrate that each contact is connected to which word line or which bit line by dividing the contacts into those connecting to M1 layer or M0 layer.

In FIG. 75, it is summarized that each contact is connected to which word line or which bit line by classifying M1 layer and M0 layer.

In FIG. 75, it can be found that the three-floor periodicity (period of M1) along the z-axis occurs in the set of BLY (i, k−1), WUY (i, k−2), WDY (i, k−3). That is, the same pattern occurs by shifting the z-address (k) with 3. As clarified in FIGS. 71 to 74, as going along the y-address direction, the word lines and bit lines, which are connected to the contacts, are deeper, and then the number of the z-address increases. That is, this contact pattern along the y-axis has a relation with the structure along the z-axis.

In a similar way, the three-floor periodicity (period of M0) along the z-axis occurs in the set of BLY (i, k+1), WUY (i, k), and WDY (i, k−1). That is, the same pattern occurs by shifting the z-address (k) with 3. This contact pattern along the y-axis has a relation with the structure along the z-axis. In particular, the reason for the three-floor periodicity, as explained below, is that the contacts are layout by dividing them into the x-axis and the y-axis.

Let us shift the x-address from i to i+1 one-by-one. In this case, the adjoining contacts along the x-direction may also need to be alternatively allocated to M0 layer and M1 layer. Accordingly, the three-floor periodicity along the z-direction occurs in the set of BLY (i+1, k−1), WUY (i+1, k−2), and WDY (i+1, k−3), which are arrayed along the y-direction on the M0 layer (period of M0), with regard to the x-address (i+1). Moreover, the three-floor periodicity along the z-axis occurs in the set of BLY (i+1, k+1), WUY (i+1, k), and WDY (i+1, k−1), which are arrayed along the y-direction on the M1 layer (period of M1).

Figure 76:
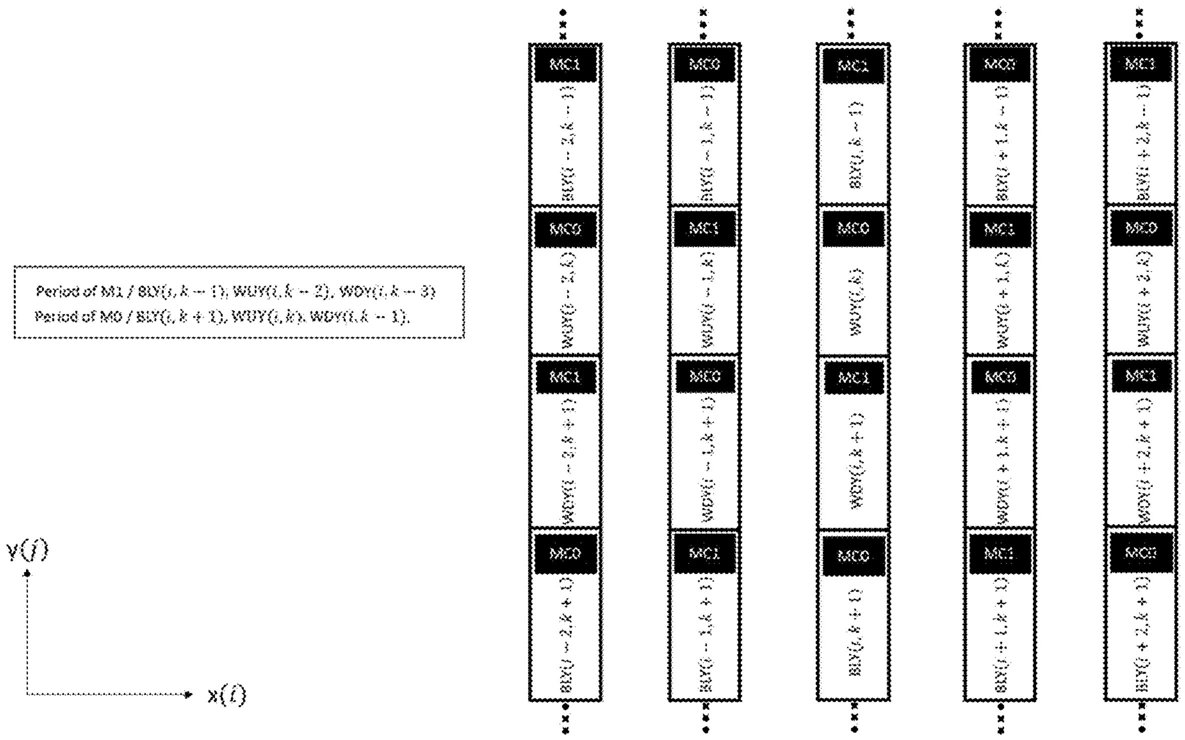
FIG. 76: a drawing to illustrate an example of the method to layout MC0 and MC1 on the X-Y plane so that the z-direction periodicity, which is characteristic of the present invention, can be satisfied.

FIG. 76 is a drawing to illustrate an example of the layout of MC0 and MC1 on the X-Y plane to satisfy the above-mentioned three-floor periodicity.

FIGS. 77 to 80 are the drawings to illustrate an example of the layout of bit lines, bit line contacts, word lines and word line contacts on the X-Y plane.

Figure 77:
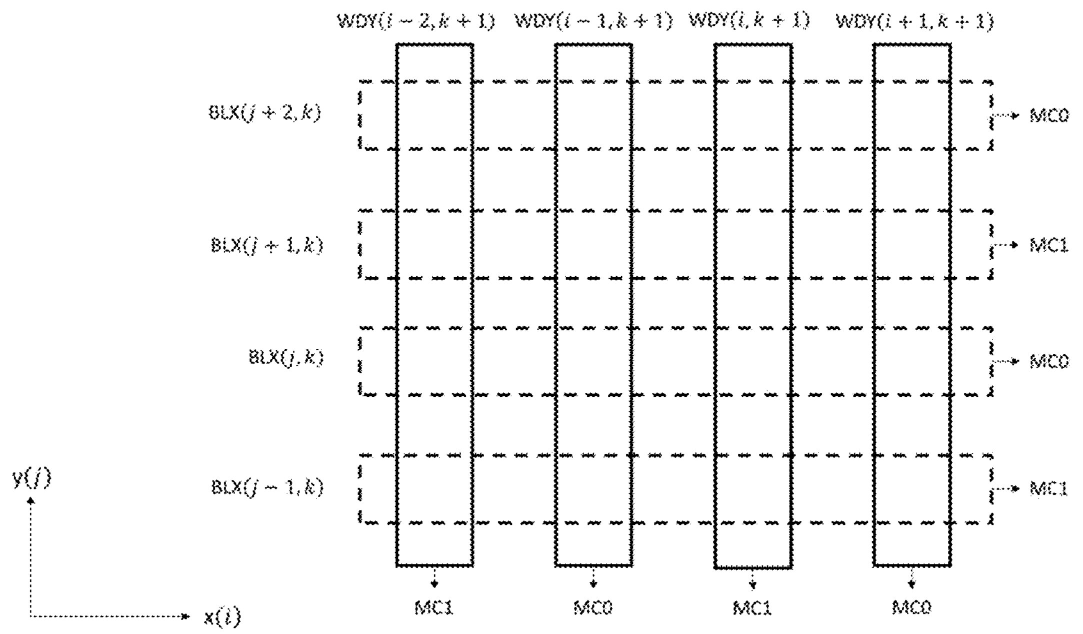
FIG. 77: a drawing to illustrate an example of the method to layout bit lines, bit line contacts, word lines, and word line contact on the X-Y plane.

As illustrated in FIGS. 65 to 71, BLX (*, k) is vertically sandwiched by WDY (*, k+1) and WUY (*, k). FIG. 77 is a drawing to illustrate an example of the layout of BLX (*, k), WDY (*, k+1), contact MC0 and contact MC1 on the X-Y plane. There is WDY (*, k+1) above BLX (*, k) along the z-axis. Moreover, for example, the contact of BLX (j, k) is on the M0 layer. The contact of BLX (j+1, k) is on the M1 layer. The contact of WDY (i−1, k+1) is on the M0 layer. The contact of WDY (i, k+1) is on the M1 layer.

Figure 78:
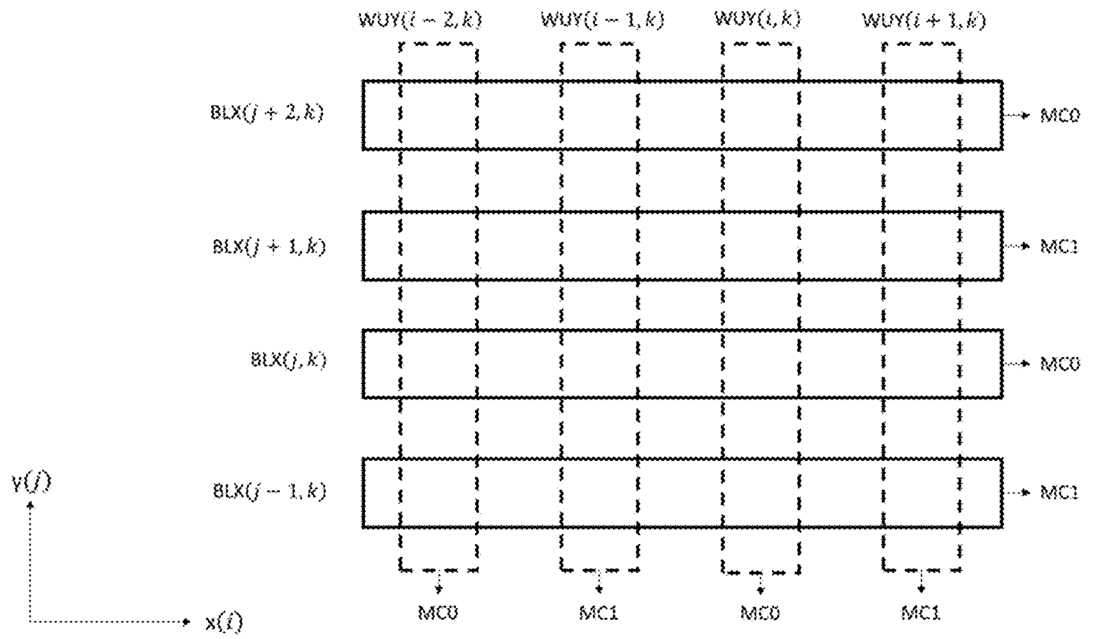
FIG. 78: a drawing to illustrate an example of the method to layout bit lines, bit line contacts, word lines, and word line contact on the X-Y plane.

FIG. 78 is a drawing to illustrate an example of the layout of BLX (*, k), WUY (*, k), contact MC0 and contact MC1 on the X-Y plane. There is WUY (*, k) below BLX (*, k) along the z-axis. Moreover, for example, the contact of WUY (i−1, k) is on the M1 layer. The contact of WUY (i, k) is on the M0 layer.

Figure 79:
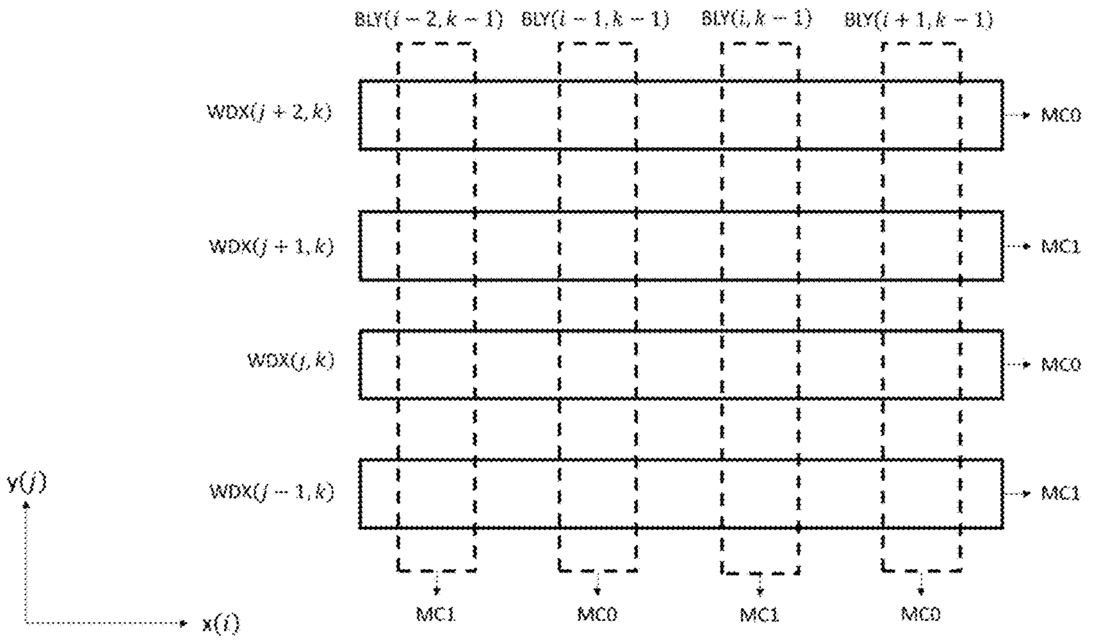
FIG. 79: a drawing to illustrate an example of the method to layout bit lines, bit line contacts, word lines, and word line contact on the X-Y plane.

As illustrated in FIGS. 65 to 71, BLY (*, k−1) is vertically sandwiched by WDX (*, k) and WUX (*, k−1). FIG. 79 is a drawing to illustrate an example of the layout of BLY (*, k−1), WDX (*, k), contact MC0 and contact MC1 on the X-Y plane. There is WDX (*, k) above BLY (*, k−1) along the z-axis. Moreover, for example, the contact of BLY (i, k−1) is on the M1 layer. The contact of BLY (i+1, k−1) is on the M0 layer. The contact of WDX (j, k) is on the M0 layer. The contact of WDX (j+1, k) is on the M1 layer.

Figure 80:
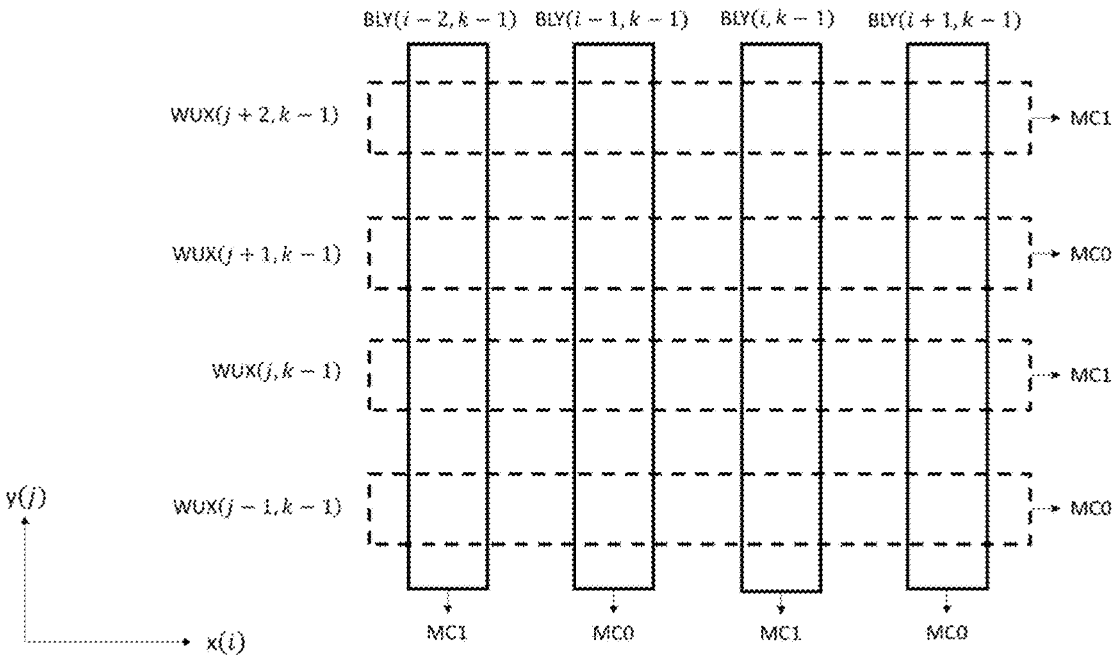
FIG. 80: a drawing to illustrate an example of the method to layout bit lines, bit line contacts, word lines, and word line contact on the X-Y plane.

FIG. 80 is a drawing to illustrate an example of the layout of BLY (*, k−1), WUX (*, k−1), contact MC0 and contact MC1 on the X-Y plane. There is WUX (*, k−1) below BLY (*, k−1) along the z-axis.

(Non-patent literature 1) Gordon E. Moore, "Cramming more components onto integrated circuits", Electronics, volume 38, Number 8, Apr. 19, 1965.

(Non-patent literature 2) Masanet, E.; Shhehabi, A.; Lei, N.; Smith, S.; Koomey, J. Recalibrating global data center energy-use estimates. Science 2020, vol. 3667, 984-986.

(Non-patent literature 3) C. C. Lu et al., "Analysis and Realization of TLC or even QLC Operation with a High-Performance Multi-Times Verify Scheme in 3D NAND Flash memory," 2018 IEEE International Electron Devices Meeting (IEDM), 2018, pp. 2.2.1-2.2.4, doi: 10.1109/IEDM.2018.8614548.

(Non-patent literature 4) J.-H. jang et al., "Vertical Cell Array using TCAT (Terabit Cell Array Transistor) Technology for Ultra High-Density NAND Flash Memory", the 2009 Symposium on VLSI Technology Digest of Technical Papers, pp. 192-193, 2009.

(Eighth embodiment) In some cases, it may be preferable that the width of bit lines and word lines so wide to include multiple channel vias. This relates to the reliability of the fabrication of channel via. As the thickness of channel via (length), it may be supposed that a channel via drops down during the fabrication process. For avoiding this problem, a method wherein bit line or word line enforces channel vias may be adopted. It may be explained concretely using FIGS. 81 to 96.

Figure 81:
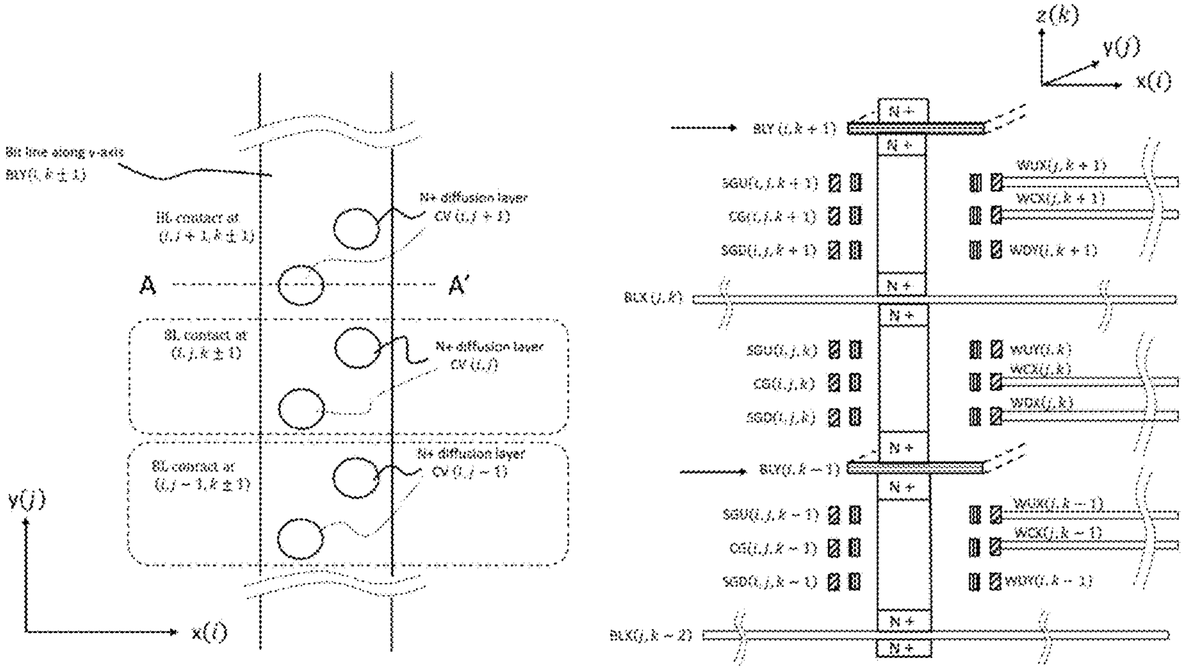
FIG. 81: a drawing to illustrate an example of top view (X-Y plan drawing) of the cross-section at a layer which includes BLY (i, k+1).

FIG. 81 corresponds to FIG. 31 and is an example regarding the width of the y-direction bit line. A difference from FIG. 31 is that there are two-columns of channel vias within the width of the y-direction bit line. The other difference is that two channel vias are bundled to be connected to one bit line contact. In contrast, in FIG. 31, there is only one column of channel vias within the width of the y-direction bit line. This way, it may avoid the risk that a channel via likely falls along the x-direction. In the cross-section cut out of on the A-A' line (in the right-hand side), a channel via is closer to the left end of the y-direction bit line.

Figure 82:
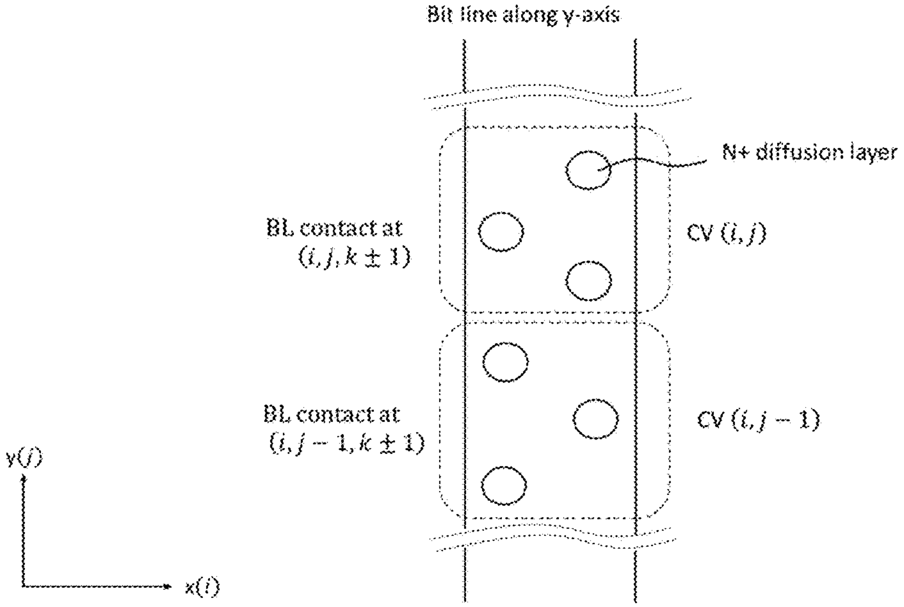
FIG. 82: a drawing to illustrate an example of top view (X-Y plan drawing) of the cross-section at a layer which includes BLY (i, k+1).

FIG. 82 corresponds to FIG. 31 and is another example regarding the width of the y-direction bit line. It is characteristic that three channel vias are bundled to be connected to one bit line.

Figure 83:
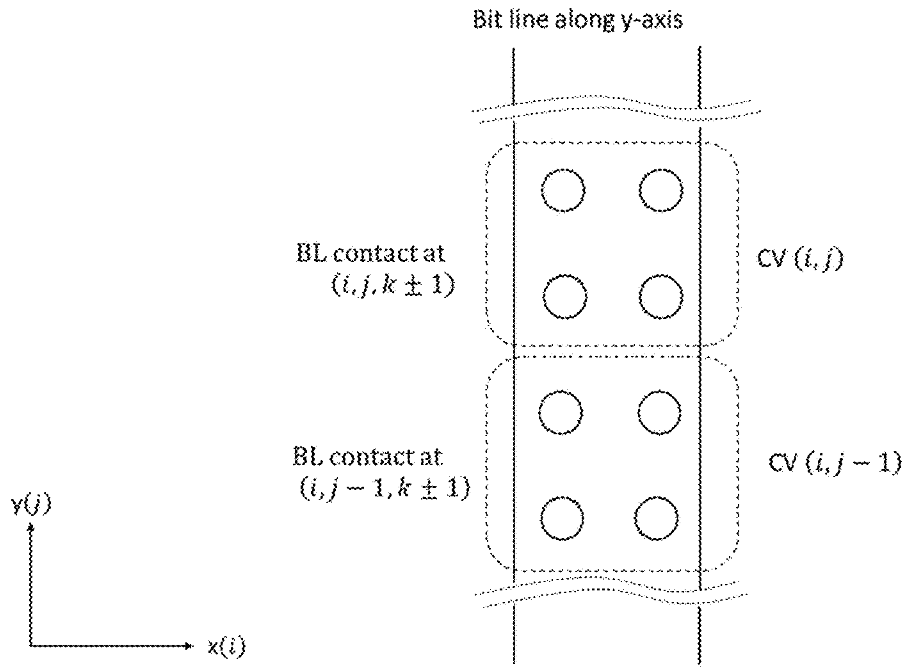
FIG. 83: a drawing to illustrate an example of top view (X-Y plan drawing) of the cross-section at a layer which includes BLY (i, k+1).

FIG. 83 corresponds to FIG. 31 and is another example regarding the width of the y-direction bit line. It is characteristic that four channel vias are bundled to be connected to one bit line.

Figure 84:
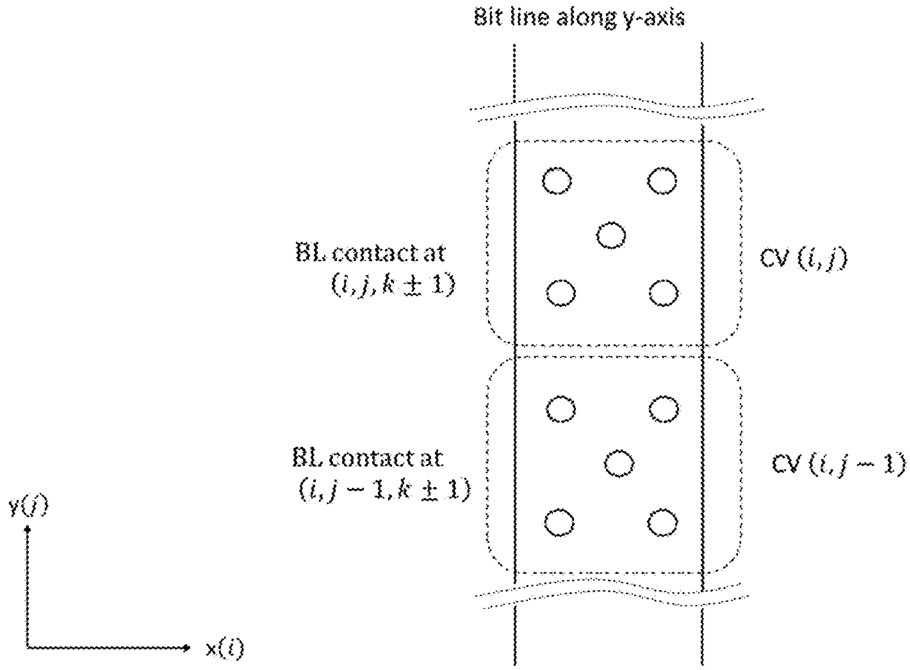
FIG. 84: a drawing to illustrate an example of top view (X-Y plan drawing) of the cross-section at a layer which includes BLY (i, k+1).

FIG. 84 corresponds to FIG. 31 and is another example regarding the width of the y-direction bit line. It is characteristic that there are three columns of channel vias within the width of the y-direction bit line and that five channel vias are bundled to be connected to one bit line.

Figure 85:
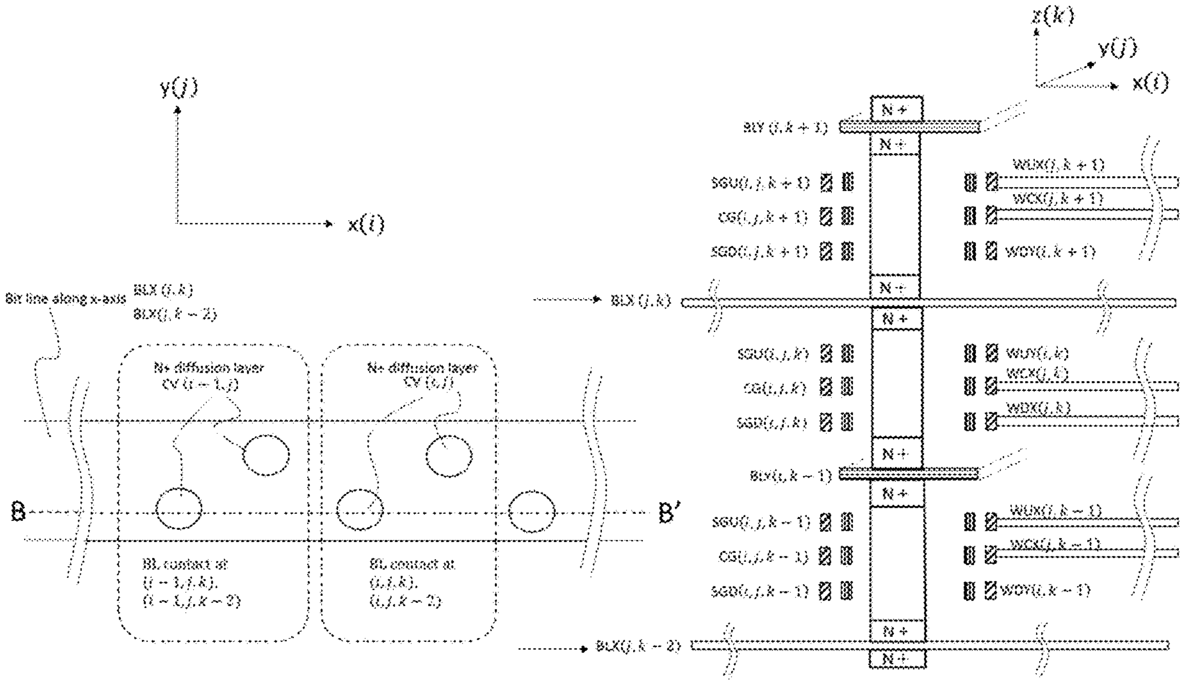
FIG. 85: a drawing to illustrate an example of top view (X-Y plan drawing) of the cross-section at a layer which includes BLX (j, k) or BLX (j, k−2).

FIG. 85 corresponds to FIG. 32 and is an example regarding the width of the x-direction bit line. A difference from FIG. 32 is that there are two-columns of channel vias within the width of the x-direction bit line. The other difference is that two channel vias are bundled to be connected to one bit line contact. In contrast, in FIG. 32, there is only one column of channel vias within the width of the x-direction bit line. By this way, it may avoid the risk that a channel via likely falls along the y-direction. In the cross-section cut out of on the B-B' line (in the right-hand side), a channel via is closer to the left end of the y-direction bit line.

Figure 86:
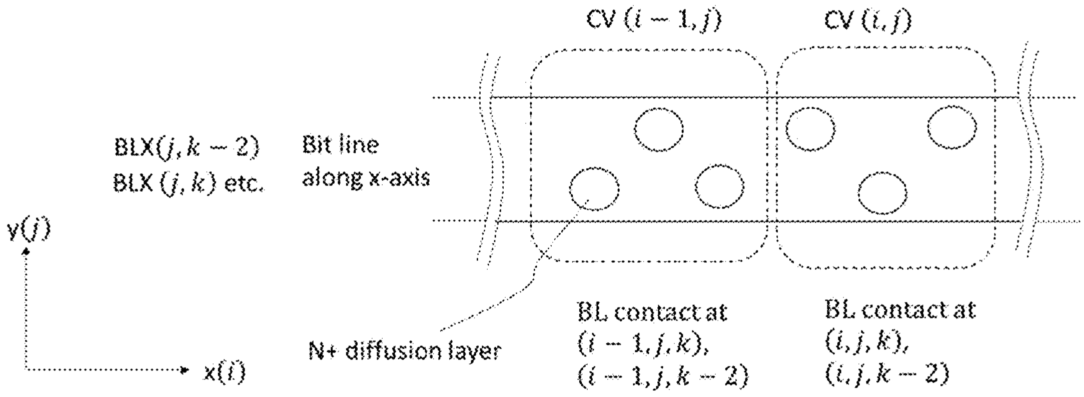
FIG. 86: a drawing to illustrate an example of top view (X-Y plan drawing) of the cross-section at a layer which includes BLX (j, k) or BLX (j, k−2).

FIG. 86 corresponds to FIG. 32 and is another example regarding the width of the x-direction bit line. It is characteristic that three channel vias are bundled to be connected to one bit line.

Figure 87:
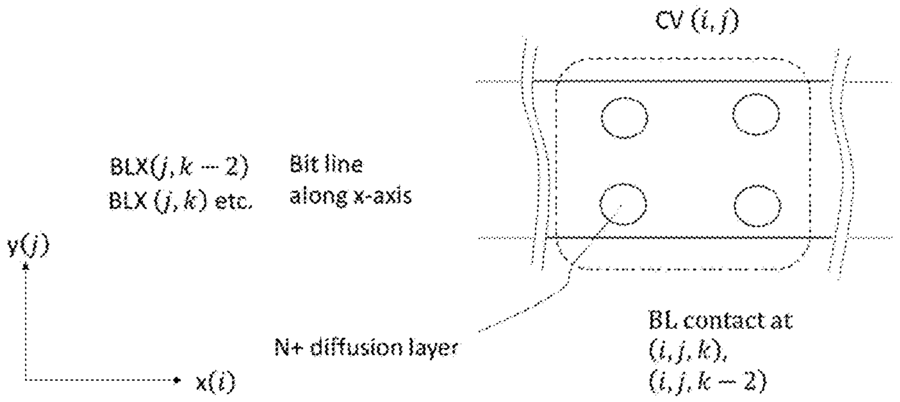
FIG. 87: a drawing to illustrate an example of top view (X-Y plan drawing) of the cross-section at a layer which includes BLX (j, k) or BLX (j, k−2).

FIG. 87 corresponds to FIG. 32 and is another example regarding the width of the x-direction bit line. It is characteristic that four channel vias are bundled to be connected to one bit line.

Figure 88:
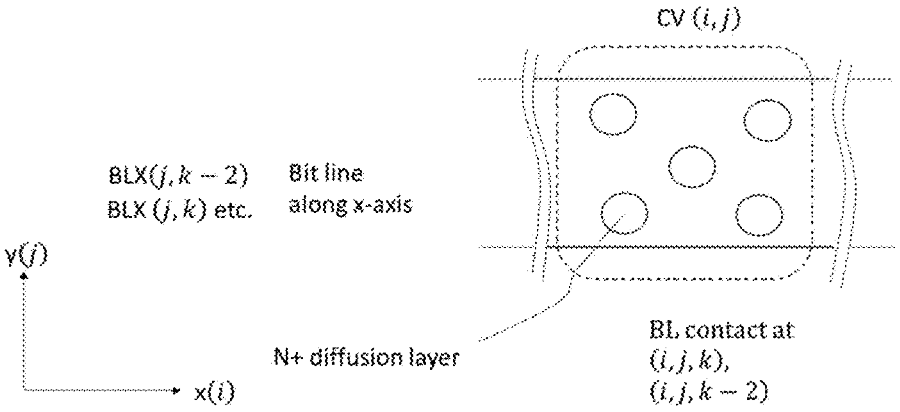
FIG. 88: a drawing to illustrate an example of top view (X-Y plan drawing) of the cross-section at a layer which includes BLX (j, k) or BLX (j, k−2).

FIG. 88 corresponds to FIG. 32 and is another example regarding the width of the x-direction bit line. It is characteristic that there are three columns of channel vias within the width of the x-direction bit line and that five channel vias are bundled to be connected to one bit line.

Figure 89:
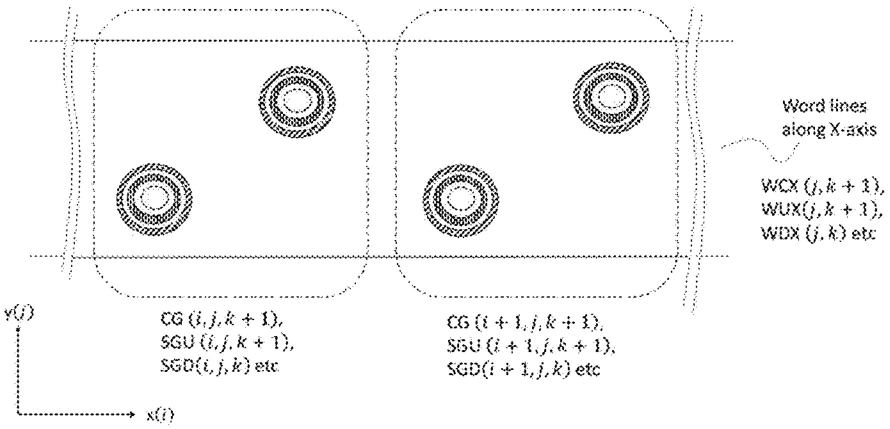
FIG. 89: a drawing to illustrate an example of top view (X-Y plan drawing) of the cross-section at a layer which includes CG (i, j, k+1), SGU (i, j, k+1), or SGD (i, j, k).
Figure 90:
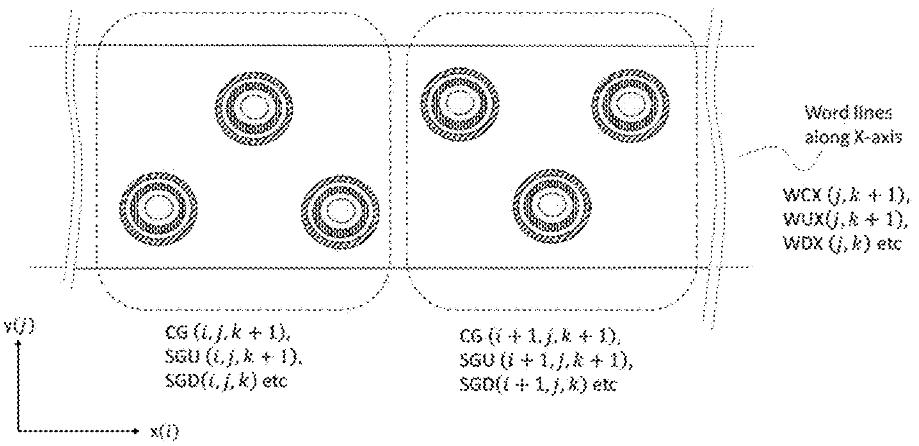
FIG. 90: a drawing to illustrate an example of top view (X-Y plan drawing) of the cross-section at a layer which includes CG (i, j, k+1), SGU (i, j, k+1), or SGD (i, j, k).

FIG. 89 corresponds to FIGS. 32, 34, 36 and 38 and is an example regarding the width of the x-direction work line. A difference from FIGS. 33, 34, 36 and 38 is that there are two-columns of channel vias within the width of the x-direction word line. The other difference is that two channel vias are bundled to be connected to either one cell gate or select gate (CG, SGU, SGD). In contrast, in FIGS. 33, 34, 36, and 38, there is only one column of channel vias within the width of the x-direction word line. By this way, in FIG. 89, it may avoid the risk that a channel via likely falls along the y-direction.

FIG. 89 corresponds to FIGS. 33, 34, 36 and 38 and is another example regarding the width of the x-direction work line. It is characteristic that there are two-columns of channel vias within the width of the x-direction word line and that three channel vias are bundled to be connected to either one cell gate or select gate (CG, SGU, SGD).

Figure 91:
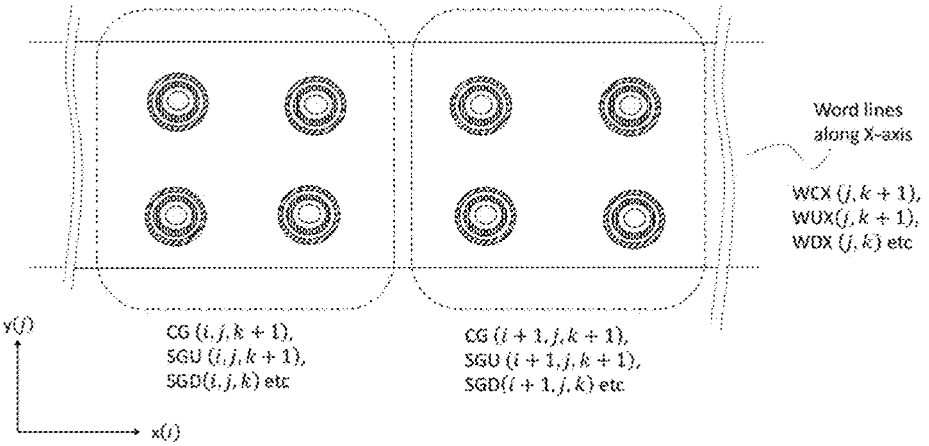
FIG. 91: a drawing to illustrate an example of top view (X-Y plan drawing) of the cross-section at a layer which includes CG (i, j, k+1), SGU (i, j, k+1), or SGD (i, j, k).

FIG. 91 corresponds to FIGS. 33, 34, 36 and 38 and is another example regarding the width of the x-direction work line. It is characteristic that there are two-columns of channel vias within the width of the x-direction word line and that four channel vias are bundled to be connected to either one cell gate or select gate (CG, SGU, SGD).

Figure 92:
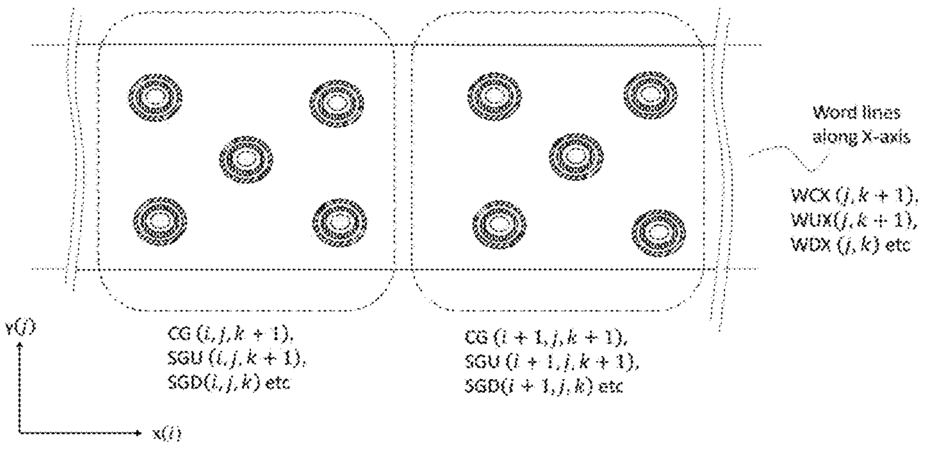
FIG. 92: a drawing to illustrate an example of top view (X-Y plan drawing) of the cross-section at a layer which includes CG (i, j, k+1), SGU (i, j, k+1), or SGD (i, j, k).

FIG. 92 corresponds to FIGS. 33, 34, 36 and 38 and is another example regarding the width of the x-direction word line. It is characteristic that there are three-columns of channel vias within the width of the x-direction word line and that five channel vias are bundled to be connected to either one cell gate or select gate (CG, SGU, SGD).

Figure 93:
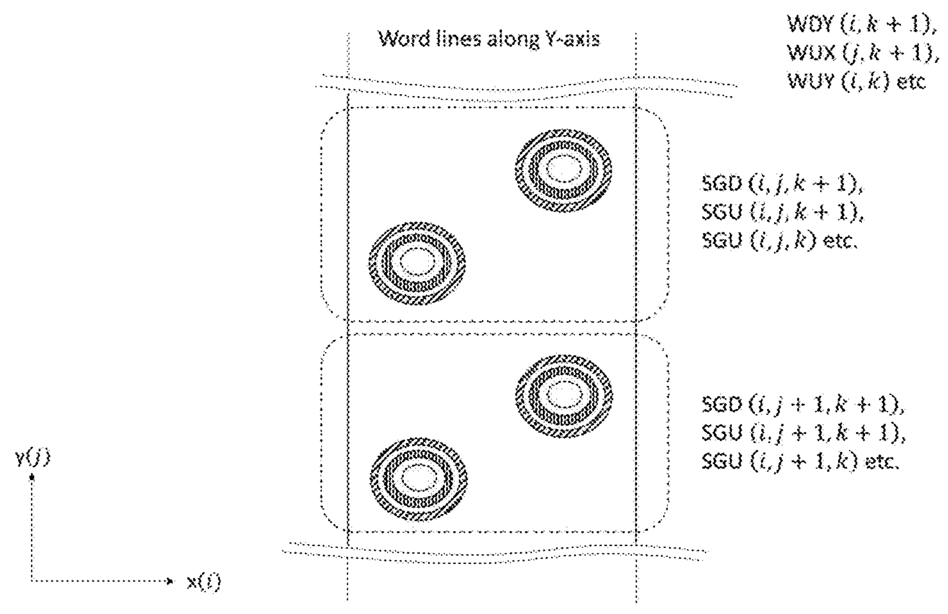
FIG. 93: a drawing to illustrate an example of top view (X-Y plan drawing) of the cross-section at a layer which includes SGD (i, j, k+1), SGU (i, j, k+1), or SGU (i, j, k).

FIG. 93 corresponds to FIGS. 35 and 37 and is an example regarding the width of the y-direction word line. A difference from FIGS. 35 and 37 is that there are two-columns of channel vias within the width of the y-direction word line. The other difference is that two channel vias are bundled to be connected to one select gate (SGD, SGU). In contrast, in FIGS. 35 and 37, there is only one column of channel vias within the width of the y-direction word line. This way, it may avoid the risk that a channel via likely falls along the x-direction.

Figure 94:
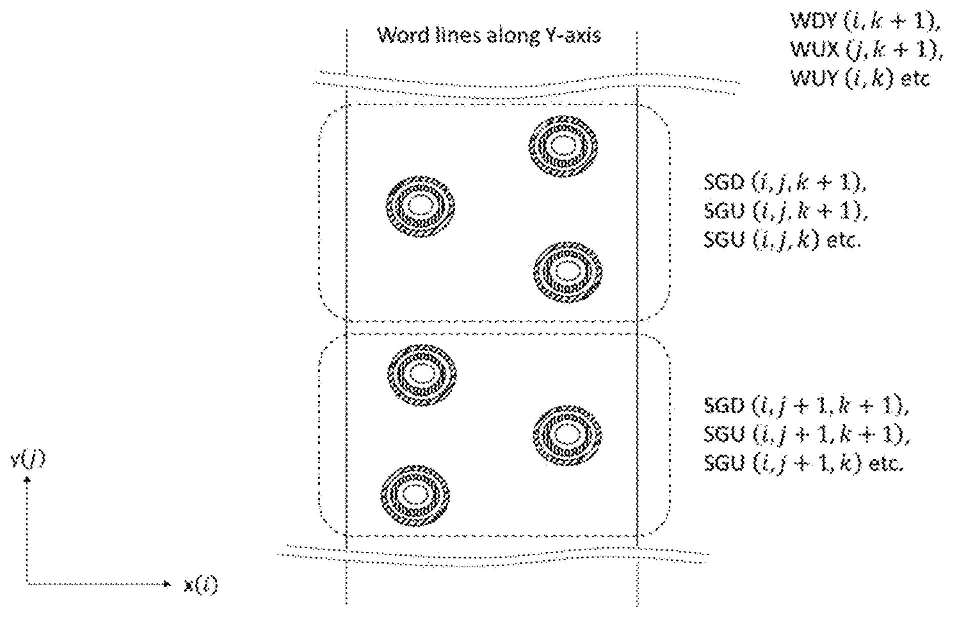
FIG. 94: a drawing to illustrate an example of top view (X-Y plan drawing) of the cross-section at a layer which includes SGD (i, j, k+1), SGU (i, j, k+1), or SGU (i, j, k).

FIG. 94 corresponds to FIGS. 35 and 37 and is another example regarding the width of the y-direction word line. It is characteristic that two channel vias are bundled to be connected to one select gate (SGD, SGU).

Figure 95:
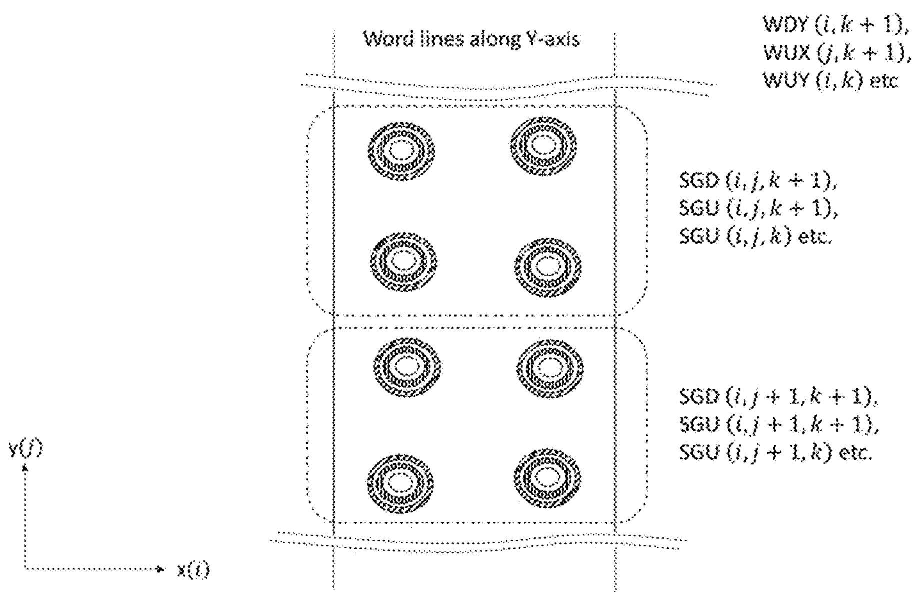
FIG. 95: a drawing to illustrate an example of top view (X-Y plan drawing) of the cross-section at a layer which includes SGD (i, j, k+1), SGU (i, j, k+1), or SGU (i, j, k).

FIG. 95 corresponds to FIGS. 35 and 37 and is another example regarding the width of the y-direction word line. It is characteristic that four channel vias are bundled to be connected to one select gate (SGD, SGU).

Figure 96:
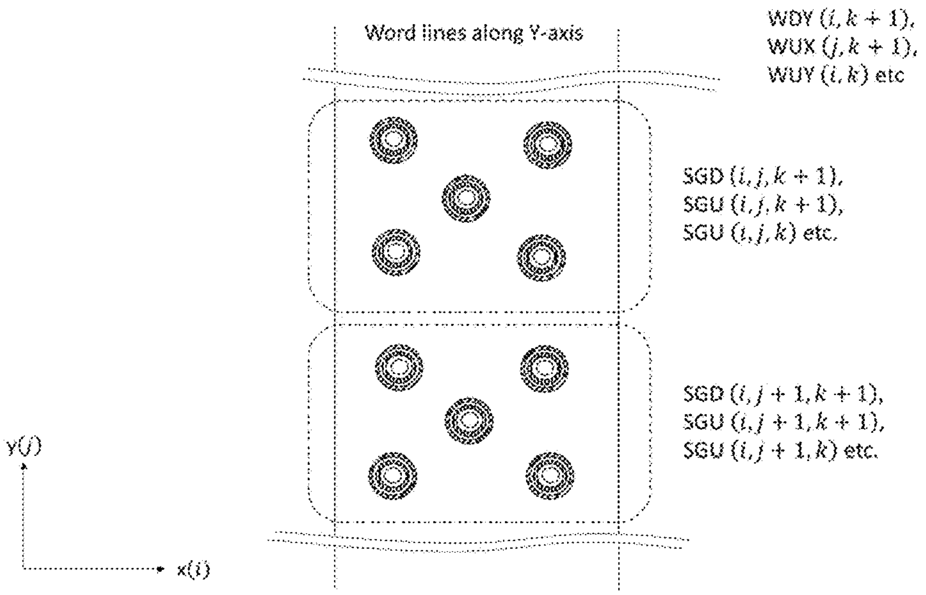
FIG. 96: a drawing to illustrate an example of top view (X-Y plan drawing) of the cross-section at a layer which includes SGD (i, j, k+1), SGU (i, j, k+1), or SGU (i, j, k).

FIG. 96 corresponds to FIGS. 35 and 37 and is another example regarding the width of the y-direction word line. It is characteristics that there are three columns of channel vias within the width of the y-direction word line and that five channel vias are bundled to be connected to one select gate (SGD, SGU).

In summary, it may be preferable that multiple channel vias are bundled to be connected to one bit line or either of a cell gate or a select gate. In this case, the number of channel-vias to be bundled into one is not limited to two to five. The layout of channel vias to be bundled into one is not limited to what was illustrated in FIGS. 81-96.

Figure 97:
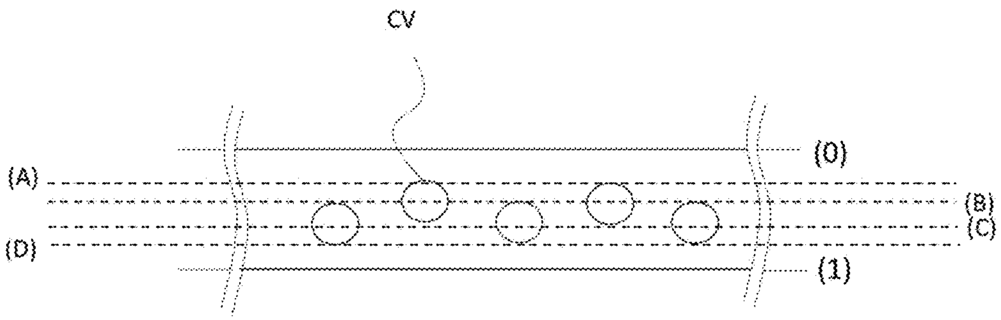
FIG. 97: a drawing to illustrate an example of the relation between the diameter of channel vias and the width of word lines or bit lines.

In the case that the number of channel-vias is greater than two, the number of the columns of channel vias, which are arrayed along word line or bit line, is at least two or more. Accordingly, the width of word line or bit line is at least two-fold of the diameter of channel via or more. The reason can be simply explained using FIG. 97. Both end of word line or bit line are depicted by (0) and (1). That is, the width of word line or bit line is the distance between the lines (0) and (1). Let us suppose that the width along the dotted lines (A)-(D) can be most saved if half of a channel via (CV) is overlapped with that of another along the horizontal direction. In this case, the width (A)-(D) is about three-fold of the radius of channel via. If there is the margin of about the radius of channel via in the externals of (A) and (B), then the distance between the lines (0) and (1) is two-fold of the diameter of channel via.

As stated above, the characteristics of the present invention have been explained.

Finally, the technical range of the present invention is not limited to the above-mentioned embodiments. It may be able to make various kinds of changes in the range that does not deviate from the purpose of the present invention.

(Industrial applicability) A method to imitate the mechanism of information processing of the human brain using a semiconductor chip can be provided by silicon technology.

What is claimed is:

1. A semiconductor device, which includes a module comprising:

first and second units, which are connected in series along first axis;

second, third, fourth and fifth word-lines, which are expanded along second axis;

first and sixth word lines, which are expanded along third axis;

first and third bit lines, which are expanded along the second axis; and second bit lines, which are expanded along the third axis;

wherein said second bit line connects both said first and second units, said first unit comprises first, second and third cells, said first, second and third cells are connected in series along said first axis, said first, second and third cells have a control gate, respectively, said first cell has a source, said third cell has a drain;

wherein the control gate of said first cell is connected to said first word line, the control gate of said second cell is connected to said second word line, the control gate of said third cell is connected to said third word line;

wherein the source of said first cell is connected to said first bit line, the drain of said third cell is connected to said second bit line;

wherein said second unit comprises fourth, fifth, and sixth cells, said fourth, fifth and sixth cells are connected in series along said first axis, said fourth, fifth and sixth cells have a control gate, respectively, said fourth cell has a source, said sixth cell has a drain;

wherein the control gate of said fourth cell is connected to said fourth word line, the control gate of said fifth cell is connected to said fifth word line, the control gate of said sixth cell is connected to said sixth word line, the source of said fourth cell is connected to said second bit line, the drain of said sixth cell is connected to said third bit line.

2. The semiconductor device as claimed in claim 1, wherein, said first to sixth cells include a cylindrical channel via having tunnel oxide film, charge storage layer, block film, conductive thin film, said first to third cells have first core, said fourth to sixth cells have second core, said first core comprises cylindrical part expanded along said first axis, and composes a channel part of said first to third cells, said second core comprises cylindrical part expanded along said first axis, and composes a channel part of said fourth to sixth cells, said tunnel oxide film wraps said first core for each of said first to third cells, and wraps said second core for each of said of fourth to sixth cells, said charge storage layer wraps said tunnel oxide film for each of said first to sixth cells, said block film wraps said charge storage layer for each of said first to sixth cells, said conductive thin film wraps said block film for each of said first to sixth cells, the control gates of said first to sixth cells are said conductive thin film.

3. The semiconductor device as claimed in claim 1, wherein, the width of said first to sixth word lines is greater than the diameter of said cylindrical channel via, the width of said first to third bit lines is greater than the diameter of said cylindrical channel via.

4. The semiconductor device as claimed in claim 1, further comprising:

seventh, eighth, and nineth cells;

seventh and eighth word-lines, which are expanded along said second axis;

ninth word line, which is expanded along said third axis; and fourth bit line, which is expanded along said third axis;

wherein said seventh, eighth, and nineth cells are connected in series along said first axis, said seventh, eighth, and nineth cells respectively have a control gate, said seventh cell has a source, said eighth cell has a drain, the control gate of said seventh cell is connected to said seventh word line, the control gate of said eighth cell is connected to said eighth word line, the control gate of said nineth cell is connected to said nineth word line, the source of said seventh cell is connected to said fourth bit line, the drain of said nineth cell is connected to said first bit line.

5. The semiconductor device as claimed in claim 1, further comprising:

tenth, eleventh, and twelfth cells;

eleventh and twelfth word-lines, which are expanded along said second axis;

tenth word line, which is expanded along said third direction; and fifth bit line, which is expanded along said third axis;

wherein said tenth, eleventh, and twelfth cells are connected in series along said first axis, said tenth, eleventh, and twelfth cells respectively have a control gate, said tenth cell has a source, said twelfth cell has a drain, the control gate of said tenth cell is connected to said tenth word line, the control gate of said eleventh cell is connected to said eleventh word line, the control gate of said twelfth cell is connected to said twelfth word line, the source of said tenth cell is connected to said third bit line, the drain of said twelfth cell is connected to said fifth bit line.

6. The semiconductor device as claimed in claim 1, further comprising:

twenty-first, twenty-second, and twenty-third cells; and said twenty-first word line and twenty-second bit lines, which are expanded along said third axis;

wherein said twenty-first, twenty-second, and twenty-third cells are connected in series along said first axis, said twenty-first, twenty-second, and twenty-third cells respectively have a control gate, said twenty-first cell has a source, said twenty-third cell has a drain, the control gate of said twenty-first cell is connected to said twenty-first word line, the control gate of said twenty-second cell is connected to said second word line, the control gate of said twenty-third cell is connected to said third word line, the source of said twenty-first cell is connected to said first bit line, the drain of said twenty-third cell is connected to said twenty-second bit line.

7. The semiconductor device as claimed in claim 6, further comprising:

twenty-fourth, twenty-fifth and twenty-sixth cells; and twenty-sixth word line, which is expanded along said third axis;

wherein said twenty-fourth, twenty-fifth, and twenty-sixth cells are connected in series along said first axis, said twenty-fourth, twenty-fifth, and twenty-sixth cells respectively have a control gate, said twenty-fourth cell has a source, said twenty-sixth cell has a drain, the control gate of said twenty-fourth cell is connected to said fourth word line, the control gate of said twenty-fifth cell is connected to said fifth word line, the control gate of said twenty-sixth cell is connected to said twenty-sixth word line, the source of said twenty-fourth cell is connected to said twenty-second bit line.

8. The semiconductor device as claimed in claim 1, further comprising:

thirty-first, thirty-second and thirty-third cells; and thirty-second and thirty-third word-lines and thirty-first bit line, which are expanded along said second axis;

wherein said thirty-first, thirty-second and thirty-third cells are connected in series along to said first axis, said thirty-first, thirty-second and thirty-third cells respectively have a control gate, said thirty-first cell has a source, said thirty-third cell has a drain, the control gate of said thirty-first cell is connected to said first word line, the control gate of said thirty-second cell is connected to said thirty-second word line, the control gate of said thirty-third cell is connected to said thirty-third word line, the source of said thirty-first cell is connected to said thirty-first bit line, the drain of said thirty-third cell is connected to said second bit line.

9. The semiconductor device as claimed in claim 8, further comprising:

thirty-fourth, thirty-fifth, and thirty-sixth cells; and thirty-fourth and thirty-fifth word-lines, and thirty-sixth bit-lines, which are expanded along said second axis;

wherein said thirty-fourth, thirty-fifth, and thirty-sixth cells are connected in series along to said first axis, said thirty-fourth, thirty-fifth, and thirty-sixth cells respectively have a control gate, said thirty-fourth cell has a source, said thirty-sixth cell has a drain, the control gate of said thirty-fourth cell is connected to said thirty-fourth word line, the control gate of said thirty-fifth cell is connected to said thirty-fifth word line, the control gate of said thirty-sixth cell is connected to said sixth word line, the source of said thirty-fourth cell is connected to said second bit line, the drain of said thirty-sixth cell is connected to said thirty-sixth bit line.

10. The semiconductor device as claimed in claim 4, wherein a first voltage is applied on said first, third, seventh, and nineth word lines, said first voltage is lower than a threshold voltage, said threshold voltage is a threshold of voltage to be applied to gates of said first, second, third, seventh, eighth, and nineth cells, which is necessary to make electric current flow between source and drain of said first, second, third, seventh, eighth, and nineth cells, a voltage applied on said first and nineth word line is changed from said first voltage to a pass voltage, said pass voltage is higher than any of thresholds of said first, second, third, seventh, eighth, and nineth cells, a read voltage is applied on said second and eighth word lines, said read voltage is higher than said first voltage and lower than said pass voltage.

11. The semiconductor device as claimed in claim 1, wherein a first voltage is applied to said first, third, fourth, and sixth word-lines, said first voltage is lower than a threshold voltage, said threshold voltage is a threshold of voltage to be applied to gates of said first to sixth cells, which is necessary to make electric current flow between source and drain of said first to sixth cells, a voltage of said third and fourth word-line is changed from said first voltage to a pass voltage, said pass voltage is higher than any of thresholds of said first to sixth cells, a read voltage is applied to said second and fifth word lines, said read voltage is higher than said first voltage and lower than said pass voltage.

12. The semiconductor device as claimed in claim 6, wherein a first voltage is applied to said first, third and twenty-first word-lines, said first voltage is lower than a threshold voltage, said threshold voltage is a threshold of voltage to be applied to gates of said first, third and twenty-first cells, which is necessary to make electric currents flow between source and drain of said first, third, and twenty-first cells, a voltage applied to said first and twenty-first word lines is changed from said first voltage to a pass voltage, said pass voltage is higher than any of thresholds of said first, third and twenty-first cells, a read voltage is applied to said second word line, said read voltage is higher than said first voltage and lower than said pass voltage.

13. The semiconductor device as claimed in claim 8, wherein a first voltage is applied to said first, third, and thirty-third word-lines said first voltage is higher than a threshold voltage, said threshold voltage is a threshold of voltage to be applied to gates of said first, third, and thirty-third cells, which is necessary to make electric current flow between source and drain of said first, third, and thirty-third cells, a voltage applied to said third and thirty-third word-lines is changed from said first voltage to a pass voltage, said pass voltage is higher than any of thresholds of said first, third, and thirty-third cells, a read voltage is applied to said second and thirty-second word lines, said read voltage is higher than said first voltage and lower than said pass voltage.

14. The semiconductor device as claimed in claim 1, wherein one of said second and third axes is first select axis, and the other is second select axis, said first to fifth films are laminated above a first conductive layer which is patterned to be expanded along said first select axis, said first, third and fifth films are first kind of insulating film, said second and fourth films are second kind of insulating film, said first to fifth films are etched along said second select axis to open a first slit, said first slit is expanded along said second select axis, said second and fourth films are removed, after a predetermined treatment, third kind of insulating film is filled into said first slit, after a predetermined treatment, sixth, seventh, and eighth films are laminated above said fifth film, said sixth and eighth films are said first kind of insulating film, said seventh film is said second kind of insulating film,
said sixth and eighth films are etched along said first select axis to open a second slit,
said second slit is expanded along said first select axis,
said seventh film is removed,
after a predetermined treatment, said third kind of insulating film is filled into said second slit,
said first conductive layer is a bit line which is expanded along said first select axis.

15. The semiconductor device as claimed in claim 14, wherein
after a predetermined treatment is performed above said eighth film, a second conductive layer is patterned to be expanded along said second select axis,
said second conductive layer is a bit line, which is expanded along said second select axis,
said nineth to thirteenth films are lapped on said second conductive layer,
said nineth, eleventh, and thirteenth films are said first kind of insulating film,
said tenth and twelfth films are said second kind of insulating film,
said first and second conductive lines are crossed on a plane which said first and second select axes expand.

16. The semiconductor device as claimed in claim 15, wherein
said first kind of insulating film is made of oxide,
said second kind of insulating film is made of nitride,
said third kind of insulating film is made of low dielectric film,
said first and second conductive layers are made of metal or silicide.

17. The semiconductor device as claimed in claim 1, wherein
one of said second and third axes is twenty-first select axis, and the other is twenty-second select axis,
said twenty-first to twenty-third films are laminated above twenty-first conductive layer, which is patterned to be expanded along said twenty-first select axis,
said twenty-first and twenty-third films are twenty-first kind of insulating film,
said twenty-second film is twenty-second kind of insulating film,
said twenty-first and twenty-third films are etched along said twenty-second select axis to open a twenty-first slit,
said twenty-first slit is expanded along said twenty-second select axis,
said twenty-second film is removed,
after a predetermined treatment is performed, twenty-third kind of insulating film is filled into said twenty-first slit,
after a predetermined treatment is performed, twenty-fourth to twenty-eighth films are laminated above said twenty-third film,
said twenty-fourth, twenty-sixth, and twenty-eighth films are said twenty-first kind of insulating film,
said twenty-fifth and twenty-seventh films are said twenty-second insulating film,
said twenty-fourth to twenty-eight films are etched along said twenty-first select axis to open a twenty-second slit,
said twenty-second slit is expanded along said twenty-first select axis,
said twenty-fifth and twenty-seventh films are removed,
after a predetermined treatment is performed, said twenty-third kind of insulating film is filled into said twenty-second slit,
said twenty-first conductive layer is a bit line, which is expanded along said twenty-first select axis.

18. The semiconductor device as claimed in claim 17, wherein
after a predetermined treatment is carried out above said twenty-eighth film,
twenty-second conductive film is patterned along said twenty-second select axis,
said twenty-second conductive layer is a bit line, which is expanded along said twenty-second select axis,
twenty-nineth to thirty-first films are laminated above said twenty-second conductive layer,
said twenty-nineth and thirty-first film is twenty-first kind of insulating film,
said thirtieth film is said twenty-second kind of insulating film,
said twenty-first and twenty-second conductive layers are crossed on a plane, which
said twenty-first and twenty-second select axes expand.

19. The semiconductor device as claimed in claim 18, wherein
said twenty-first kind of insulating film is made of oxide,
said twenty-second kind of insulating film is made of nitride,
said twenty-third kind of insulating film is made of low dielectric film,
said twenty-first and twenty-second conductive layers are made of metal or silicide.

20. The semiconductor device as claimed in claim 1, further comprising:
first and second wiring metal layers,
wherein said first bit line is connected to said first wiring metal layer,
said second word line is connected to said second wiring metal layer,
said third word line is connected to said first wiring metal layer,
said fourth word line is connected to said second wiring metal layer,
said fifth word line is connected to said first wiring metal layer,
said third bit line is connected to said second wiring metal layer.

21. The semiconductor device as claimed in claim 20, wherein
said first and sixth word lines are connected to one of said first and second wiring metal layers,
said second bit line is connected to the other of said first and second wiring metal layers.

* * * * *